United States Patent
Tezcan Ozel et al.

(10) Patent No.: US 11,417,794 B2
(45) Date of Patent: Aug. 16, 2022

(54) METHOD OF MAKING A SEMICONDUCTOR DEVICE USING NANO-IMPRINT LITHOGRAPHY FOR FORMATION OF A SELECTIVE GROWTH MASK

(71) Applicant: GLO AB, Lund (SE)

(72) Inventors: Zulal Tezcan Ozel, Fremont, CA (US);
Tsun Lau, Fremont, CA (US);
Benjamin Leung, Sunnyvale, CA (US);
Fariba Danesh, Los Altos Hills, CA (US)

(73) Assignee: NANOSYS, INC., Milpitas, CA (US)

( * ) Notice: Subject to any disclaimer, the term of this patent is extended or adjusted under 35 U.S.C. 154(b) by 254 days.

(21) Appl. No.: 16/084,849

(22) PCT Filed: Aug. 14, 2018

(86) PCT No.: PCT/US2018/046646
§ 371 (c)(1),
(2) Date: Sep. 13, 2018

(87) PCT Pub. No.: WO2019/036439
PCT Pub. Date: Feb. 21, 2019

(65) Prior Publication Data
US 2021/0202789 A1    Jul. 1, 2021

Related U.S. Application Data

(60) Provisional application No. 62/545,787, filed on Aug. 15, 2017, provisional application No. 62/656,175, filed on Apr. 11, 2018.

(51) Int. Cl.
*H01L 33/00* (2010.01)
*G03F 7/00* (2006.01)
*H01L 33/24* (2010.01)
*H01L 33/32* (2010.01)

(52) U.S. Cl.
CPC .......... *H01L 33/007* (2013.01); *G03F 7/0002* (2013.01); *H01L 33/24* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 8,309,439 B2 * | 11/2012 | Seifert | ............ C30B 25/00 438/478 |
| 8,664,636 B2 | 3/2014 | Konsek et al. | |

(Continued)

FOREIGN PATENT DOCUMENTS

JP    2011135987 A    8/2011

OTHER PUBLICATIONS

International Search Report and Written Opinion of the International Searching Authority for International Patent Application No. PCT/US2018/046646, dated Dec. 4, 2018, 12 pages.

(Continued)

*Primary Examiner* — Bradley Smith
(74) *Attorney, Agent, or Firm* — The Marbury Law Group PLLC

(57) ABSTRACT

A growth mask layer is formed over a semiconductor material layer on a substrate. Optionally, a patterned hard mask layer can be formed over the growth mask layer. A nano-imprint lithography (NIL) resist layer is applied, and is imprinted with a pattern of recesses by stamping. The pattern in the NIL resist layer through the growth mask layer to provide a patterned growth mask layer with clusters of openings therein. If a patterned hard mask layer is employed, the patterned hard mask can prevent transfer of the pattern in the area covered by the patterned hard mask layer. Semiconductor material portions, such as nanowires (Continued)

can be formed in a cluster configuration through the clusters of openings in the patterned growth mask layer. Alignment marks can be formed concurrently with formation of semiconductor material portions by employing nano-imprint lithography.

20 Claims, 57 Drawing Sheets

(56) References Cited

U.S. PATENT DOCUMENTS

| | | |
|---|---|---|
| 8,669,574 B2 | 3/2014 | Konsek et al. |
| 9,035,278 B2 | 5/2015 | Svensson et al. |
| 9,281,442 B2 | 3/2016 | Romano et al. |
| 9,287,443 B2 | 3/2016 | Konsek et al. |
| 2002/0036356 A1 | 3/2002 | Teshima et al. |
| 2008/0028360 A1 | 1/2008 | Picciotto et al. |
| 2008/0211063 A1 | 9/2008 | Adachi et al. |
| 2011/0254034 A1* | 10/2011 | Konsek ............ H01L 33/08 257/98 |
| 2014/0042387 A1* | 2/2014 | Yang ............... H01L 33/18 257/13 |

OTHER PUBLICATIONS

Notification Concerning Transmittal of International Preliminary Report on Patentability and Written Opinion of the International Searching Authority for International Patent Application No. PCT/US2018/046646, dated Feb. 27, 2020, 9 pages.

* cited by examiner

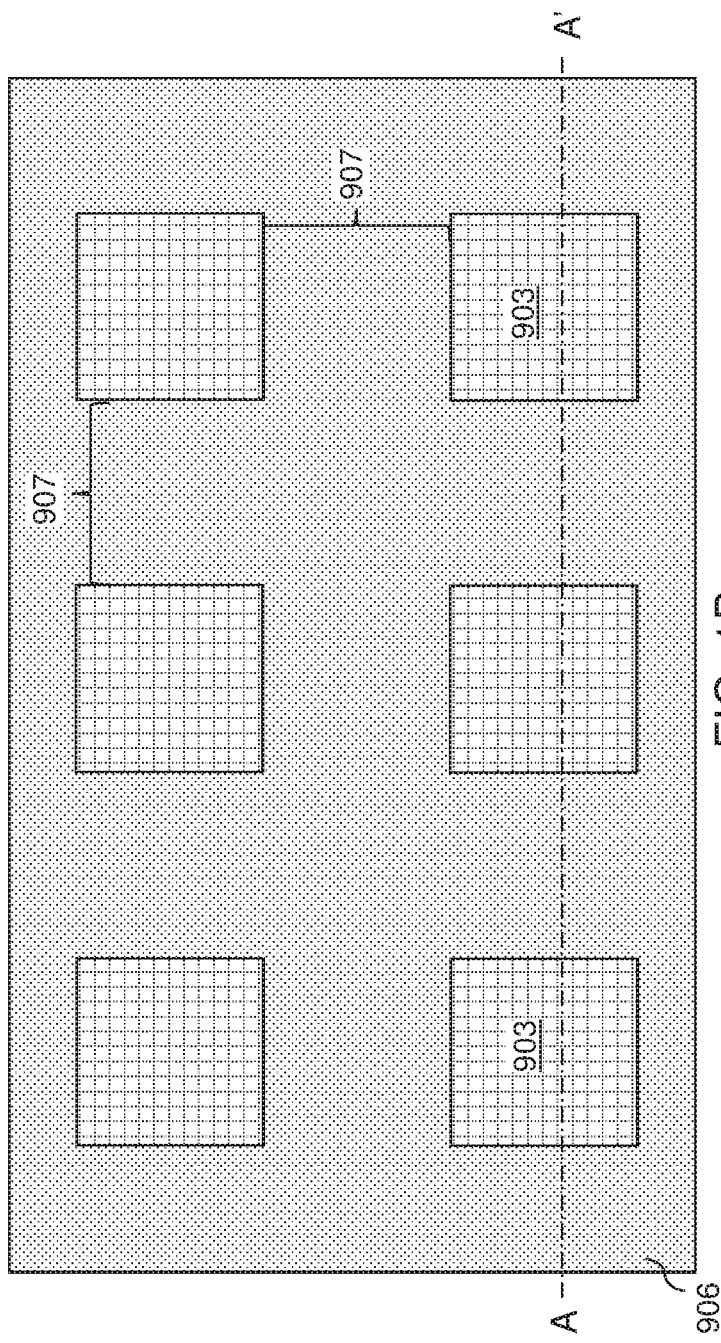
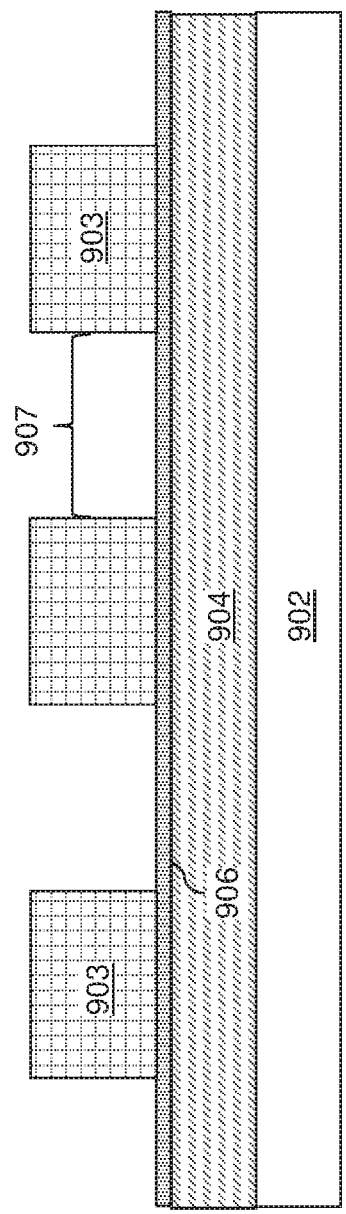
FIG. 1B
FIG. 1A

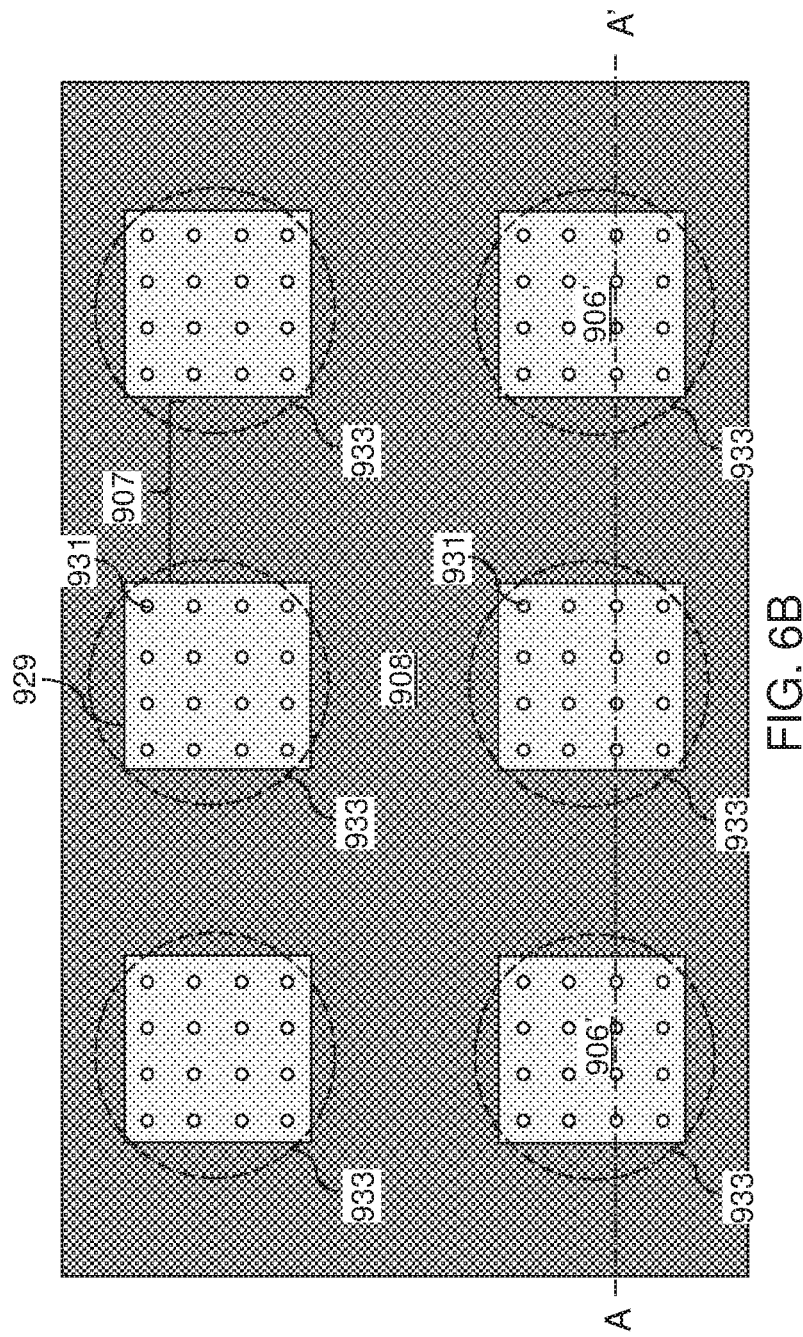

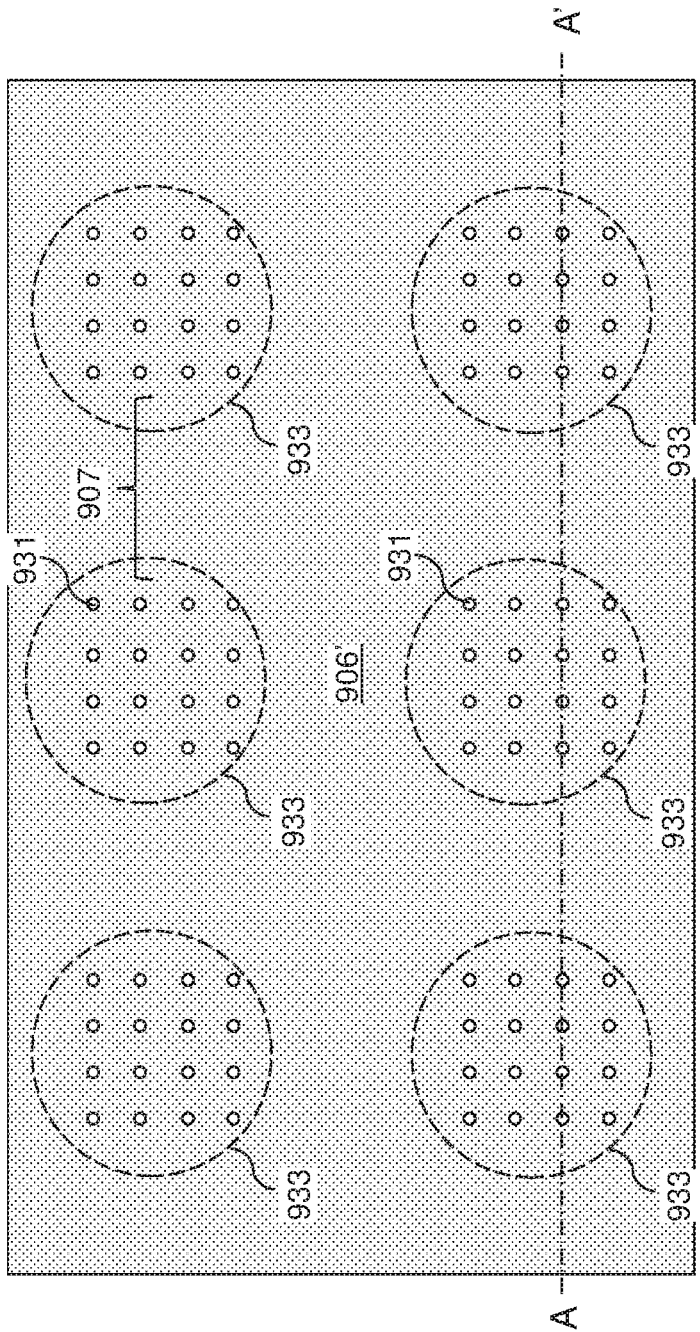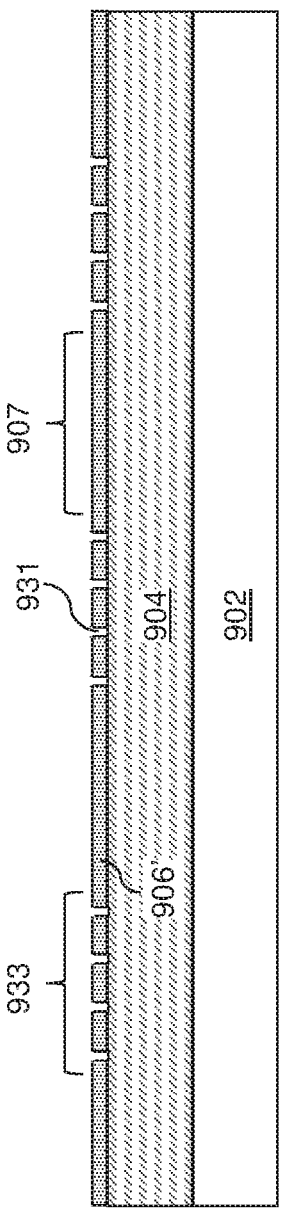

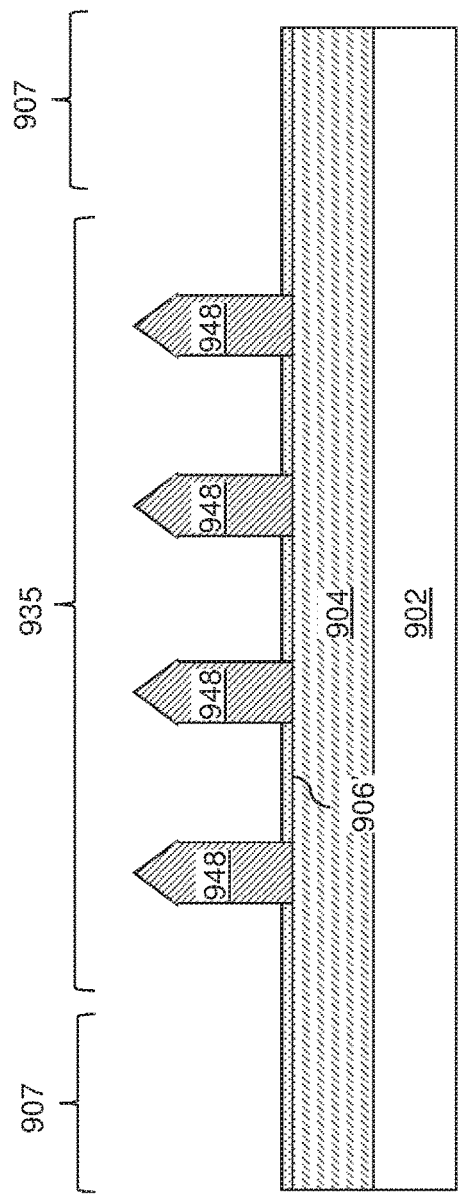
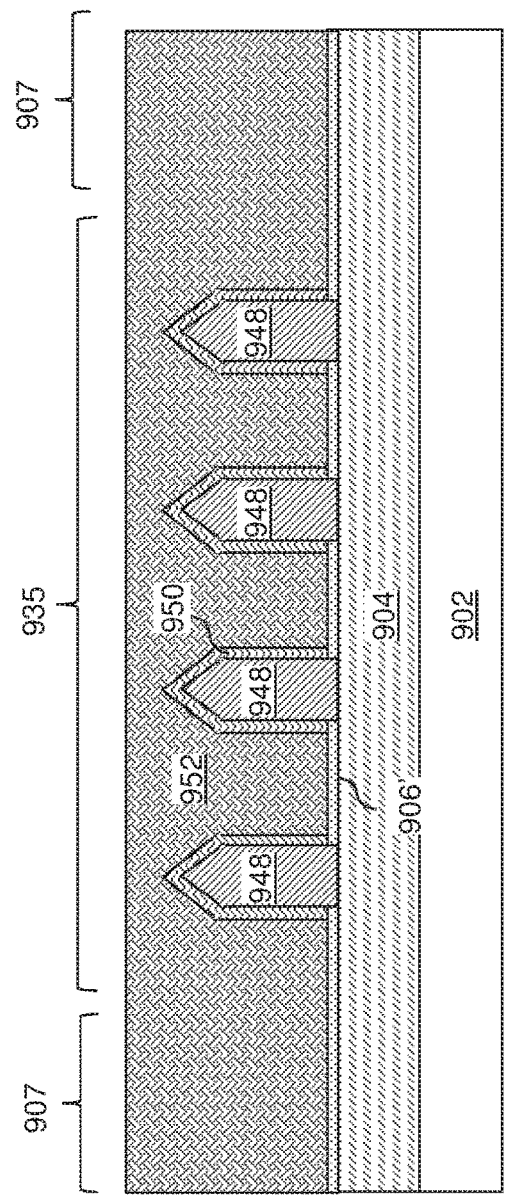
FIG. 8
FIG. 9

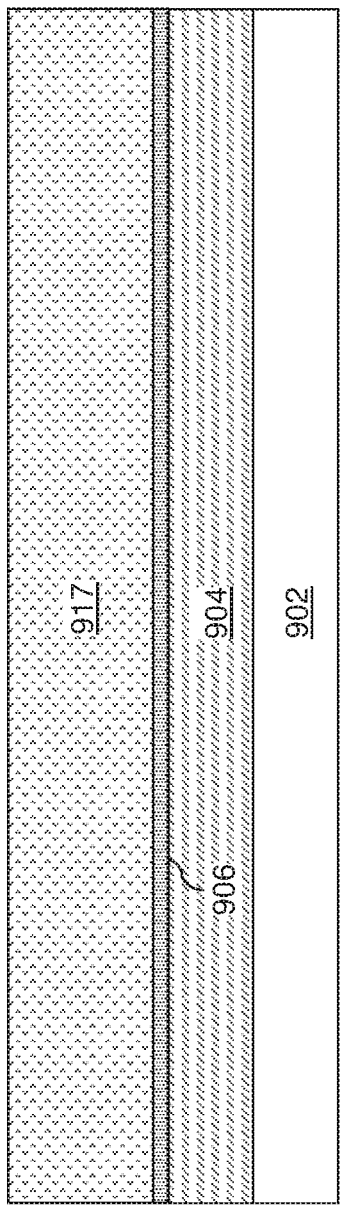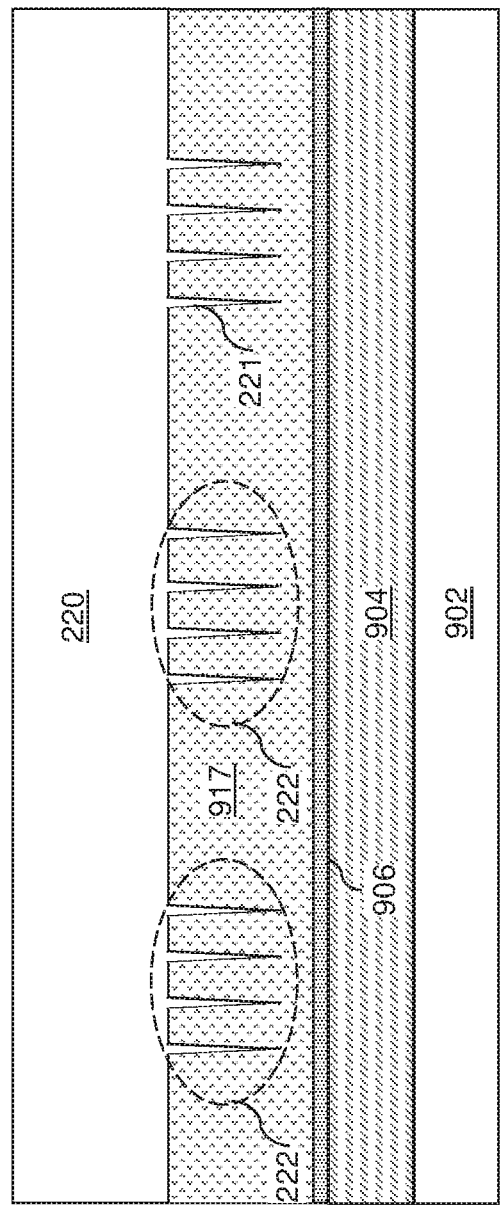

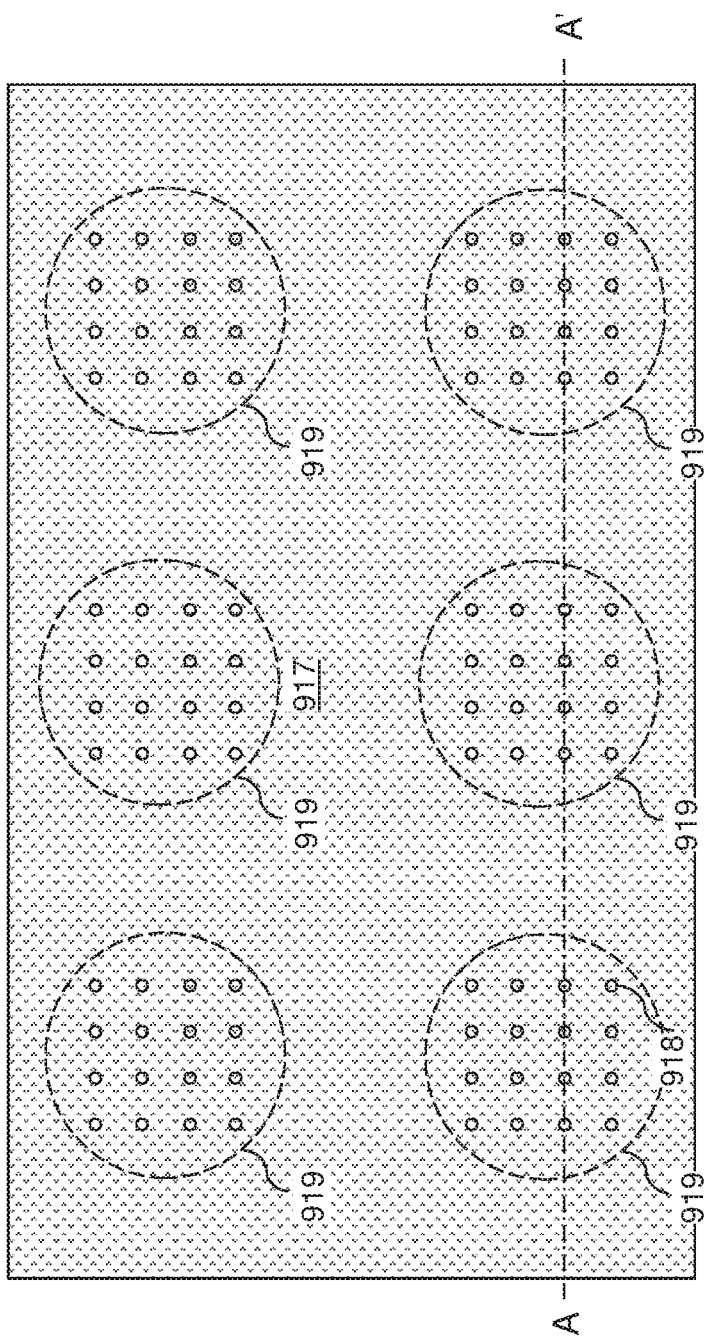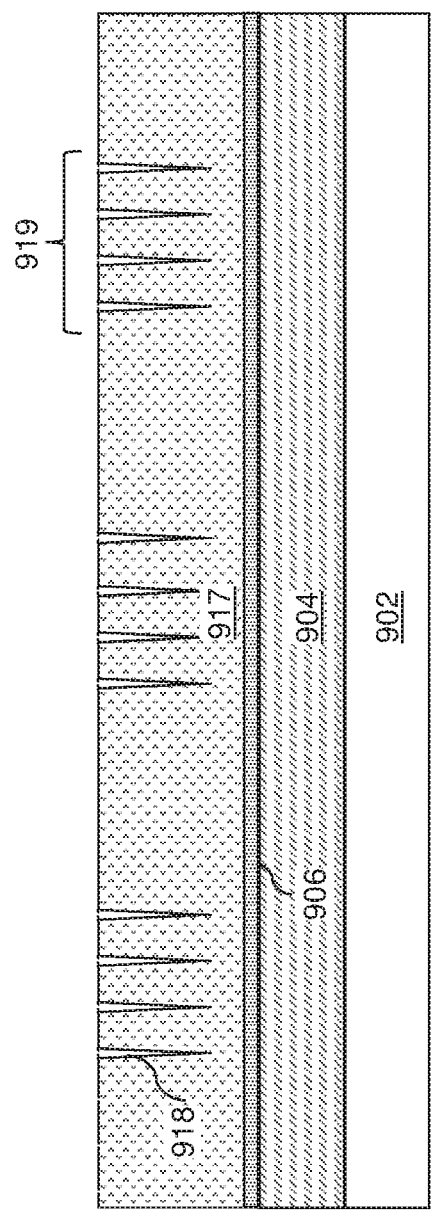

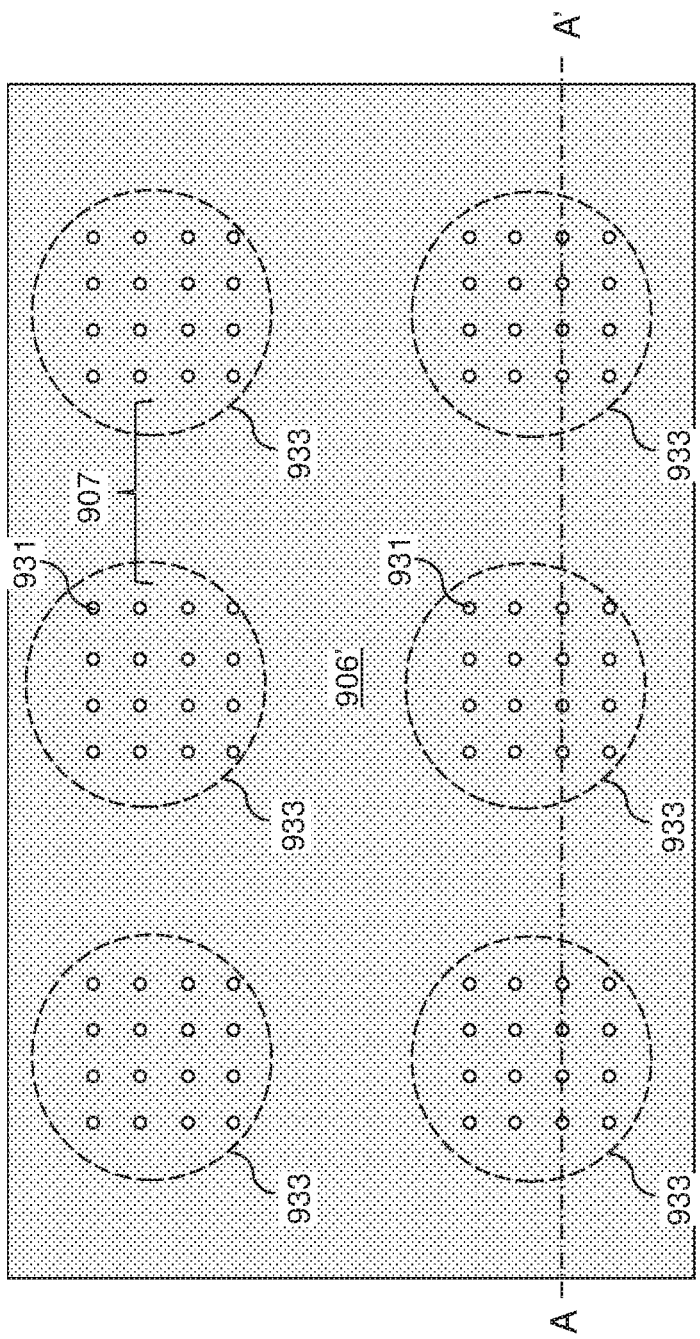
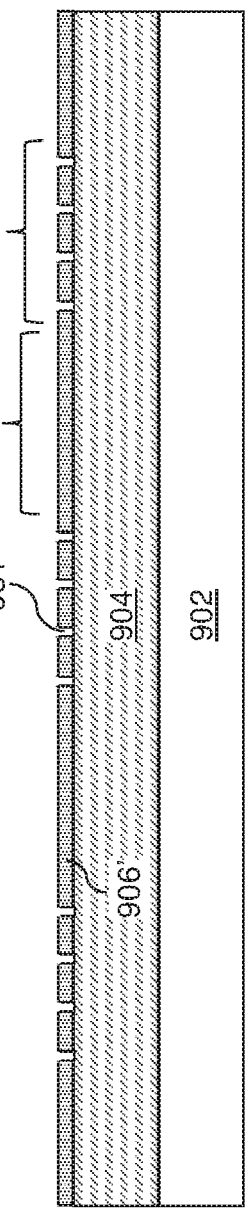
FIG. 15B
FIG. 15A

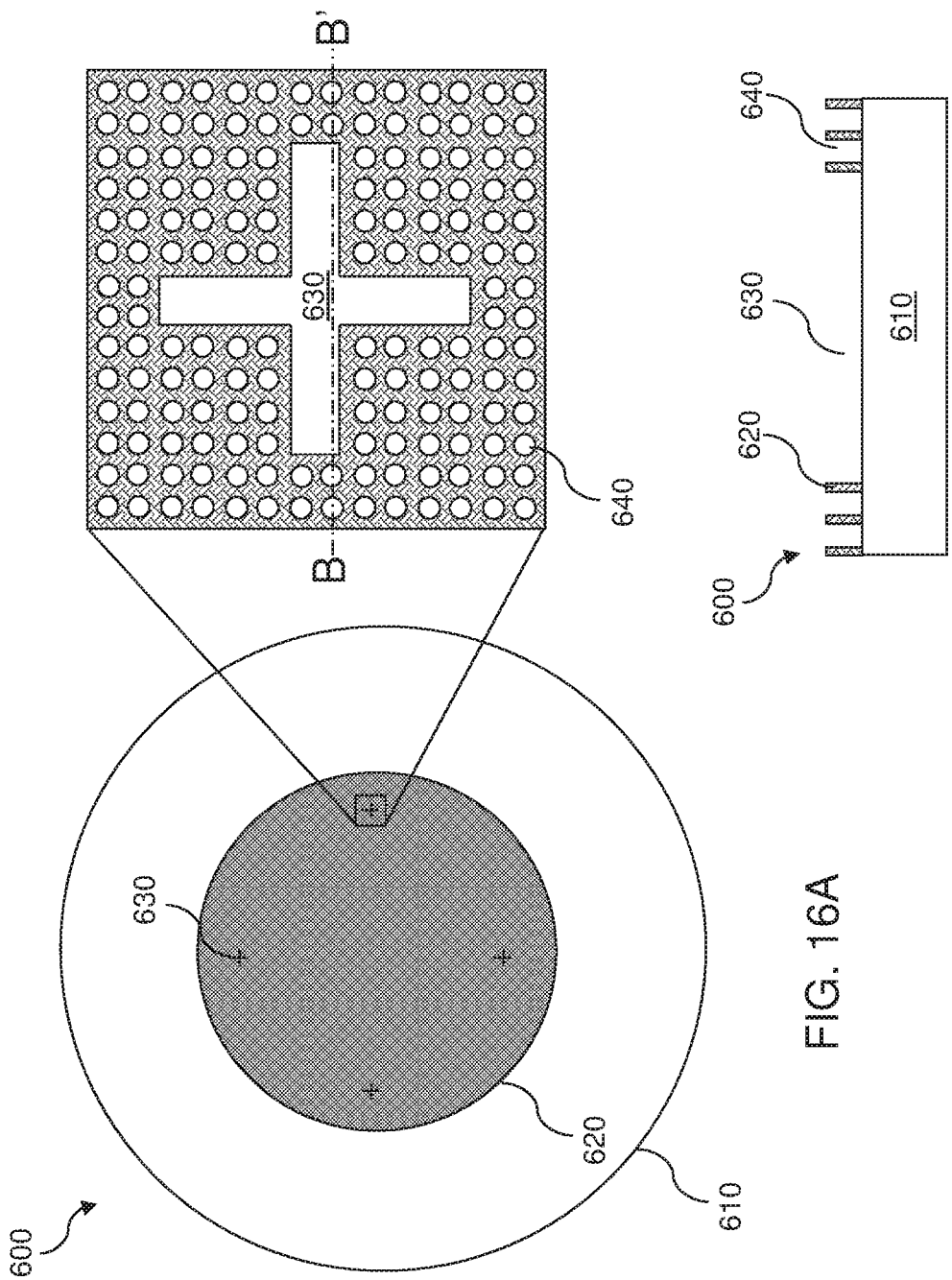

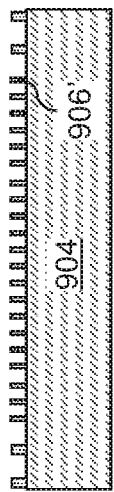
FIG. 19F
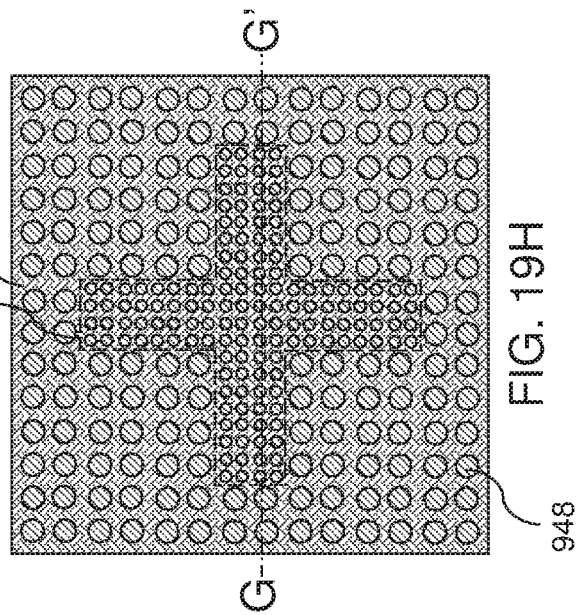
FIG. 19H
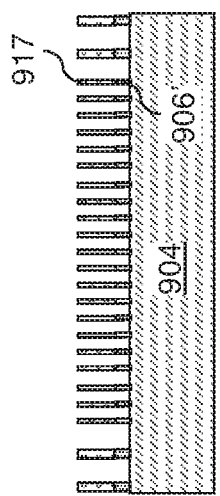
FIG. 19E
FIG. 19G

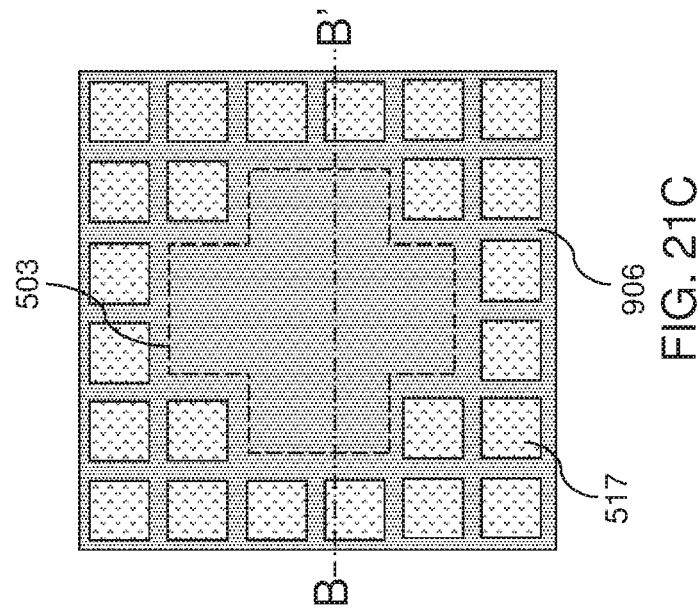
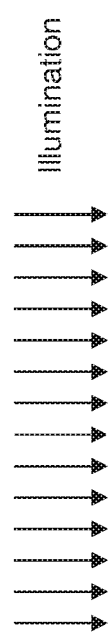
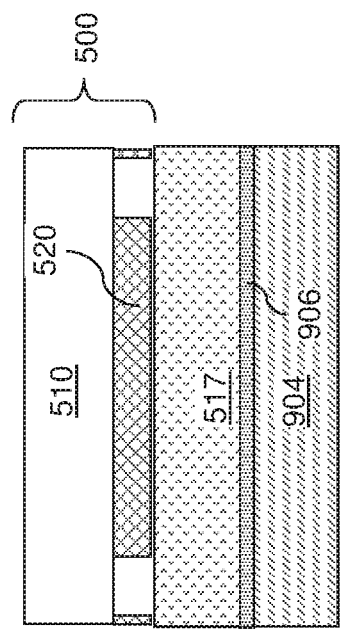
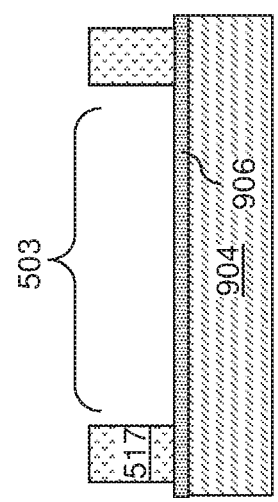
FIG. 21A
FIG. 21B
FIG. 21C

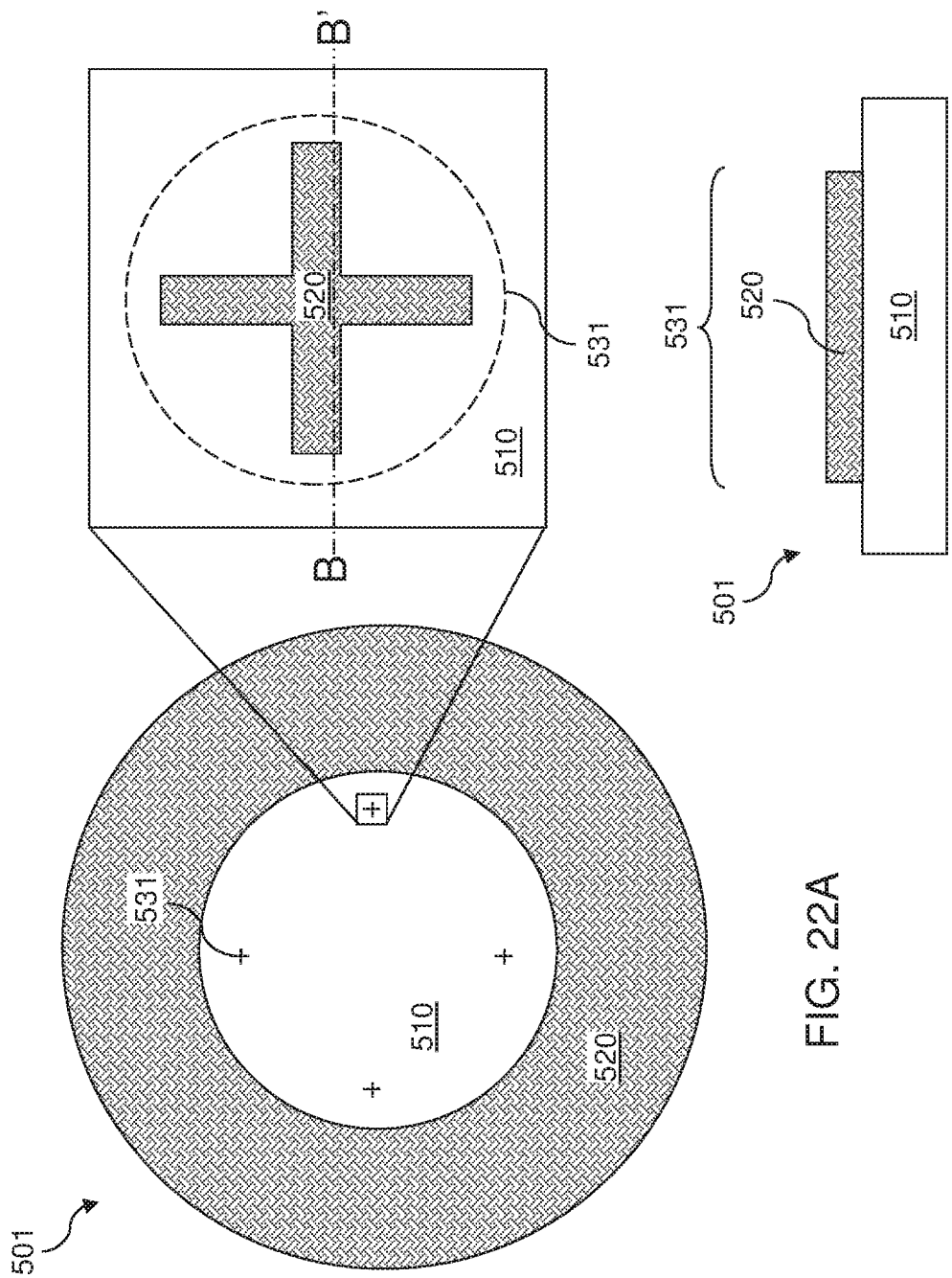

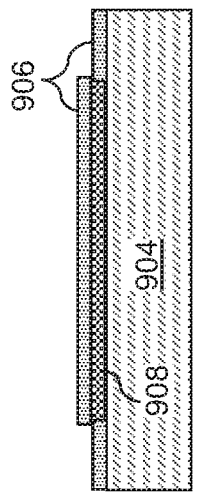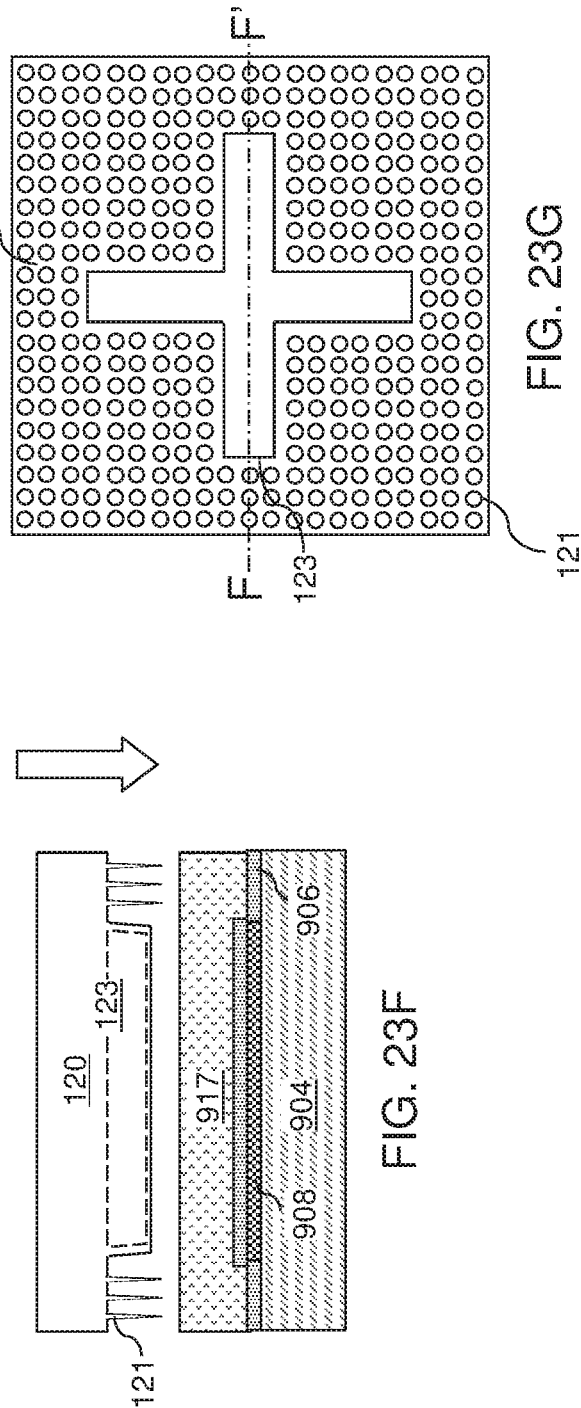

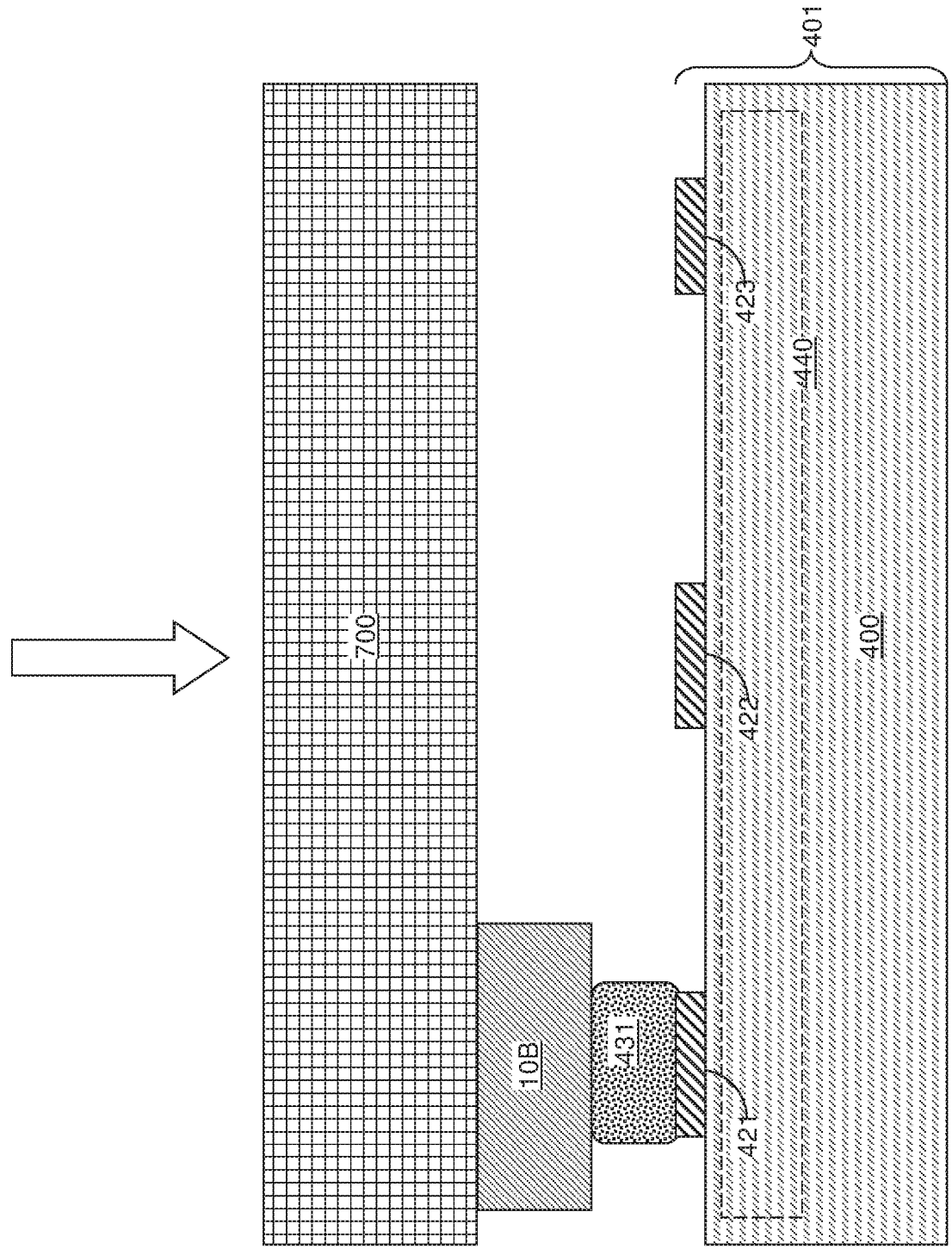

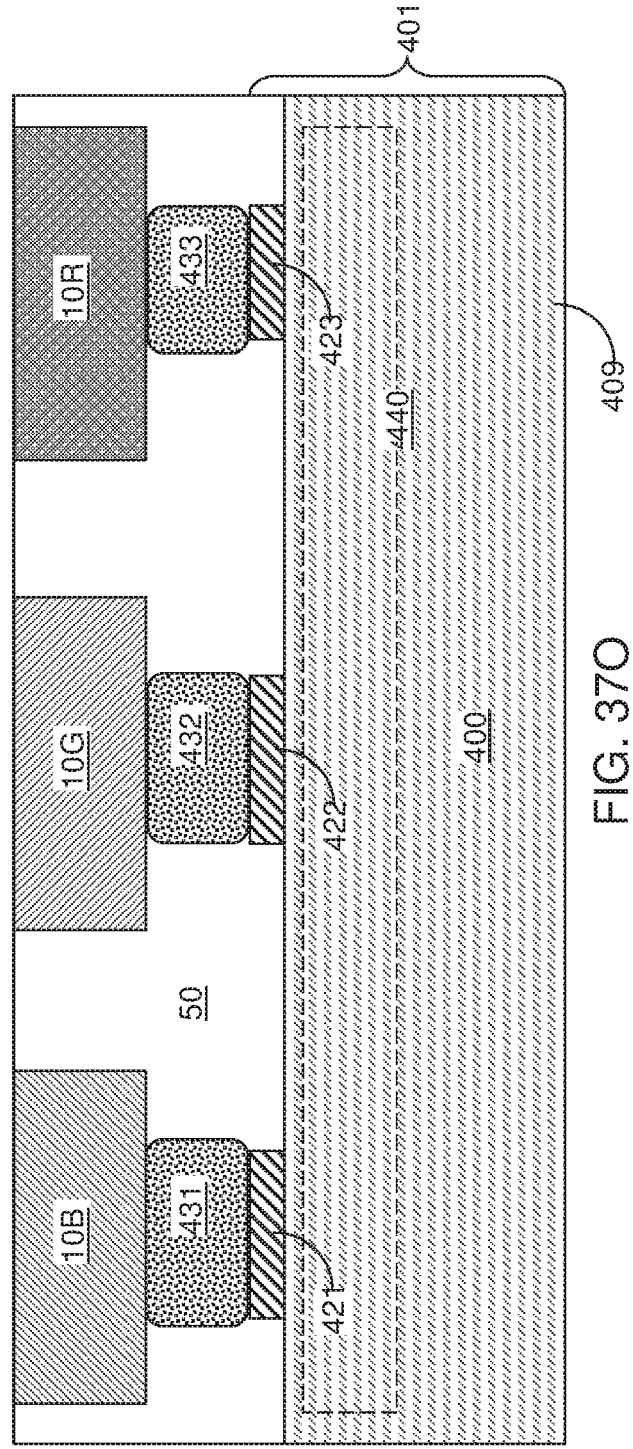

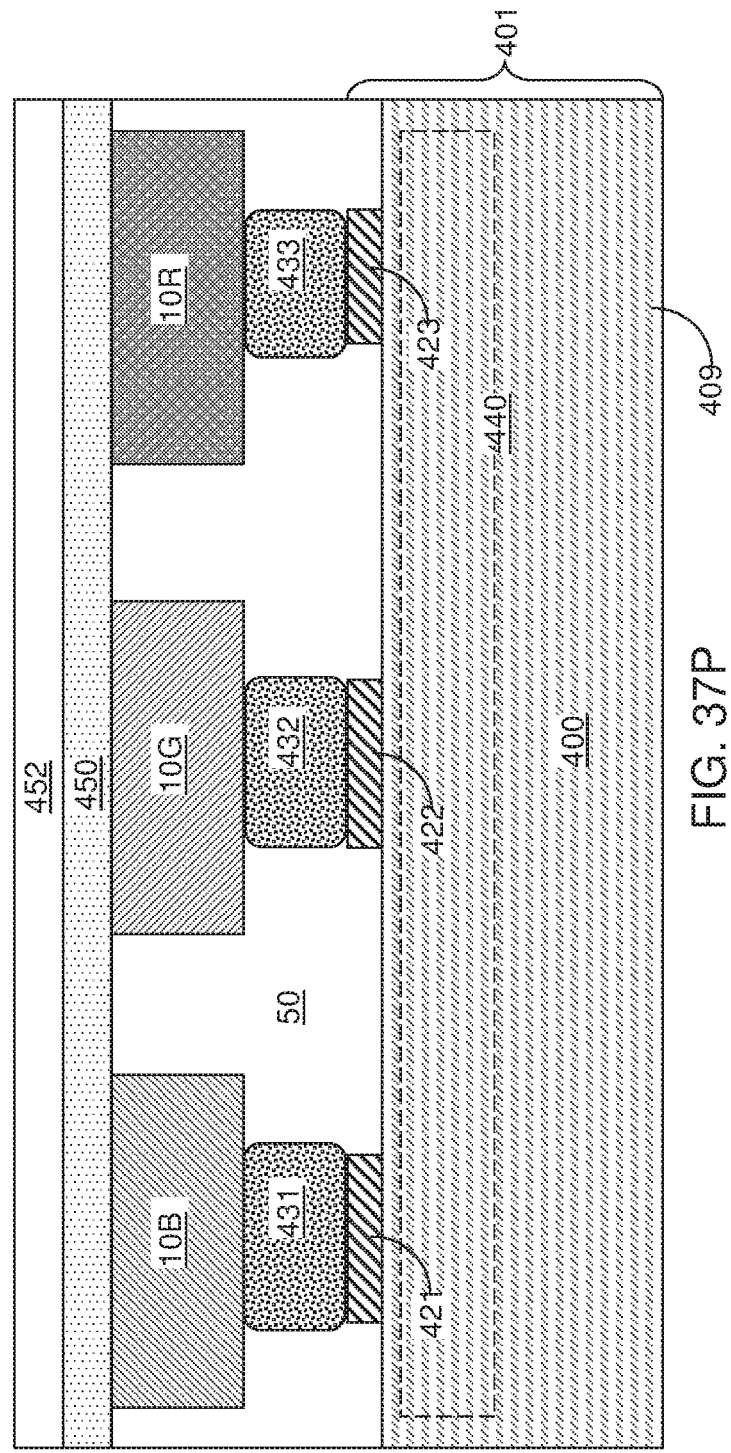

METHOD OF MAKING A SEMICONDUCTOR DEVICE USING NANO-IMPRINT LITHOGRAPHY FOR FORMATION OF A SELECTIVE GROWTH MASK

CROSS-REFERENCE TO RELATED APPLICATIONS

This application is a national phase application under 35 U.S.C. § 371 of international application PCT/US18/46646, filed Aug. 14, 2018, which claims the benefit of priority to U.S. Provisional Application No. 62/545,787, filed on Aug. 15, 2017 and U.S. Provisional Application No. 62/656,175 filed Apr. 11, 2018.

FIELD

The present invention relates to a method of forming a device such as a semiconductor device, and particularly to a method of forming the semiconductor device in which a selective growth mask is formed by nano-imprint lithography.

BACKGROUND

Device isolation typically involves patterning of material layers to prevent electrical shorts among various portions of the material layers formed in different regions of a substrate. Typical patterning steps include application and lithographic patterning of a masking layer, and transfer of the pattern in the masking layer through underlying material layers. Such processing steps tend to be expensive and time consuming.

SUMMARY

According to an aspect of the present disclosure, a method of making a device is provided, which comprises the steps of: forming a growth mask layer over a semiconductor material layer; forming a patterned hard mask layer over the growth mask layer, the patterned hard mask layer including openings that are laterally spaced apart; forming a nano-imprint lithography (NIL) resist layer over the patterned hard mask layer; imprinting a pattern of recesses on an upper surface of the NIL resist layer by stamping with a nano-imprint lithography stamp including an array of protrusions; transferring a pattern in the NIL resist layer through portions of the growth mask layer underneath the openings in the patterned hard mask layer by anisotropically etching the NIL resist layer, wherein the growth mask layer becomes a patterned growth mask layer with clusters of openings therein; and growing semiconductor material portions through the clusters of openings in the patterned growth mask layer.

According to another aspect of the present disclosure, a method of making a device is provided, which comprises the steps of: forming a growth mask layer over a semiconductor material layer; forming a nano-imprint lithography (NIL) resist layer over the growth mask layer; imprinting a pattern of recesses on an upper surface of the NIL resist layer by stamping with a nano-imprint lithography stamp including multiple clusters of protrusions, wherein each cluster of protrusions is laterally spaced apart from other clusters of protrusions; transferring a pattern in the NIL resist layer through the growth mask layer, wherein the growth mask layer becomes a patterned growth mask layer with clusters of openings therein; and growing semiconductor material portions through the clusters of openings in the patterned growth mask layer.

According to another aspect of the present disclosure, a method of making a device, comprises forming a growth mask layer over a semiconductor material layer, patterning the growth mask layer to form alignment mark apertures in alignment mark regions in the growth mask layer and forming openings in a device region in the growth mask layer, selectively growing semiconductor nanostructures through the openings in the patterned growth mask layer and selectively growing semiconductor alignment structures through the apertures in the patterned growth mask layer at the same time such that the semiconductor alignment structures include a same material as the semiconductor nanostructures, and applying and lithographically patterning a photoresist layer employing the semiconductor alignment structures as references for alignment of a lithographic pattern.

In one embodiment, wherein each of the semiconductor alignment structures comprises a semiconductor mesa pattern, such as a cross pattern, having a lateral dimension that is at least 6 times a maximum lateral dimension of each semiconductor nanostructure. In another embodiment, the semiconductor alignment structures comprise an array of semiconductor nanowires that differ from the array of the semiconductor nanostructures by at least one of a nearest neighbor pitch, a maximum lateral dimension of each protrusion, and a shape of each protrusion.

In one embodiment, the semiconductor alignment structures comprise gallium nitride structures which are grown during the same semiconductor epitaxial growth step as the semiconductor nanostructures. The openings and apertures in the patterned growth mask layer are formed by at least one of photoliography or nanoimprint lithography followed by etching.

According to another embodiment of the present disclosure, a semiconductor device comprises a patterned growth mask layer located over a semiconductor material layer, the patterned growth mask layer comprising alignment mark apertures in alignment mark regions and openings in a device region, and semiconductor nanostructures extending through the openings in the patterned growth mask layer and semiconductor alignment structures extending through the apertures in the patterned growth mask layer, wherein the semiconductor alignment structures include a same semiconductor material as the semiconductor nanostructures.

In one embodiment, the semiconductor alignment structures comprise gallium nitride alignment structures and the semiconductor nanostructure comprise gallium nitride nanowires that are a part of a light emitting device.

BRIEF DESCRIPTION OF THE DRAWINGS

FIG. 1A is a vertical cross-sectional view of a first exemplary structure after formation of a blanket growth mask layer and patterned photoresist portions according to a first embodiment of the present disclosure.

FIG. 1B is a top-down view of the first exemplary structure of FIG. 1A.

FIG. 6B is a top-down view of the first exemplary structure of FIG. 6A.

FIG. 7A is a vertical cross-sectional view of the first exemplary structure after removal of the patterned hard mask layer according to the first embodiment of the present disclosure.

FIG. 7B is a top-down view of the first exemplary structure of FIG. 7A.

FIG. 8 is a vertical cross-sectional view of the first exemplary structure after formation of nanowires cores according to an embodiment of the present disclosure.

FIG. 9 is a vertical cross-sectional view of the first exemplary structure after formation of active regions and a continuous doped III-V compound material layer according to an embodiment of the present disclosure.

FIG. 12 is a vertical cross-sectional view of a second exemplary structure after formation of a blanket growth mask layer and a nano-imprint lithography resist layer according to a second embodiment of the present disclosure.

FIG. 13 is a vertical cross-sectional view of the second exemplary structure during stamping of the nano-imprint lithography resist layer with a nano-imprint lithography stamp according to the second embodiment of the present disclosure.

FIG. 14A is a vertical cross-sectional view of the second exemplary structure after separation of the nano-imprint lithography stamp from the nano-imprint lithography resist layer according to the second embodiment of the present disclosure.

FIG. 14B is a top-down view of the second exemplary structure of FIG. 14A.

FIG. 15A is a vertical cross-sectional view of the second exemplary structure after formation of openings through the growth mask layer and removal of residual portions of the nano-imprint lithography resist layer according to the second embodiment of the present disclosure.

FIG. 15B is a top-down view of the second exemplary structure of FIG. 15A.

FIG. 16A is a top-down view of a first exemplary master pattern plate for forming a first nanoimprint lithography stamp according to a third embodiment of the present disclosure. An inset shows a magnified view of a region of the first nanoimprint lithography stamp.

FIG. 16B is a vertical cross-sectional view of a portion of the first exemplary master pattern plate along the plane B-B'.

FIGS. 19C-19G are sequential vertical cross-sectional views that illustrate a manufacturing process for a fourth exemplary structure according to the fourth embodiment of the present disclosure. FIG. 19H is a top-down view of the fourth exemplary structure of FIG. 17G. The vertical plane G-G' in FIG. 19H is the plane of the vertical cross-sectional view of FIG. 17G.

FIGS. 21A, 21B, and 21D-21H are sequential vertical cross-sectional views that illustrate a manufacturing process for a fifth exemplary structure according to the fifth embodiment of the present disclosure. FIG. 21C is a top-down view of the fourth exemplary structure of FIG. 21B. The vertical plane B-B' in FIG. 21C is the plane of the vertical cross-sectional view of FIG. 21B.

FIG. 22A is a top-down view of a second exemplary lithographic mask for patterning a photolithographic material layer according to a sixth embodiment of the present disclosure. An inset shows a magnified view of a region of the second exemplary lithographic mask.

FIG. 22B is a vertical cross-sectional view of a portion of the second exemplary lithographic mask along the plane B-B'.

FIGS. 23A, 23B, 23D-23F, 23H-23J, and 23L are sequential vertical cross-sectional views that illustrate a manufacturing process for a sixth exemplary structure according to the sixth embodiment of the present disclosure. FIG. 23G is a top-down view of the fourth exemplary structure of FIG. 23F. The vertical plane F-F' in FIG. 23G is the plane of the vertical cross-sectional view of FIG. 21H.

DETAILED DESCRIPTION

Figure 2B:
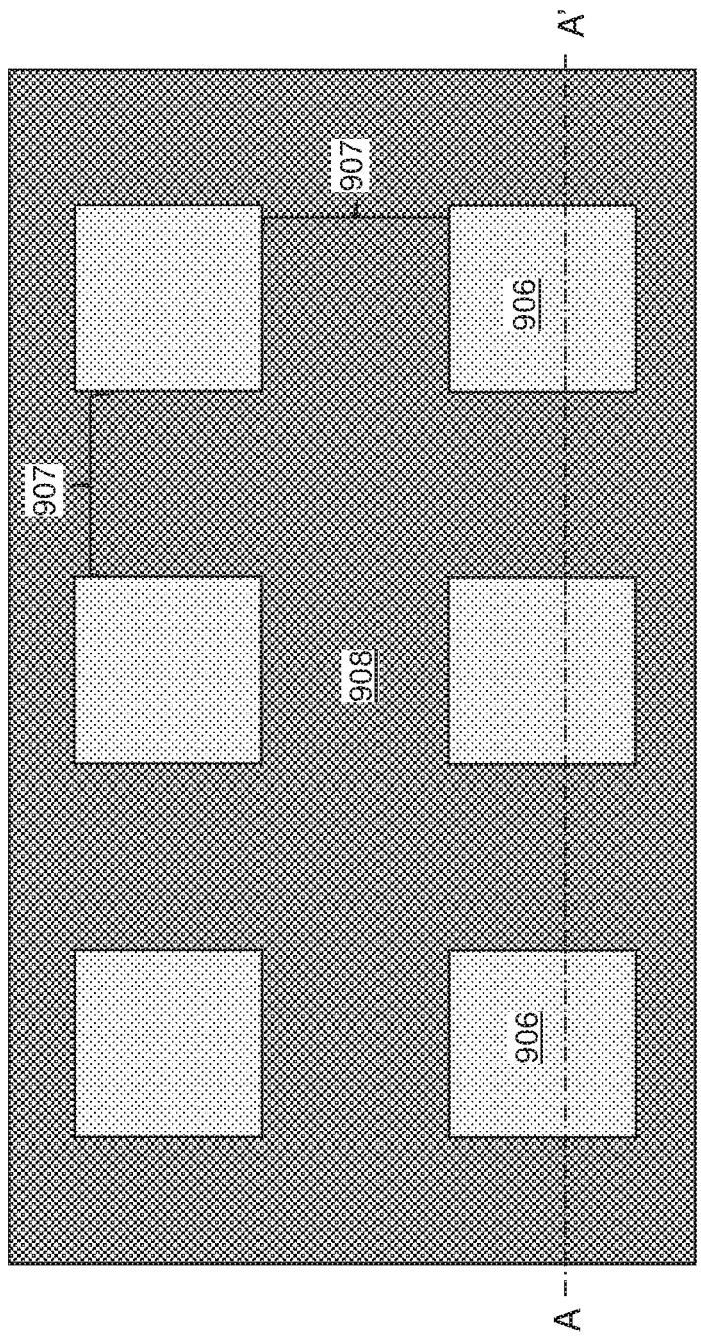
FIG. 2B is a top-down view of the first exemplary structure of FIG. 2A.

The present inventors realized that selective growth of a material can be an inexpensive alternative to a combination of processing steps including deposition of a material layer, formatting of a patterned masking layer, and patterning of the material layer by transfer of the pattern in the patterned masking layer. For example, selective growth of semiconductor nanowires through a patterned growth mask can be an efficient and inexpensive process that can be employed to form light emitting devices. The growth mask is patterned with openings through which growth of the nanowires takes place.

The present inventors realized that nano-imprint lithography is an inexpensive way of patterning a growth mask to form both openings having nanoscale lateral dimensions to grow nanowire light emitting diode (LED) pixels or sub-pixels and isolation regions (e.g., inter-pixel "streets") between the pixels or sub-pixels which contain no openings in the growth mask or nanowires extending through the growth mask. Thus, an embodiment of the present disclosure is directed to a method of forming a growth mask by nano-imprint lithography for selective growth of a material such as a semiconductor material. The embodiments of the disclosure can be employed to form various semiconductor devices such as an array of light emitting devices, such as a multi-color direct view display device having multiple pixels.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

Referring to FIGS. 1A and 1B, a first exemplary structure according to a first embodiment of the present disclosure is illustrated, which includes a substrate 902, a semiconductor material layer 904, a blanket growth mask layer 906, and photoresist material portions 903 located over the blanket growth mask layer 906.

The substrate 902 can have a thickness greater than 60 microns, and includes a material that can provide structural support to the semiconductor material layer 904. The substrate 902 can include an insulating material, a semiconducting material, or a conductive material. In one embodiment, the substrate 902 can be a single crystalline substrate on which a III-V compound semiconductor material can be epitaxially deposited. For example, the substrate 902 can be a sapphire (aluminum oxide) layer having a c-plane (0001 plane) as the crystallographic plane of the top surface.

The semiconductor material layer 904 includes a semiconductor material, which may be silicon, a silicon-containing semiconductor alloy, or a compound semiconductor material. The semiconductor material layer 904 may include a single crystalline semiconductor material or a polycrystalline semiconductor material. In one embodiment, the semiconductor material layer 904 comprises a single crystalline III-V compound semiconductor material. In one embodiment, the single crystalline III-V compound semiconductor material of the semiconductor material layer 904 comprises a Group III nitride.

In one embodiment, the semiconductor material layer 904 is a buffer layer which comprises a single crystalline gallium nitride material in epitaxial alignment with the crystalline structure of the substrate 902. The semiconductor material layer 904 can be formed, for example, by an epitaxial deposition process such as metal-organic chemical vapor deposition (MOCVD) process. The thickness of the semiconductor material layer 904 can be selected such that dislocation defects caused by lattice mismatch between the lattice parameters of the substrate 902 and gallium nitride are healed, and the defect density decreases to a level suitable for device fabrication at the top surface of the semiconductor material layer 904. For example, the thickness of the semiconductor material layer 904 can be in a range from 1.2 microns to 6 microns, although lesser and greater thicknesses can also be employed. The semiconductor material layer 904 may be intrinsic, or may be doped with electrical dopants of a first conductivity type. For example, the semiconductor material layer 904 may be n-doped by introduction of silicon as n-type dopants during the epitaxial deposition process.

A blanket growth mask layer 906 is formed over the semiconductor material layer 904. As used herein, a "blanket" layer refers to an unpatterned material layer without any hole therethrough. The blanket growth mask layer 906 includes a material from which III-V compound semiconductor materials do not grow during a selective epitaxy process. For example, the growth mask layer 906 can include a metal, such as titanium, or a dielectric material, such as silicon nitride, aluminum oxide or silicon oxide. In one embodiment, the growth mask layer 906 can include a silicon nitride or aluminum oxide layer having a thickness in a range from 3 nm to 100 nm, although lesser and greater thicknesses can also be employed.

A photoresist layer can be applied over the blanket growth mask layer 906, and can be lithographically patterned by lithographic exposure and development into photoresist material portions 903 that are laterally spaced apart among one another. In one embodiment, each of the photoresist material portions 903 can have a maximum lateral dimension in a range from 2 microns to 50 microns, such as 10 to 20 microns. As used herein, a maximum lateral dimension of an element refers to the maximum distance between a pair of points of the element located within a horizontal plane. Thus, the maximum lateral dimension of a photoresist material portion 903 is the maximum dimension between any pair of points that are present within a same horizontal plane that is parallel to the horizontal plane that includes the interface between the semiconductor material layer 904 and the blanket growth mask layer 906.

In an illustrative example, if a photoresist material portion 903 has a rectangular horizontal cross-sectional shape, the maximum lateral dimension of the photoresist material portion 903 can be a diagonal of the rectangle of the horizontal cross-sectional shape of the photoresist material portion 903. If a photoresist material portion 903 has a circular horizontal cross-sectional shape, the maximum lateral dimension of the photoresist material portion 903 can be a diameter of the circle of the horizontal cross-sectional shape of the photoresist material portion 903. If a photoresist material portion 903 has an elliptical horizontal cross-sectional shape, the maximum lateral dimension of the photoresist material portion 903 can be the major axis of the ellipse of the horizontal cross-sectional shape of the photoresist material portion 903.

In one embodiment, the photoresist material portions 903 can be arranged as a two-dimensional periodic array, which may be a two-dimensional hexagonal or rectangular array. In one embodiment, each of the photoresist material portions 903 corresponds to a location of one pixel or sub-pixel of an LED direct view display device which will be formed over the substrate. The regions 907 between the portions (e.g., between the sub-pixels) correspond to the location of the isolation regions (e.g., inter-pixel "streets") between the pixels or sub-pixels which contain no openings in the growth mask or nanowires extending through the growth mask. The pixels or sub-pixels may be diced along the isolation regions and then mounted on a backplane to form the direct view display device.

Figure 2A:
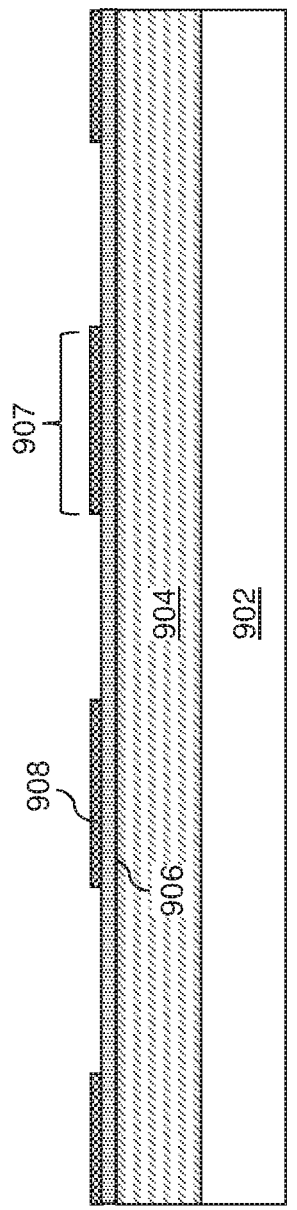
FIG. 2A is a vertical cross-sectional view of the first exemplary structure after formation of a patterned hard mask layer according to the first embodiment of the present disclosure.

Referring to FIGS. 2A and 2B, a hard mask material can be anisotropically deposited over the photoresist material portions 903 and physically exposed portions of the blanket growth mask layer 906. The hard mask material is a material that can function as an etch stop material during a subsequent anisotropic etch process that forms openings through the blanket growth mask layer 906. In one embodiment, the hard mask material can be different from the material of the blanket growth mask layer 906. In one embodiment, the hard mask material comprises, consists essentially or, and/or consists of at least one of a metal (e.g., nickel, platinum, silver, gold, copper, etc.), silicon oxide, and a dielectric metal oxide. In one embodiment, the hard mask material can include a combination of at least two metals. The anisotropic deposition method that can be employed to deposit the hard mask material includes, but is not limited to, e-beam deposition in vacuum, vacuum evaporation from an effusion cell, and anisotropic sputtering. Optionally, the hard mask material may be partially oxidized in an oxidizing environment. The thickness of the deposited hard mask material, as measured on a horizontal surface, can be in a range from 4 nm to 20 nm, although lesser and greater thicknesses can also be employed.

The photoresist material portions 903 and deposited portions of the hard mask material thereupon can be lifted off employing a photoresist lift-off process. For example, a wet etch that dissolves the material of the photoresist material portions 903 selective to the hard mask material can be employed for the lift off process. The remaining portions of the deposited hard mask material on the blanket growth mask layer 906 constitute a patterned hard mask layer 908. In one embodiment, the patterned hard mask layer 908 can be formed as a single continuous material layer with as many openings as the total number of the photoresist material portions 903 that are lifted off. Each opening in the patterned hard mask layer 908 can have the same area as the corresponding photoresist material portion 903 that is removed. In one embodiment, the openings in the patterned hard mask layer 908 can be arranged as a two-dimensional hexagonal or rectangular array.

Figure 3:
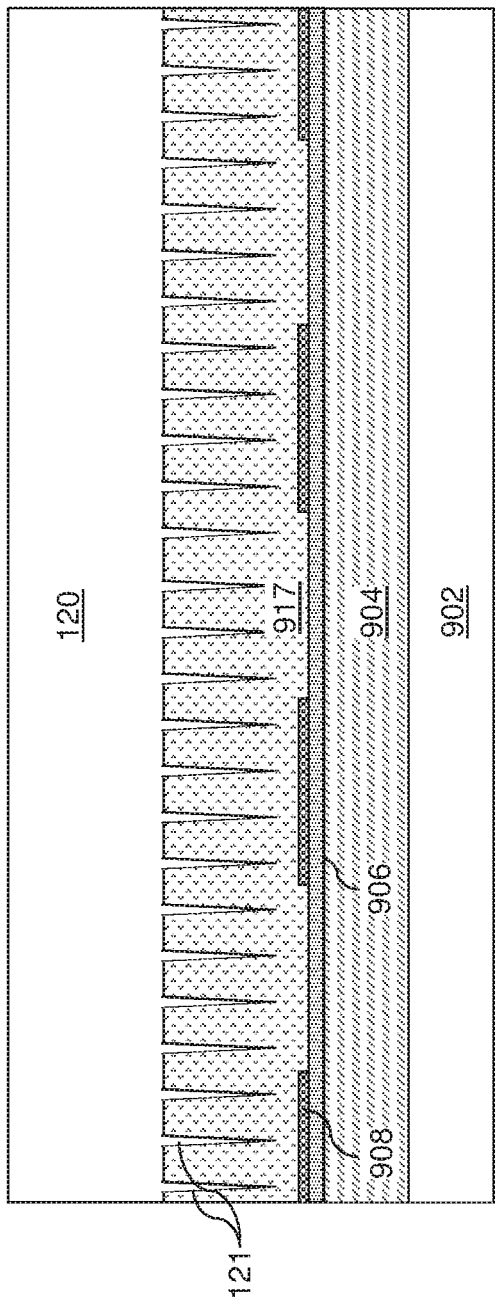
FIG. 3 is a vertical cross-sectional view of the first exemplary structure during stamping of a nano-imprint lithography resist layer according to the first embodiment of the present disclosure.

Referring to FIG. 3, a nano-imprint lithography (NIL) resist layer 917 can be formed over the patterned hard mask layer 908. The NIL resist layer 917 includes a material having viscosity that allows imprinting with a pattern upon application of a rigid nano-imprint lithography stamp 120, and is capable of holding the imprinted pattern with, or without curing. In one embodiment, the NIL resist layer 917 comprises a thermosetting polymer or a UV curable polymer. The NIL resist layer 917 can be formed, for example, by spin coating. The thickness of the NIL resist layer 917 can be in a range from 30% to 99%, such as from 70% to 90%, of the height of the pattern of protrusions on the bottom side (the contacting side) of the nano-imprint lithography stamp 120. For example, the thickness of the NIL resist layer 917 can be in a range from 1 micron to 20 microns, such as from 2 microns to 10 microns.

The nano-imprint lithography stamp 120 includes vertical protrusions 121 at a bottom surface, which is the contacting surface of the nano-imprint lithography stamp 120. The vertical protrusions can be in an array configuration to provide an array of protrusions that protrude downward. In one embodiment, each of the protrusions may have the same shape, and may be arranged in a two-dimensional periodic array. In one embodiment, each of the protrusions can have a maximum lateral dimension in a range from 50 nm to 500 nm. The protrusions may have a circular horizontal cross-sectional shape, a polygonal horizontal cross-sectional shape (e.g., hexagonal shape), or an elliptical horizontal cross-sectional shape. The pitch of the array of protrusions can be in a range from 2 to 10 times the maximum lateral dimension of a protrusion.

The horizontal cross-sectional area of each protrusion may be invariant with height to provide a cylindrical configuration, or may be tapered to provide a conical or a frustum configuration such that the horizontal cross-sectional area of each protrusion decreases with distance from a bottom planar surface of the nano-imprint lithography stamp. The ratio of the height of each protrusion to the maximum lateral dimension of the protrusion is herein referred to as an aspect ratio of the protrusion. The protrusions of the nano-imprint lithography stamp can have an aspect ratio of at least 3. For example, the aspect ratio of the protrusions of the nano-imprint lithography stamp 120 may be in a range from 3 to 300, from 5 to 100, and/or from 8 to 50, although lesser and greater aspect ratios can also be employed.

In one embodiment, the array of protrusions of the nano-imprint lithography stamp 120 can be arranged as a two-dimensional periodic array that extends over an area including multiple openings in the patterned hard mask layer 908 exposing the blanket growth mask layer 906 (i.e., in the pixel or sub-pixel regions) and over the isolation regions 907 containing the portions of the patterned hard mask layer 908 between the exposed pixel or sub-pixel regions. In one embodiment, the array of protrusions of the nano-imprint lithography stamp 120 can extend over 100 or more repetitions of openings in the patterned hard mask layer 908 along each direction of periodicity of openings in the patterned hard mask layer 908.

Figure 4A:
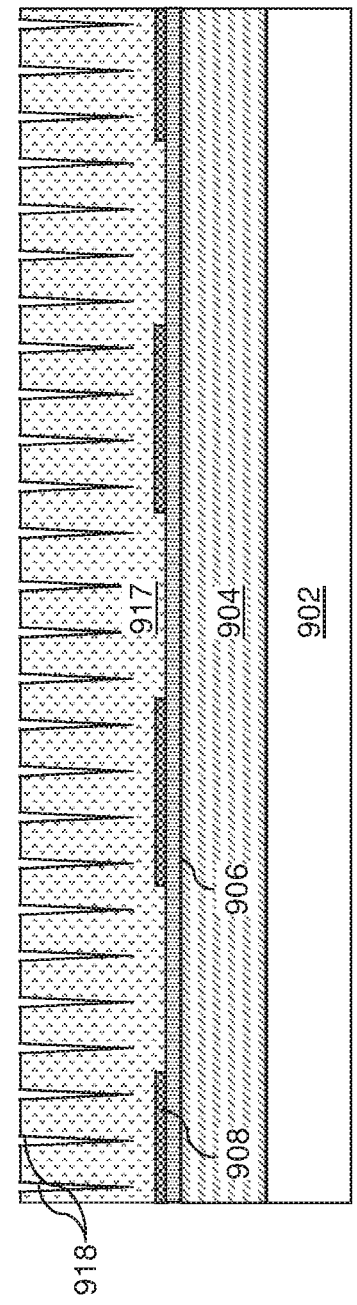
FIG. 4A is a vertical cross-sectional view of the first exemplary structure after separation of a nano-imprint lithography stamp from the nano-imprint lithography resist layer according to the first embodiment of the present disclosure.
Figure 4B:
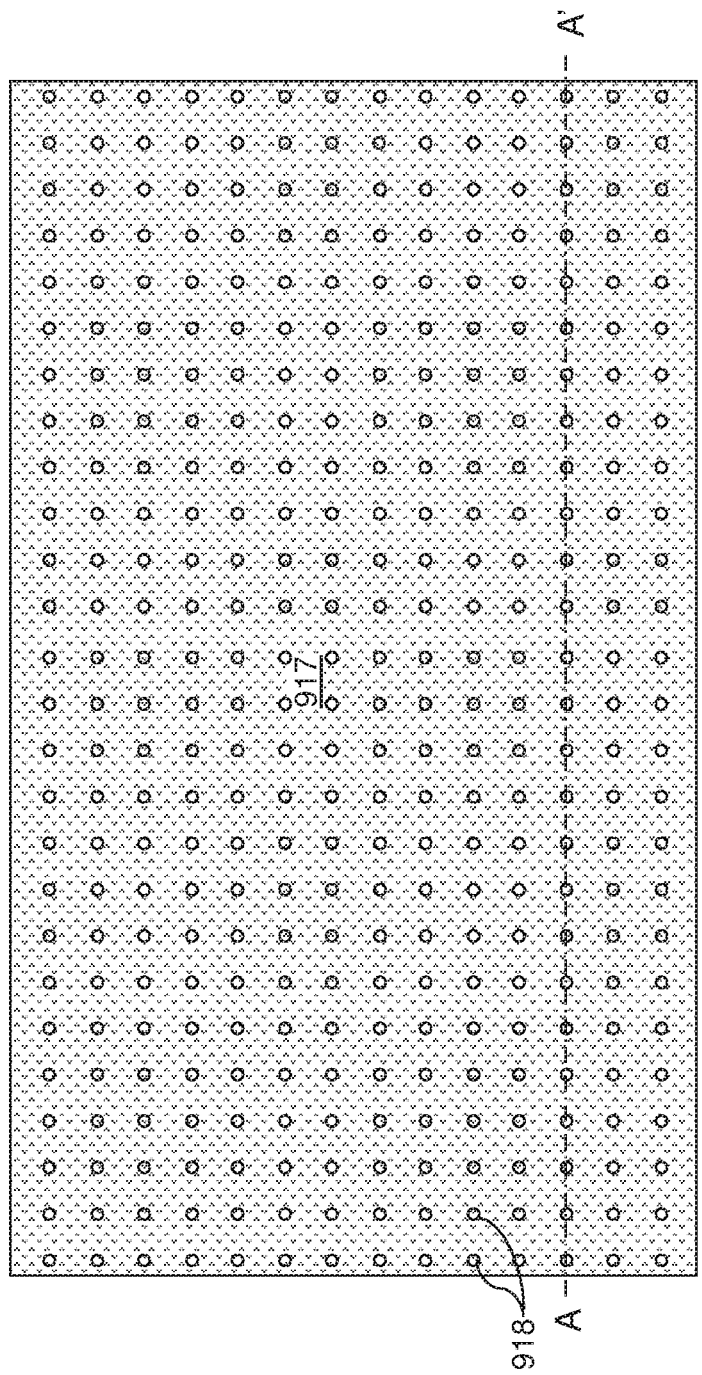
FIG. 4B is a top-down view of the first exemplary structure of FIG. 4A.

Referring to FIGS. 4A and 4B, the nano-imprint lithography stamp 120 can be vertically retracted. The NIL resist layer 917 includes recesses 918 that are formed on the top surface of the NIL resist layer 917. The pattern of the recesses (e.g., cavities) 918 in the NIL resist layer 917 replicates the pattern of the protrusions on the nano-imprint lithography stamp 120. Optionally, the NIL resist layer 917 can be cured after stamping to increase rigidity of the pattern in the NIL resist layer 917, for example, by an anneal process or by ultraviolet radiation. In one embodiment, a two-dimensional periodic array of recesses 918 can extend over the area including multiple openings in the patterned hard mask layer 908 and over the patterned hard mask layer 908 itself.

Figure 5:
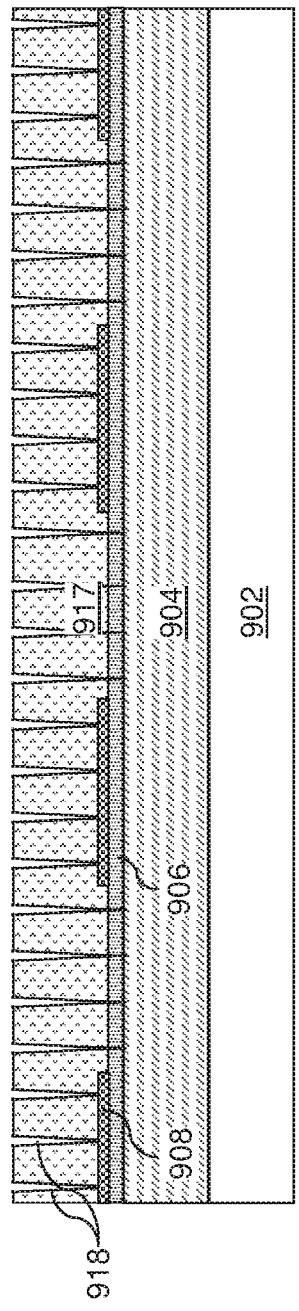
FIG. 5 is a vertical cross-sectional view of the first exemplary structure during an anisotropic etch process that recesses the nano-imprint lithography resist layer according to the first embodiment of the present disclosure.

Referring to FIG. 5, and anisotropic etch is performed to vertically recess the pattern of the recesses (e.g., cavities) 918 on the top surface of the NIL resist layer 917. The anisotropic etch can be a reactive ion etch that induces ions to impinge on the NIL resist layer 917 with high directionality. For example, more than 50% (such as 80% or more) of the ions that impinge on the NIL resist layer 917 can have a velocity vector that is within 2 degrees from the vertical downward direction, i.e., the downward direction that is perpendicular to the interface between the semiconductor material layer 904. The anisotropic etch process etches the material of the NIL resist layer 917, thereby moving downward the pattern of the recesses (e.g., cavities) 918 on the top surface of the NIL resist layer 917.

The chemistry of the anisotropic etch process is selected such that the anisotropic etch etches the material of the blanket growth mask layer 906 without substantially etching the material of the patterned hard mask layer 908. In other words, the chemistry of the anisotropic etch process is selected such that the material of the blanket growth mask layer 906 is etched selective to the material of the patterned hard mask layer 908. The selectivity (the inverse of the ratio of the etch rates) of the anisotropic etch process can be in a range from 5 to 100, although lesser and greater values of the selectivity can also be employed. Thus, the pattern of the recesses 918 in the NIL resist layer 917 is transferred through the blanket growth mask layer 906 only within areas in which the patterned hard mask layer 908 is not present.

Figure 6A:
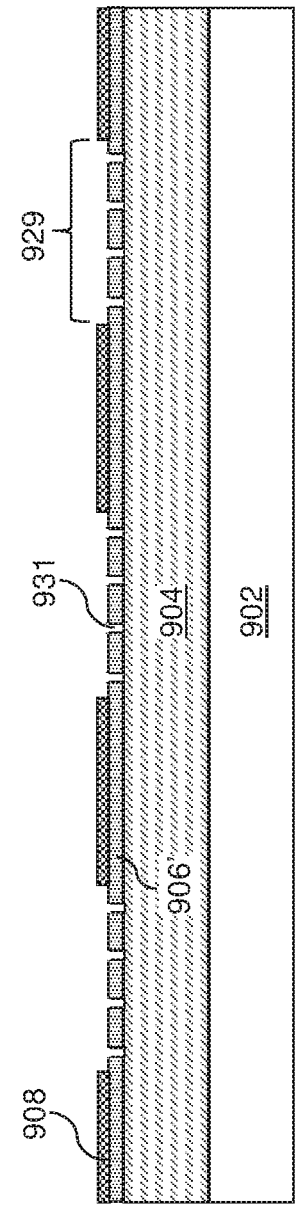
FIG. 6A is a vertical cross-sectional view of the first exemplary structure after formation of openings through the growth mask layer and removal of residual portions of the nano-imprint lithography resist layer according to the first embodiment of the present disclosure.
Figure 10:
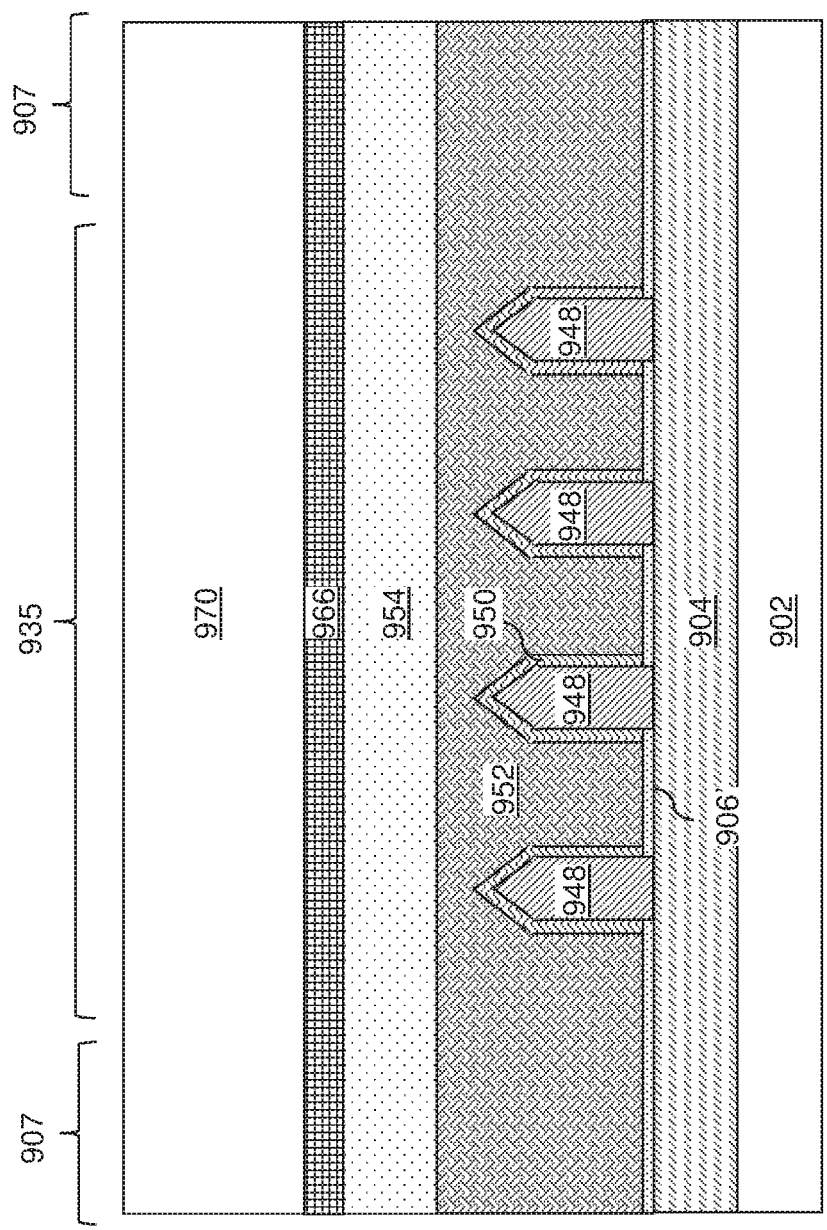
FIG. 10 is a vertical cross-sectional view of the first exemplary structure after formation of a transparent conductive oxide layer, a reflector layer, and a dielectric material layer according to an embodiment of the present disclosure.

Referring to FIGS. 6A and 6B, the anisotropic etch of the NIL resist layer 917 transfers the pattern in the NIL resist layer 917 through portions of the blanket growth mask layer 906 only underneath the openings 929 in the patterned hard mask layer 908. The blanket growth mask layer 906 becomes a patterned growth mask layer 906' with clusters of openings 931 therein. The patterned hard mask layer 908 prevents transfer of the pattern in the NIL resist layer 917 therethrough during transfer of the pattern in the NIL resist layer 917 through the portions of the blanket growth mask layer 906 that are not covered by the patterned hard mask layer 908.

Upon selective transfer of the pattern in the NIL resist layer 917 only through portions of the blanket growth mask layer 906 located underneath the openings 929 in the patterned hard mask layer 908, the blanket growth mask layer 906 becomes a patterned growth mask layer 906' with clusters of openings 931 therein. Each cluster 933 of openings 931 in the patterned growth mask layer 906' is formed entirely within the area of a corresponding opening 929 in the patterned hard mask layer 908. Each cluster of openings 931 in the patterned growth mask layer 906' can comprise a two-dimensional periodic array of hexagonal or circular openings. Each cluster 933 of openings 931 corresponds to a pixel or sub-pixel area which is separated from other pixel or sub-pixel areas by respective isolation regions 907. In one embodiment, each opening 931 through the patterned growth mask layer 906' has a maximum lateral dimension in a range from 50 nm to 500 nm, although lesser and greater dimensions can also be employed.

Referring to FIGS. 7A and 7B, the patterned hard mask layer 908 can be removed selective to the patterned growth mask layer 906'. In an illustrative example, if the patterned hard mask layer 908 includes a metallic material such as Pt and/or Ni, the patterned hard mask layer 908 can be removed by a wet etch process employing dilute aqua regia.

The clusters 933 of openings 931 in the patterned growth mask layer 906 can be subsequently employed to grow semiconductor material portions therethrough employing a selective semiconductor deposition process such as selective epitaxy. In one embodiment, the semiconductor material portions can be grown by a selective epitaxy process in which the semiconductor material grows from semiconductor surfaces and does not grow from surfaces of the patterned growth mask layer 906'. In one embodiment, the semiconductor material portions can comprise semiconductor nanowires that are grown along the vertical direction, which is perpendicular to the interface between the semiconductor material layer 904 and the patterned growth mask layer 906'. In one embodiment, the semiconductor material portions can be formed as clusters of semiconductor material portions extending through a respective cluster of openings 931 in the patterned growth mask layer 906'.

An illustrative example is shown in FIG. 8, which shows one cluster 935 (e.g., array) of nanowire cores 948 that are grown through the openings 931 in a respective cluster 933 of openings 931 in the patterned growth mask layer 906'. Each cluster 935 of nanowire cores 948 corresponds to a pixel or sub-pixel area which is separated from other pixel or sub-pixel areas by respective isolation regions 907. In one embodiment, each nanowires core 948 includes a doped gallium nitride or indium gallium nitride material having a doping of a first conductivity type, which can be the same as the conductivity type of doping of the semiconductor material layer 904. In one embodiment, the first conductivity type can be n-type, and each nanowires core 948 includes an n-doped indium gallium nitride having the same composition as the semiconductor material layer 904. In this case, the epitaxial strain between the nanowire cores 948 and the semiconductor material layer 904 can be zero or substantially zero.

Each of the nanowires cores 948 can be formed with a set of substantially vertical sidewalls and a tip portion having angled facets, i.e., facets that are not horizontal and not vertical. The nanowires cores 948 can be grown, for example, by selective epitaxial growth of an n-doped compound semiconductor material. The process parameters of the selective epitaxial growth process can be selected such that an n-doped compound semiconductor material grows upward with substantially vertical sidewalls and angled facets from each opening through the patterned growth mask layer 906'. Methods for growing the nanowires cores 948 through the openings in the patterned growth mask layer 906' with substantially vertical sidewalls and faceted tip portion are described, for example, in U.S. Pat. No. 8,664,636 to Konsek et al., U.S. Pat. No. 8,669,574 to Konsek et al., and U.S. Pat. No. 9,287,443 to Konsek et al., each of which is assigned to Glo AB. The height of the nanowires cores 948 can be in a range from 2 microns to 40 microns, although lesser and greater heights can also be employed.

According to an aspect of the present disclosure, an array of light emitting diodes can be formed employing the semiconductor material portions (such as the nanowire cores 948) that are grown through the openings 931 in the patterned growth mask layer 906'. Each light emitting diode can comprise a respective p-n or p-i-n diode junction.

An illustrative example is shown in FIG. 9, which shows formation of an active shell 950 on each nanowires core 948. The active shell 950 includes at least one semiconductor material that emits light upon application of a suitable electrical bias. For example, each active shell 950 can include a single quantum well or multi-quantum well (MQW) structure that emits blue, green or red light upon application of an electrical bias thereacross. For example, each active shell 950 can include a multi-quantum well including multiple repetitions of a combination of a light emitting indium gallium nitride layer having a first thickness (which may be in a range from 1 nm to 10 nm) and barrier layers which have a wider band gap than the indium gallium nitride layer. The barrier layers may comprise gallium nitride, aluminum gallium nitride, indium aluminum gallium nitride or indium gallium nitride having less indium than the light emitting indium gallium nitride layer. The set of all layers within an active shell 950 is herein referred to as an active layer. For example, the light emitting (i.e., quantum well) gallium nitride layer may have the following formula: $In_xGa_{1-x}N$, where $0.4 \leq x \leq 0.6$, such as where $0.45 \leq x \leq 0.55$ (i.e., which contains a higher indium concentration than the semiconductor material layer 904 and the nanowire cores 948).

A selective epitaxy process can be employed to grow the active shells 950. The process parameters of the selective epitaxy process can be selected such that the active shells 950 are grown as conformal structures having a same thickness throughout. In another embodiment, the active shells 950 can be grown as a pseudo-conformal structure in which the vertical portions have the same thickness throughout, and faceted portions over the tips of the nanowires cores 948 have thicknesses that differ from the thickness of the vertical portions. Methods for growing the active shells 950 on the nanowires cores 948 are described, for example, in U.S. Pat. No. 8,664,636 to Konsek et al., U.S. Pat. No. 8,669,574 to Konsek et al., and U.S. Pat. No. 9,287,443 to Konsek et al., each of which is assigned to Glo AB. The thickness of the vertical portions of the active shells 950 can be selected such that the active shells 950 do not merge among one another. The thickness of the vertical portions of the active shells 950 can be in a range from 20 nm to 1 micron, although lesser and greater thicknesses can also be employed.

Each set of a nanowires core 948 and an active shell 950 that contacts, surrounds, and overlies the nanowires core 948 constitutes a nanowire (948, 950). In one embodiment, the set of all nanowires (948, 950) formed on the substrate can include a cluster 935 of nanowires (948, 950) that remain in a final device structure and corresponds to a pixel or sub-pixel, and additional nanowires (948, 950) that are located in other clusters 935 which correspond to other pixel or sub-pixel areas which are separated from the first pixel or sub-pixel area by respective isolation regions 907. All nanowires (948, 950), including the cluster 935 of nanowires (948, 950) and the additional clusters of nanowires (948, 950) can be grown through respective clusters 933 of openings 931 in the patterned growth mask layer 906' employing at least one selective epitaxy process, which can be at least two selective epitaxy processes including a first selective epitaxy process that forms the nanowires cores 948 and at least one second selective epitaxy process that forms the active shells 950.

An array of combinations of a nanowire core 948 and a shell 950 is formed through the openings in the patterned growth mask layer 906'. Each nanowire core 948 includes a III-V compound material having a doping of the first conductivity type, and each shell 950 laterally surrounds a respective nanowire core 948 and includes a respective active region that emits light at the peak wavelength upon application of an electrical bias thereacross. In one embodiment, the active region within each shell 950 can be configured to emit light at a peak wavelength in a visible wavelength range (i.e., between 400 nm and 800 nm), and located on a top surface of the continuous indium gallium nitride layer.

In one embodiment, a doped III-V compound material layer 952 is formed on the sidewalls and faceted outer surfaces of the nanowires (948, 950). The doped III-V compound material layer 952 includes a doped semiconductor material having a doping of a second conductivity type, which is the opposite of the first conductivity type. For example, if the first conductivity type is n-type, the second conductivity type is p-type. If the first conductivity type is p-type, the second conductivity type is n-type.

The compound semiconductor material of the doped III-V compound material layer 952 can be selected to optimize efficiency of the active shells 950 for a given composition of the first conductivity type doped compound semiconductor material of the nanowires cores 948. In one embodiment, the nanowires cores 948 can include n-doped gallium nitride or indium gallium nitride, and the doped III-V compound material layer 952 can include p-doped gallium nitride, indium gallium nitride or aluminum gallium nitride.

In one embodiment, the thickness of the deposited semiconductor material of the continuous doped III-V compound material layer 952 can be selected so that the volumes between neighboring pairs of nanowires (948, 950) are filled with vertical portions of the doped III-V compound material layer 952 which can be a continuous layer. The continuous doped III-V compound material layer 952 includes a horizontally extending portion that continuously extends horizontally and overlies the array of nanowires (948, 950) and vertical portions that are located between neighboring pairs of nanowires (948, 950). The horizontally extending portion of the continuous doped III-V compound material layer 952 contacts faceted surfaces of the nanowires (948, 950). Each vertical portion of the continuous doped III-V compound material layer 952 can contact a portion of the top surface of the patterned growth mask layer 906' and can be adjoined to the horizontally extending portion of the continuous doped III-V compound material layer 952. The thickness of the horizontally extending portion of the continuous doped III-V compound material layer 952 (as measured along the vertical direction) can be in a range from 100 nm to 2 microns, such as from 200 nm to 1 micron, although lesser and greater thicknesses can also be employed.

In an alternative embodiment, air gaps or voids can be located in the doped III-V compound material layer 952, as described for example in U.S. Pat. No. 9,035,278 B2, to Svensson et al., issued on May 19, 2015 and incorporated herein by reference in its entirety. In another alternative embodiment, the continuous doped III-V compound material layer 952 may be replaced by discrete doped III-V compound material shells located around each nanowire (948, 950).

A top electrode is formed on the doped III-V compound material layer 952. The top electrode may comprise any suitable electrically conductive material, such as an optional transparent conductive oxide layer 954 which can be deposited over the horizontally extending portion of the s doped III-V compound material layer 952. In case light emitted from the active layers of the shells 950 is directed downward by a reflector layer, the transparent conductive oxide layer 954 is herein referred to a backside transparent conductive oxide layer 954. The transparent conductive oxide layer 954 includes a transparent conductive oxide material such as indium tin oxide or aluminum doped zinc oxide. The transparent conductive oxide layer 954 can be deposited as a continuous material layer that extends across the entire area of the doped III-V compound material layer 952, i.e., across the entire area of the array of nanowires (948, 950). The thickness of the transparent conductive oxide layer 954 can be in a range from 100 nm to 2 microns, such as from 200 nm to 1 micron, although lesser and greater thicknesses can also be employed.

Optionally, a reflector material can be deposited to form a reflector layer 966 that continuously extends over the transparent conductive oxide layer 954 and the array of nanowires (948, 950). The reflector layer 966 is electrically shorted to the continuous doped III-V compound material layer 952 through the transparent conductive oxide layer 954. In one embodiment, the reflector layer 966 includes at least one material selected from silver, aluminum, copper, and gold. In one embodiment, the reflector material can be deposited by a directional deposition method such as physical vapor deposition (sputtering) or vacuum evaporation. The reflector layer 966 can be employed to reflect light emitted from the active shells 950 downward.

A dielectric material is deposited over the reflector layer 966 and to form a dielectric material layer 970. The dielectric material layer 970 is formed over, and around, the reflector layer 966. The dielectric material of the dielectric material layer 970 can be a self-planarizing dielectric material such as spin-on glass (SOG) that can be formed by spin coating. Alternatively, the dielectric material of the dielectric material layer 970 can be a non-self-planarizing material. In this case, the dielectric material layer 970 may, or may not, be subsequently planarized. If the dielectric material layer 970 is planarized, a chemical mechanical planarization (CMP) process can be employed. In one embodiment, the dielectric material of the dielectric material layer 970 can include doped silicate glass or undoped silicate glass. The thickness of the dielectric material layer 970 can be in a range from 100 nm to 4 microns, such as from 200 nm to 2 microns, although lesser and greater thicknesses can also be employed.

Figure 11:
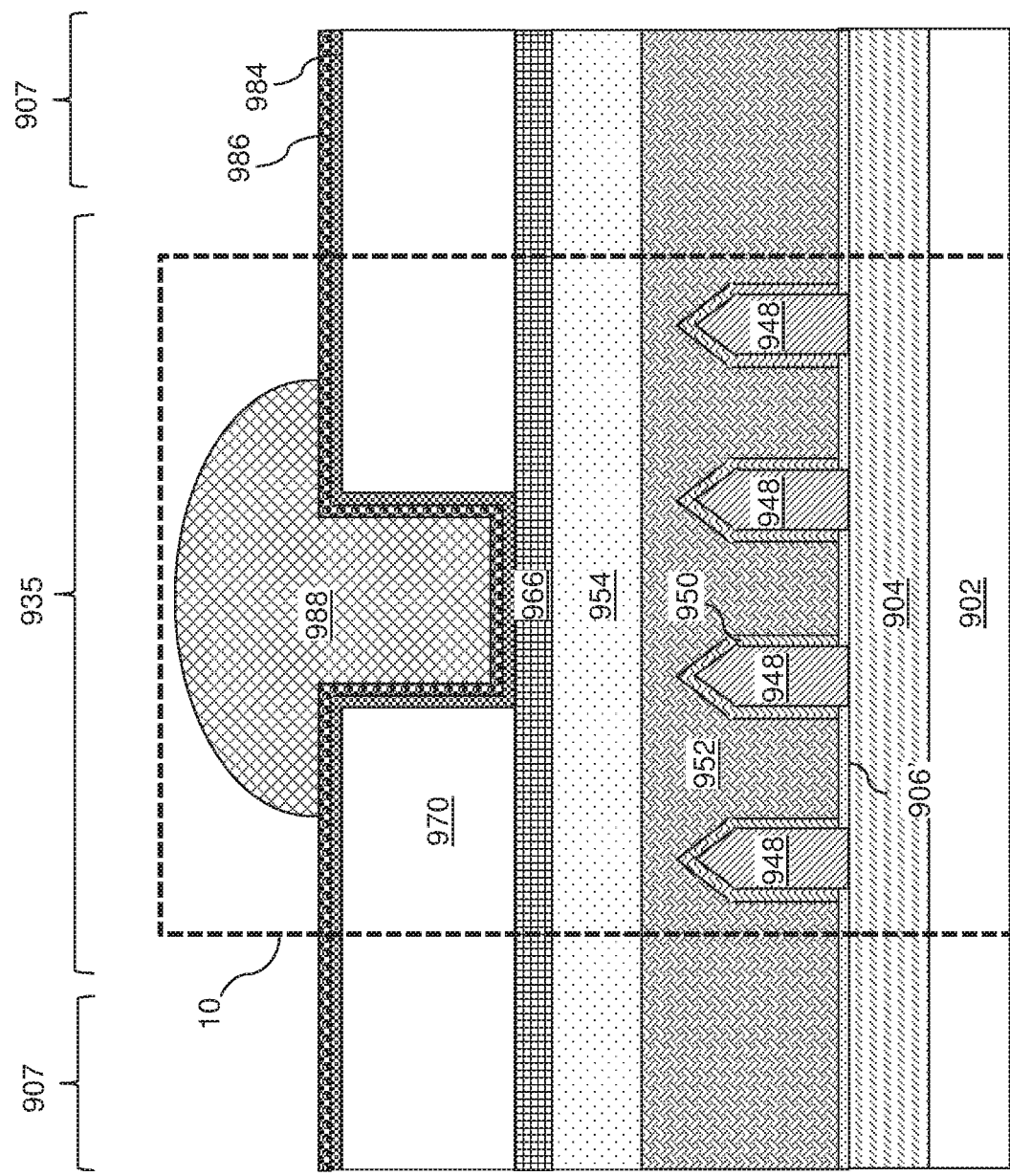
FIG. 11 is a vertical cross-sectional view of the first exemplary structure after formation of an opening through the dielectric material layer, at least one metallic barrier layer, and a solder bump according to an embodiment of the present disclosure.

Referring to FIG. 11, openings can be formed through the dielectric material layer 970 to a top surface of the reflector layer 966. For example, a photoresist layer (not shown) can be applied over the dielectric material layer 970, and can be lithographically patterned to form openings therein. The pattern of the openings in the photoresist layer can be transferred through the dielectric material layer 970 by an anisotropic etch or an isotropic etch to form the openings in the dielectric material layer 970. For example, a wet etch employing hydrofluoric acid or a reactive ion etch employing a fluorocarbon etchant can be employed to form the opening through the dielectric material layer 970. In one embodiment, one opening through the dielectric material layer 970 can be formed per one die area, i.e., per each set of nanowires (948, 950) to be employed for a single red-light emitting subpixel.

At least one metallic barrier layer (984, 986) can be formed as at least one continuous material layer over the top surface of the dielectric material layer 970 and in the opening through the dielectric material layer 970. The at least one metallic barrier layer (984, 986) can be formed directly on the reflector layer 966. The at least one metallic barrier layer (984, 986) extends vertically through the openings through the dielectric material layer 970, and is electrically shorted to the reflector layer 966, the transparent conductive oxide layer 954, and the continuous doped III-V compound material layer 952.

The at least one metallic barrier layer (984, 986) includes metallic material layers that can be employed for under-bump metallurgy (UBM), i.e., a set of metal layers provide between a solder bump and a die. In one embodiment, the at least one metallic barrier layer (984, 986) can include a diffusion barrier layer 984 and an adhesion promoter layer 986. Exemplary materials that can be employed for the diffusion barrier layer 984 include titanium and tantalum. Exemplary materials that can be employed for the adhesion promoter layer 986 include a stack, from bottom to top, of copper and nickel, tungsten, platinum, and a stack of tungsten and platinum. Any other under-bump metallurgy known in the art can also be employed. The at least one metallic barrier layer (984, 986) includes a horizontal portion that overlies the dielectric material layer 970 and a vertically protruding portion that adjoins an inner periphery of the horizontal portion and contacting sidewalls of the dielectric material layer 970 and the reflector layer 966.

A solder bump 988 can be formed in the cavity within the opening in the dielectric material layer 970 and over a portion of the top surface of the at least one metallic barrier layer (984, 986) located around the opening in the dielectric material layer 970. The solder bump 988 includes a solder material, which can include tin, and optionally includes silver, copper, bismuth, indium, zinc, and/or antimony. The upper portion of the solder bump 988 located above the horizontal plane including the top surface of the at least one metallic barrier layer (984, 986) can have a shape of a predominant portion of a sphere. It is understood that shape of the solder bump 988 as illustrated is only schematic, and may not represent a true shape of a solder bump 988. The lower portion of the solder bump 988 fills the opening in the dielectric material layer 970. If the solder bump 988 has a shape of a predominant portion of a sphere, the diameter of the sphere can be in a range from 15 microns to 60 microns, although lesser and greater diameters can also be employed. The lower portion of the solder bump 988 can be formed directly on a sidewall of the at least one metallic barrier layer (984, 986) within the opening through the dielectric material layer 970 and directly on a top surface of a recessed portion of the at least one metallic barrier layer (984, 986). The solder bump 988 is electrically shorted to the reflector layer 966, the transparent conductive oxide layer 954, and the doped III-V compound material layer 952.

As shown in FIG. 11, each cluster 935 of nanowires (948, 950) in combination with the respective layer 952 and one or more overlying conductive layer(s) (954, 966, 984, 986, 988) comprises an LED die 10 separated from adjacent LED die by respective isolation regions 907. The LED die can be an LED which emits a particular color of light (e.g., radiation of particular peak emission wavelength), such as blue, green or red light for example.

In an alternative embodiment of the present disclosure, the patterned hard mask layer 908 can be located underneath the patterned growth mask layer 906. In this case, the patterned hard mask layer 908 can prevent nanowire growth through it. The patterned hard mask layer 908 can also be used as an alignment mark in a subsequent photolithography masking step because the patterned hard mask layer 908 may cause a bump to appear in the overlying portion of the growth mask layer 906.

According to another embodiment of the present disclosure, a nano-imprint lithography method can be employed without employing a patterned hard mask layer. Referring to FIG. 12, a second exemplary structure according to a second embodiment of the present disclosure can be derived from the first exemplary structure of FIGS. 1A and 1B by omitting formation of the photoresist material portion 903, and by applying the nano-imprint lithography (NIL) resist layer 917 directly on the entirety of the top surface of the blanket growth mask layer 906.

Referring to FIG. 13, a nano-imprint lithography stamp 220 having a different pattern of protrusions 221 than the nano-imprint lithography stamp 120 of FIG. 3 is employed to stamp the top surface of the NIL resist layer 917. Specifically, the protrusions 221 on the bottom surface of the nano-imprint lithography stamp 220 can include multiple clusters 222 of protrusions 221 such that each cluster 222 of protrusions is laterally spaced apart from other clusters 222 of protrusions. For example, each cluster 222 of protrusions can be located within an area that is laterally surrounded by a protrusion-free area 227 of the bottom surface of the nano-imprint lithography stamp 220.

In one embodiment, each cluster 222 of protrusions 221 among the multiple clusters 222 of protrusions of the nano-imprint lithography stamp 220 can be arranged as a two-dimensional periodic array having a maximum lateral extent in a range from 2 microns to 200 microns. With each array of protrusions, each protrusion can have a maximum lateral dimension in a range from 50 nm to 500 nm. The pitch of each cluster 222 of protrusions can be in a range from 2 to 10 times the maximum lateral dimension of a protrusion. Each cluster 222 of protrusions 221 corresponds to a pixel or sub-pixel area which is separated from other pixel or sub-pixel areas by respective protrusion-free areas 227 (which correspond to the isolation regions 907).

In one embodiment, the pattern of the protrusions on the bottom surface of the nano-imprint lithography stamp 220 can be the same as the pattern of the openings 931 through the patterned growth mask layer 906' illustrated in FIG. 7B. In one embodiment, each cluster of protrusions on the bottom surface of the nano-imprint lithography stamp 220 can comprise a two-dimensional periodic array of protrusions. In one embodiment, the protrusions can have an aspect ratio of at least 3. For example, the aspect ratio of the protrusions of the nano-imprint lithography stamp 220 may be in a range from 3 to 300, from 5 to 100, and/or from 8 to 50, although lesser and greater aspect ratios can also be employed.

Referring to FIGS. 14A and 14B, the nano-imprint lithography stamp 220 is retracted upward from the NIL resist layer 917. Multiple clusters 919 of recesses 918 can be formed on the top surface of the NIL resist layer 917. Each cluster 919 of recesses 918 can include a two-dimensional periodic array of recesses 918 separated by isolation regions 907.

In one embodiment, each array of recesses in a cluster 919 of recesses can be arranged as a two-dimensional periodic array having a maximum lateral extent in a range from 2 microns to 200 microns. With each cluster of recesses, each recess can have a maximum lateral dimension in a range from 50 nm to 500 nm. The pitch of the array of recesses in each cluster 919 can be in a range from 2 to 10 times the maximum lateral dimension of a protrusion. Each recess 918 can have an aspect ratio of at least 3. Each cluster 919 corresponds to a pixel or sub-pixel area which is separated from other pixel or sub-pixel areas by respective isolation regions 907.

Optionally, the NIL resist layer 917 can be cured after stamping to increase rigidity of the pattern in the NIL resist layer 917, for example, by an anneal process or by ultraviolet radiation. In one embodiment, the lateral extent of each two-dimensional periodic array of recesses is limited to the area of the respective cluster 919 of recesses, which is laterally spaced apart from other clusters 919 of recess by a recess-free isolation region 907 that laterally surrounds the cluster C of recesses.

Referring to FIGS. 15A and 15B, the processing steps of FIGS. 5, 6A, and 6B is performed. Specifically, an anisotropic etch is performed to transfer the pattern of the recesses on the top surface of the NIL resist layer 917 through the blanket growth mask layer 906, thereby converting the blanket growth mask layer 906 into a patterned growth mask layer 906', which can have the same structure as the patterned growth mask layer 906' of the first embodiment. The resulting structure can be the same as the first exemplary structure of FIGS. 7A and 8B.

Subsequently, semiconductor material portions can be selectively formed in the same manner as in the first embodiment. For example, the processing steps of FIGS. 8-11 can be subsequently performed to arrive at the structure of FIG. 11.

The methods of the present disclosure provide a low-cost method for selective epitaxial growth of semiconductor structures only from openings through a patterned growth mask layer. Particularly, selective growth of a semiconductor material can be performed to provide nanoscale array of protruding semiconductor structures (such as semiconductor nanowires or semiconductor nanopyramids), which can be employed to form sub-pixels of a light emitting diode assembly. For example, each cluster of semiconductor nanowires that is formed through a respective cluster of openings in the patterned growth mask layer can be employed to form a single sub-pixel of a light emitting diode assembly. With suitable masking of various subsets of clusters and growth of different semiconductor materials on different clusters of semiconductor material portions, an array of light emitting diode sub-pixels or pixels, each including a set of sub-pixels emitting light at different peak wavelengths, can be transferred to a backplane to form a direct view display device.

Referring to FIGS. 16A and 16B, a first exemplary master pattern plate 600 for forming a first nanoimprint lithography stamp is shown according to a third embodiment of the present disclosure. The first exemplary master pattern plate 600 includes a master substrate 610 and a master pattern layer 620 that includes a matrix of a patterned solid material, which can be a metal or a hard dielectric material such as silicon oxide, silicon nitride, or a dielectric metal oxide. The thickness of the master pattern layer 620 can be the depth of the pattern to be formed in the first nanoimprint lithography stamp, and may be in a range from 600 nm to 16 microns, such as from 1.3 microns to 8 microns.

The master pattern layer 620 includes alignment mark patterns 630. Any suitable pattern may be used. In one embodiment, the alignment mark patterns 630 comprise a continuous aperture defined by a set of connected sidewalls of the matrix of the patterned solid material. In an illustrative example, the alignment mark patterns 630 can have a shape of a cross. The master pattern layer 620 further includes an opening array pattern 640, which includes an array of openings through the matrix of the patterned solid material. In one embodiment, the opening array pattern 640 can include a complementary area of the areas of the alignment mark patterns 630, i.e., the entire area defined by the outer periphery of the master pattern layer 620 other than the areas of the alignment mark patterns 630. The opening array pattern 640 includes an array of discrete openings in the master pattern layer 620. Each of the discrete openings may have a circular horizontal cross-sectional shape, a polygonal horizontal cross-sectional shape (e.g., hexagonal shape), or an elliptical horizontal cross-sectional shape. The opening array pattern 640 can be periodic in two directions with a respective pitch. Each pitch can be in a range from 2 to 10 times the maximum lateral dimension of an opening within the opening array pattern 640. The shape of each alignment mark pattern 630 can have a lateral dimension that is at least 6 times the maximum lateral dimension (such as the diameter) of each opening in the opening array pattern 640.

Figure 17A:
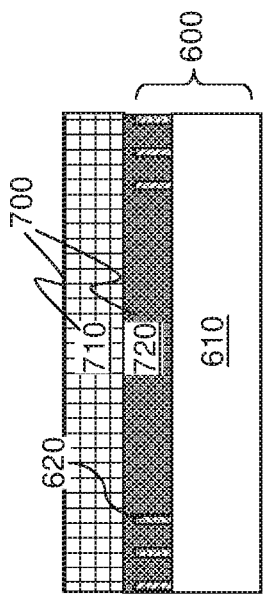
FIGS. 17A and 17B are vertical cross-sectional views that illustrate a manufacture process for the first exemplary stamp according to the third embodiment of the present disclosure.

Referring to FIG. 17A, a viscous stamp material portion 719 can be applied over the pattern side of the first exemplary master pattern plate 600. The viscous stamp material portion 719 can be any material known in the art that can be hardened, for example by curing, into a rigid material.

Figure 17B:
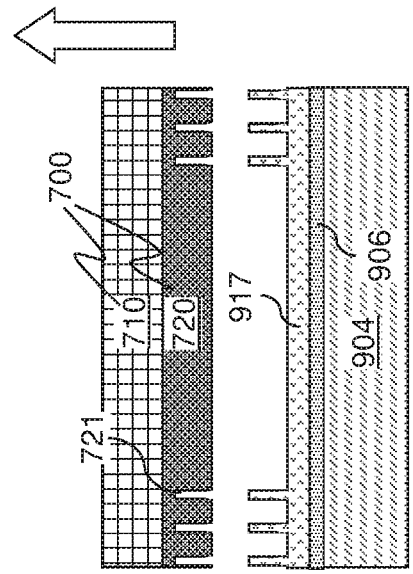

Referring to FIG. 17B, a stamp substrate 710 is attached to a top surface of the viscous stamp material portion 719. The viscous stamp material portion 719 is subsequently cured into a stamp pattern layer 720 that includes a hardened stamp material that replicates the pattern of the master pattern layer 620 as a negative. In other words, the stamp pattern layer 720 includes the complementary pattern of the pattern in the master pattern layer 620. Subsequently, the combination of the stamp substrate 710 and the stamp pattern layer 720 is lifted off the first exemplary master pattern plate 600 to provide a first exemplary stamp 700.

The first exemplary stamp 700 is a nano-imprint lithography stamp including a device region and alignment mark regions that are surrounded by the device region. The device region includes a pattern of an array of protrusions, and each of the alignment mark regions includes a pattern that is different from the pattern of the array of protrusions. In one embodiment, each of the alignment mark regions includes a mesa pattern having a lateral dimension that is at least 6 times a maximum lateral dimension of each protrusion within the array of protrusions. In one embodiment, the mesa pattern can be a cross pattern.

Figure 17C:
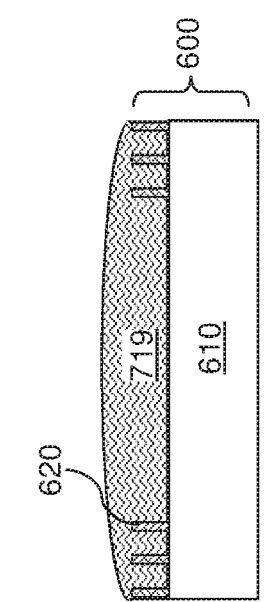
FIGS. 17C-17G are sequential vertical cross-sectional views that illustrate a manufacturing process for a third exemplary structure according to the third embodiment of the present disclosure.

Referring to FIG. 17C, a third exemplary structure according to the third embodiment of the present disclosure is illustrated, which includes a stack, from bottom to top, of a semiconductor material layer 904, a blanket growth mask layer 906, and a nano-imprint lithography (NIL) resist layer 917. Each of the semiconductor material layer 904, the blanket growth mask layer 906, and the NIL resist layer 917 can be the same as in the first or second exemplary structure described above. A substrate such as the substrate 902 of the first or second exemplary structure may be provided underneath the semiconductor material layer 904. The first exemplary stamp 700 is placed in a position such that the stamp pattern layer 720 faces the NIL resist layer 917.

Figure 17D:
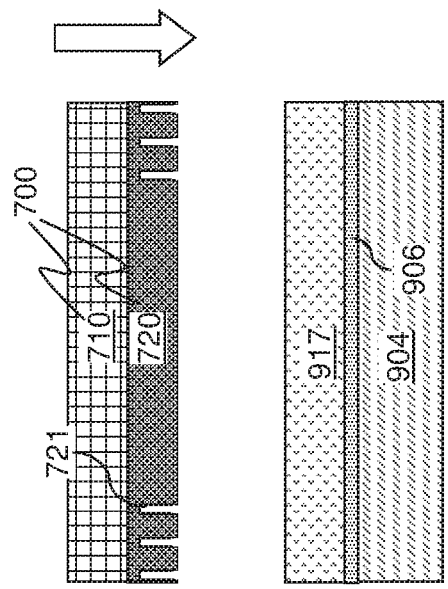

Referring to FIG. 17D, the NIL resist layer 917 is stamped with the first exemplary stamp 700 as in the first or second embodiments. The pattern of the master pattern layer 620 is replicated in the NIL resist layer 917. As in the first and second embodiments, the NIL resist layer 917 can comprise a thermosetting polymer or a UV curable polymer, and the NIL resist layer 917 may be cured after stamping with the nano-imprint lithography stamp. In one embodiment, each recess within the pattern of recesses that are formed on the upper surface of the NIL resist layer can have an aspect ratio of at least 3.

Figure 17F:
Figure 17H:
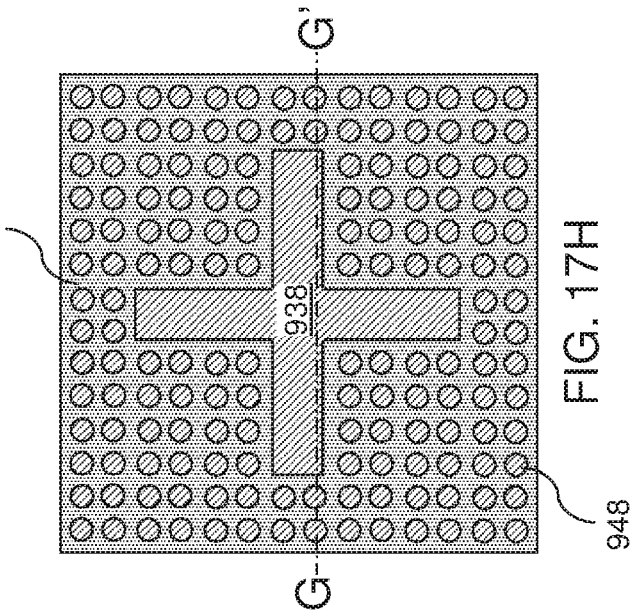
FIG. 17H is a top-down view of the third exemplary structure of FIG. 17G. The vertical plane G-G' in FIG. 17H is the plane of the vertical cross-sectional view of FIG. 17G.
Figure 17E:

Referring to FIG. 17E, an etch process, such as an anisotropic etch process, can be performed to etch through unmasked areas of the blanket growth mask layer 906. Apertures replicating the pattern of the alignment mark patterns 630 and openings replicating the pattern of the opening array pattern 640 are formed through the blanket growth mask layer 906, thereby converting the blanket growth mask layer 906 into a patterned growth mask layer 906'. In one embodiment, each opening through the patterned growth mask layer 906' can have a maximum lateral dimension in a range from 50 nm to 500 nm.

Referring to FIG. 17F, the NIL resist layer 917 can be removed, for example, by ashing.

Figure 17G:
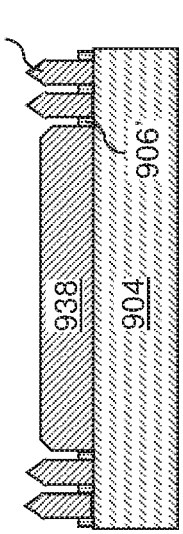

Referring to FIGS. 17G and 17H, the processing steps of FIG. 8 can be performed to grow semiconductor nanostructures through the openings in the patterned growth mask layer 906', and semiconductor alignment structures 938 in the apertures in the patterned growth mask layer 906'. The semiconductor nanostructures can be nanowire cores 948 as in the first and second embodiments described above, or can be nanopyramids or other nanoscale semiconductor material portions described in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S.

Pat. No. 8,309,439 to Seifert et al., which is assigned to QuNano AB, all of which are incorporated herein by reference in their entirety.

In one embodiment, each of the alignment mark regions in the first exemplary stamp 700 includes a mesa pattern having a lateral dimension that is at least 6 times a maximum lateral dimension of each protrusion within the array of protrusions in the first exemplary stamp 700. In one embodiment, the mesa pattern can have a cross pattern. In this case, each of the semiconductor alignment structures 938 can have a cross pattern that replicates a respective cross pattern in the first exemplary stamp 700. The pattern of the array of nanowire cores 948 can be the same as in the first and second embodiments. In subsequent processing steps to be described below, a photoresist layer can be applied and lithographically patterned employing the semiconductor alignment structures 938 as references for alignment a lithographic pattern.

Figures 18A, 18B:
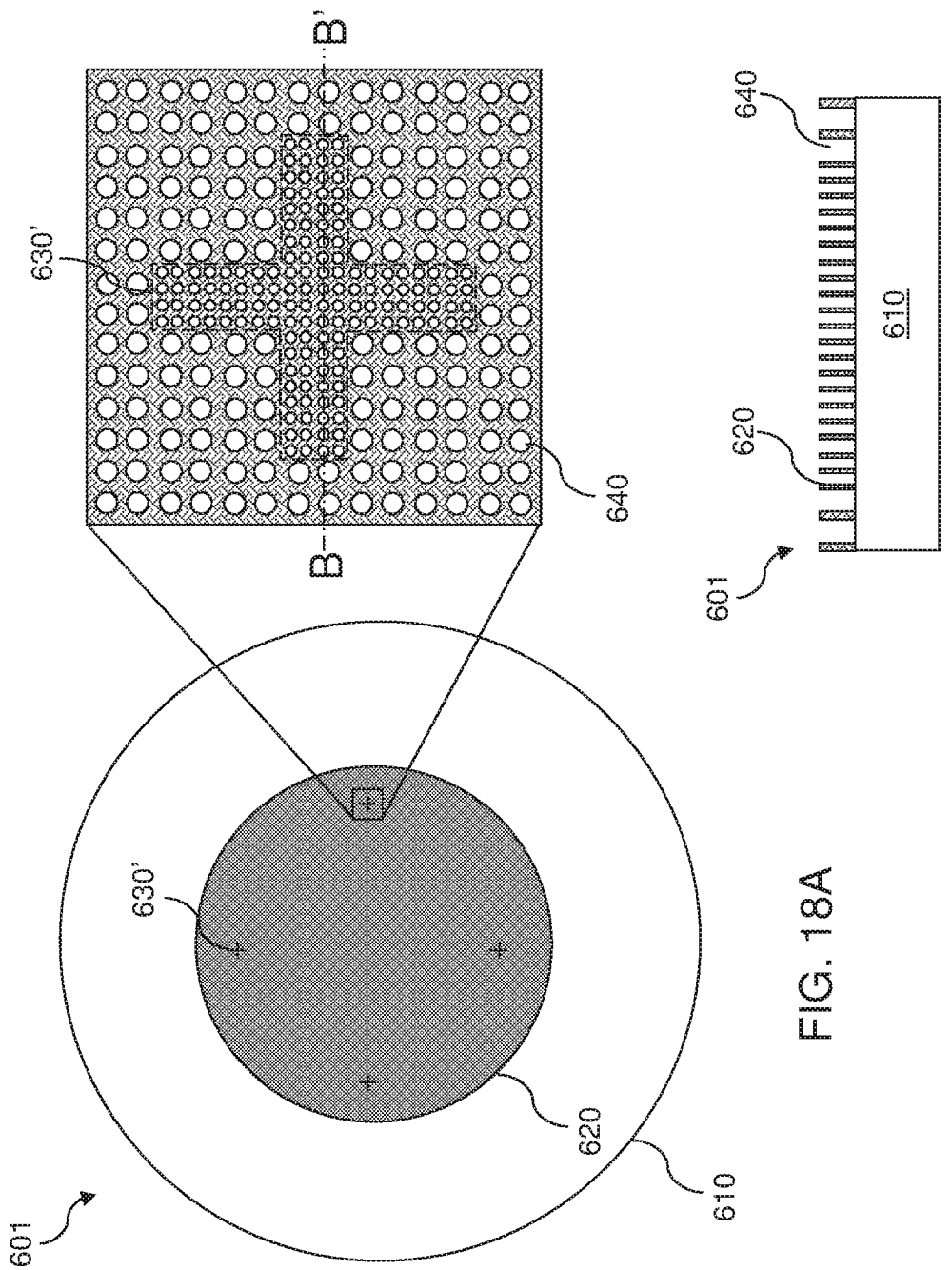
FIG. 18A is a top-down view of a second exemplary master pattern plate for forming a second nanoimprint lithography stamp according to a fourth embodiment of the present disclosure. An inset shows a magnified view of a region of the second nanoimprint lithography stamp.
FIG. 18B is a vertical cross-sectional view of a portion of the second exemplary master pattern plate along the plane B-B'.

Referring to FIGS. 18A and 18B, a second exemplary master pattern plate 601 for forming a second nanoimprint lithography stamp is shown according to a fourth embodiment of the present disclosure. The second exemplary master pattern plate 601 includes a master substrate 610 and a master pattern layer 620 that includes a matrix of a patterned solid material, which can be a metal or a hard dielectric material such as silicon oxide, silicon nitride, or a dielectric metal oxide. The thickness of the master pattern layer 620 can be the depth of the pattern to be formed in the second nanoimprint lithography stamp, and may be in a range from 50 nm to 500 nm.

The master pattern layer 620 includes alignment mark patterns 630' that comprise a pattern of a plurality of apertures through the patterned solid material. In an illustrative example, the alignment mark patterns 630' can have a shape of a periodic array of openings filling the entire area of a respective one of the alignment mark patterns 630'. The master pattern layer 620 further includes an opening array pattern 640, which includes an array of openings through the matrix of the patterned solid material. In one embodiment, the opening array pattern 640 can include a complementary area of the areas of the alignment mark patterns 630', i.e., the entire area defined by the outer periphery of the master pattern layer 620 other than the areas of the alignment mark patterns 630'. The opening array pattern 640 includes an array of discrete openings in the master pattern layer 620. Each of the discrete openings may have a circular horizontal cross-sectional shape, a polygonal horizontal cross-sectional shape (e.g., hexagonal shape), or an elliptical horizontal cross-sectional shape. The opening array pattern 640 can be periodic in two directions with a respective pitch. Each pitch can be in a range from 2 to 10 times the maximum lateral dimension of an opening within the opening array pattern 640.

In one embodiment, each of the alignment mark patterns 630' includes an array of apertures that differ from the opening array pattern 640 by at least one of a nearest neighbor pitch, a maximum lateral dimension of each opening, and a shape of each opening.

Figure 19A:
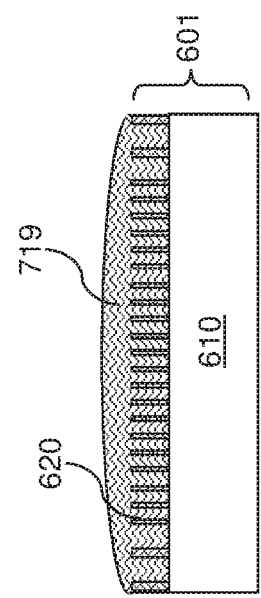
FIGS. 19A and 19B are vertical cross-sectional views that illustrate a manufacture process for the second exemplary stamp according to the fourth embodiment of the present disclosure.

Referring to FIG. 19A, a viscous stamp material portion 719 can be applied over the pattern side of the second exemplary master pattern plate 601. The viscous stamp material portion 719 can be any material known in the art that can be hardened, for example by curing, into a rigid material.

Figure 19B:
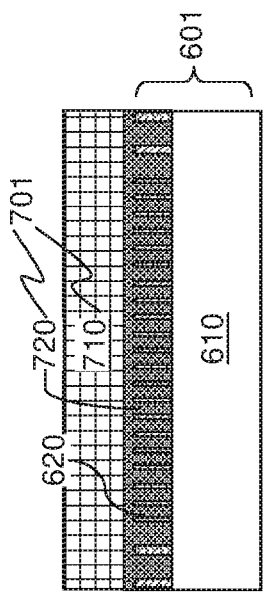

Referring to FIG. 19B, a stamp substrate 710 is attached to a top surface of the viscous stamp material portion 719. The viscous stamp material portion 719 is subsequently cured into a stamp pattern layer 720 that includes a hardened stamp material that replicates the pattern of the master pattern layer 620 as a negative. In other words, the stamp pattern layer 720 includes the complementary pattern of the pattern in the master pattern layer 620. Subsequently, the combination of the stamp substrate 710 and the stamp pattern layer 720 is lifted off the second exemplary master pattern plate 600 to provide a second exemplary stamp 701.

The second exemplary stamp 701 is a nano-imprint lithography stamp including a device region and alignment mark regions that are surrounded by the device region. The device region includes a pattern of an array of protrusions, and each of the alignment mark regions includes a pattern that is different from the pattern of the array of protrusions. In one embodiment, each of the alignment mark regions includes a protrusion array pattern including another array of protrusions that differ from the array of protrusions in the device region by at least one of a nearest neighbor pitch, a maximum lateral dimension of each protrusion, and a shape of each protrusion. The protrusion array pattern in each alignment mark region can have protrusions that are greater or lesser in the maximum lateral dimension than the protrusions within the array of protrusions in the device region. The protrusion array pattern in each alignment mark region can have protrusions that are greater or lesser in the nearest neighbor pitch than the protrusions within the array of protrusions in the device region. The protrusion array pattern in each alignment mark region can have protrusions that are different in cross sectional shape, for example, circular versus elliptical or circular versus polygonal, than the protrusions within the array of protrusions in the device region. Additionally, the protrusion array pattern in each alignment mark region can have a different array pattern, for example, a rectangular array versus a hexagonal array pattern, than the array of protrusions in the device region.

Figure 19C:
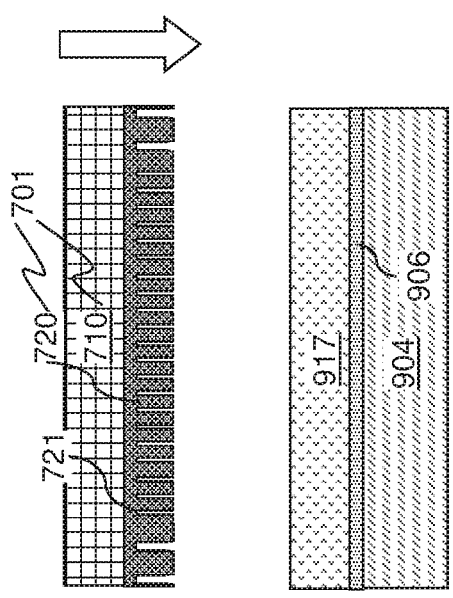

Referring to FIG. 19C, a fourth exemplary structure according to the fourth embodiment of the present disclosure is illustrated, which includes a stack, from bottom to top, of a semiconductor material layer 904, a blanket growth mask layer 906, and a nano-imprint lithography (NIL) resist layer 917. Each of the semiconductor material layer 904, the blanket growth mask layer 906, and the NIL resist layer 917 can be the same as in the first or second exemplary structure described above. A substrate such as the substrate 902 of the first or second exemplary structure may be provided underneath the semiconductor material layer 904. The second exemplary stamp 701 is placed in a position such that the stamp pattern layer 720 faces the NIL resist layer 917.

Figure 19D:
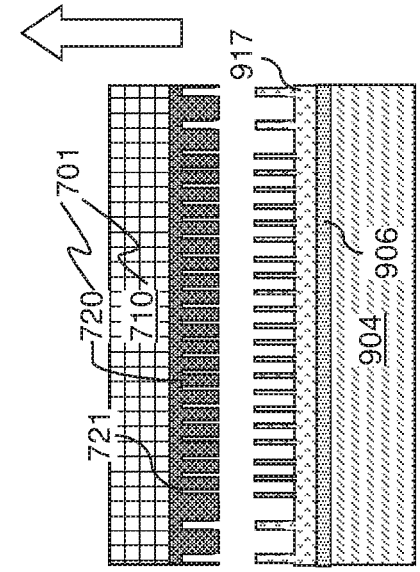

Referring to FIG. 19D, the NIL resist layer 917 is stamped with the second exemplary stamp 701 as in the first or second embodiments. The pattern of the master pattern layer 620 is replicated in the NIL resist layer 917. As in the first and second embodiments, the NIL resist layer 917 can comprise a thermosetting polymer or a UV curable polymer, and the NIL resist layer 917 may be cured after stamping with the nano-imprint lithography stamp. In one embodiment, each recess within the pattern of recesses that are formed on the upper surface of the NIL resist layer can have an aspect ratio of at least 3.

Referring to FIG. 19E, an etch process, such as an anisotropic etch process, can be performed to etch through unmasked areas of the blanket growth mask layer 906. Apertures replicating the pattern of the alignment mark patterns 630 and openings replicating the pattern of the opening array pattern 640 are formed through the blanket growth mask layer 906, thereby converting the blanket growth mask layer 906 into a patterned growth mask layer 906'. In one embodiment, each opening through the patterned growth mask layer 906' can have a maximum lateral dimension in a range from 50 nm to 500 nm.

Referring to FIG. 19F, the NIL resist layer 917 can be removed, for example, by ashing.

Referring to FIGS. 19G and 19H, the processing steps of FIG. 8 can be performed to grow semiconductor nanostructures through the openings in the patterned growth mask layer 906', and semiconductor alignment structures 928 in the apertures in the patterned growth mask layer 906'. The semiconductor nanostructures can be nanowire cores 948 as in the first and second embodiments described above, or can be nanopyramids or other nanoscale semiconductor material portions described in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al.

In one embodiment, the semiconductor alignment structures 928 include an array of semiconductor nanowires that differ from the array of nanowire cores 948 by at least one of a nearest neighbor pitch, a maximum lateral dimension of each protrusion, and a shape of each protrusion. The pattern of the array of nanowire cores 948 can be the same as in the first and second embodiments. In subsequent processing steps to be described below, a photoresist layer can be applied and lithographically patterned employing the semiconductor alignment structures 928 as references for alignment a lithographic pattern.

In the third and fourth embodiments of the present disclosure, the semiconductor alignment structures (928, 938) include the same semiconductor material (e.g., a III-nitride material, such as gallium nitride) as the semiconductor nanostructures 948. The semiconductor alignment structures (928, 938) can be grown the same semiconductor epitaxial (e.g., single crystal) growth step as the semiconductor nanostructures 948 through respective openings in the patterned growth mask layer 906', which can be an aluminum oxide or silicon nitride layer. In subsequent processing steps to be described below, a photoresist layer can be applied and lithographically patterned employing the semiconductor alignment structures (928, 938) as references for alignment a lithographic pattern In one embodiment, the semiconductor alignment structures 928 include an array of semiconductor nanowires that differ from the array of the semiconductor nanostructures (e.g., nanowire cores) 948 by at least one of a nearest neighbor pitch, a maximum lateral dimension of each protrusion, and a shape of each protrusion. In another embodiment, the semiconductor alignment structures 938 include mesa patterns having a lateral dimension that is at least 6 times a maximum lateral dimension of each semiconductor nanostructures (e.g., nanowire cores) 948. In one embodiment, the mesa pattern can have a cross pattern.

In the third and fourth embodiments described above, the openings in the patterned growth mask layer 906' are formed by nanoimprint lithography (NIL). However, in alternative methods of the third and fourth embodiments, the openings in the patterned growth mask layer 906' can be formed using any other suitable method, such as by photolithography instead of by NIL.

Figures 20A, 20B:
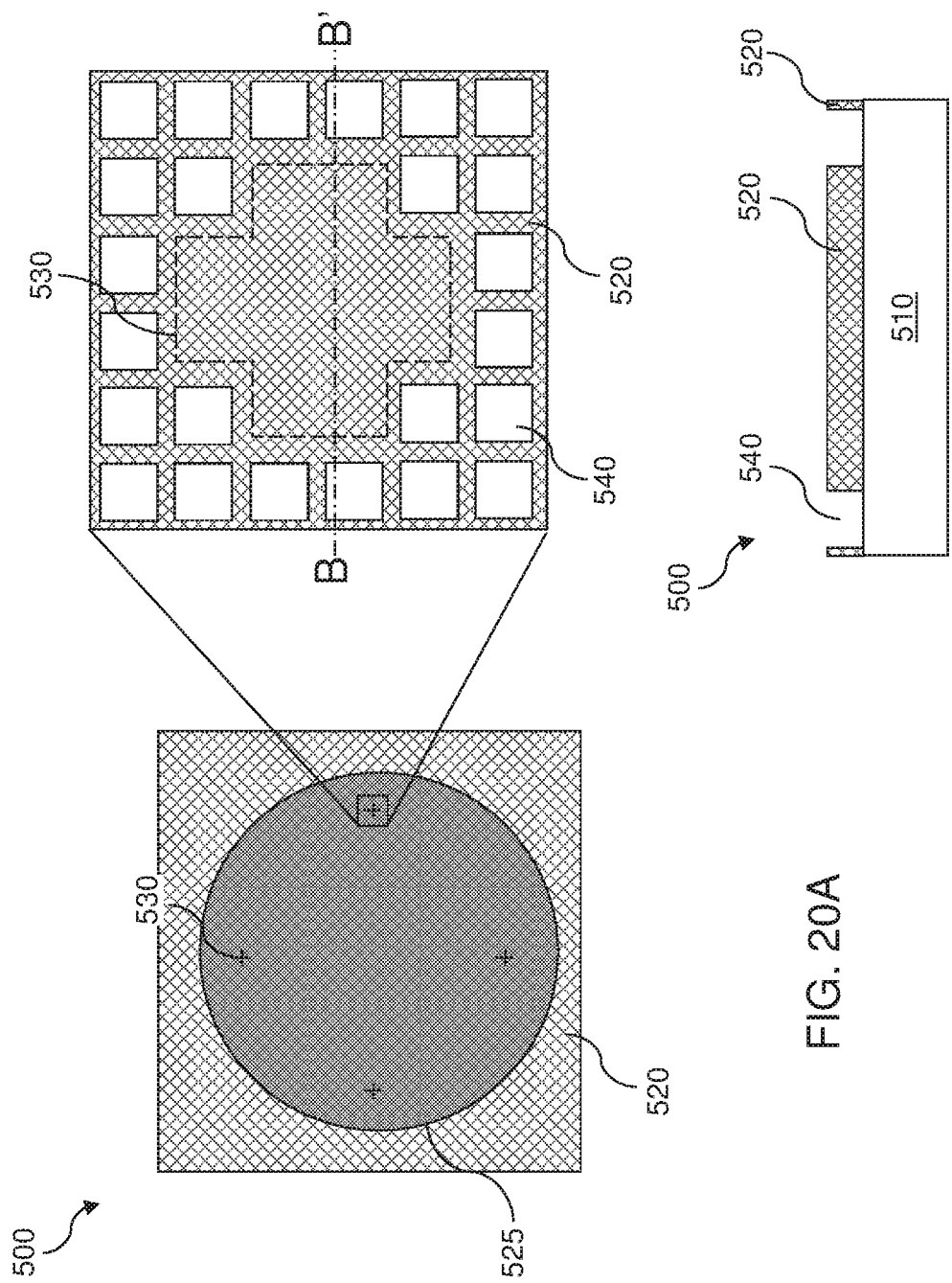
FIG. 20A is a top-down view of a first exemplary lithographic mask for patterning a photolithographic material layer according to a fifth embodiment of the present disclosure. An inset shows a magnified view of a region of the first exemplary lithographic mask.
FIG. 20B is a vertical cross-sectional view of a portion of the first exemplary lithographic mask along the plane B-B'.

Referring to FIGS. 20A and 20B, a first exemplary lithographic mask 500 for patterning a photolithographic material layer is illustrated according to a fifth embodiment of the present disclosure. The first exemplary lithographic mask 500 includes a transparent substrate 510 and an opaque patterned material layer 520 thereupon. The opaque patterned material layer 520 includes a material that is optically opaque at the wavelength to be employed for illumination during a subsequent lithographic exposure process. For example, the opaque patterned material may be opaque at an ultraviolet wavelength to be employed for illumination in the subsequent lithographic exposure process.

The opaque patterned material layer 520 includes alignment mark patterns 530. In case a positive photoresist is subsequently employed, each of the alignment mark patterns 530 can be embodied as a continuous patterned portion of the material of the opaque patterned material layer 520 that is laterally surrounded by an array of apertures 540 through the opaque patterned material layer 520. The region of the apertures 540 through opaque patterned material layer 520 can include a device region. In one embodiment, the size of the apertures 540 can be the same as the size of the openings in a patterned hard mask layer 908 described above. The apertures 540 can be formed as a two-dimensional array, such as a rectangular array or a hexagonal array. In case a negative photoresist is subsequently employed, the pattern of the opaque material layer 520 can be the complement of the pattern illustrated in FIGS. 20A and 20B.

Referring to FIG. 21A, a fifth exemplary structure according to the fifth embodiment of the present disclosure is illustrated, which includes a stack, from bottom to top, of a semiconductor material layer 904, a blanket growth mask layer 906, and a photoresist layer 517. The photoresist layer 517 can include the same material as the photoresist material portion 903 described above. The first exemplary lithographic mask 500 can be disposed over the photoresist layer 517, and the photoresist layer 517 can be lithographically illuminated to lithographically expose unmasked portions of the photoresist layer 517.

Referring to FIGS. 21B and 21C, the photoresist layer 517 can be developed to form patterned portions of the photoresist layer 517. Alignment mark regions 503 can be defined by the absence of patterned portions of the photoresist layer 517 after development of the photoresist layer 517. In one embodiment, remaining patterned portions of the photoresist layer 517 can be arranged as discrete photoresist material portions. In one embodiment, the remaining portions of the photoresist layer 517 can have the same pattern as the photoresist material portions 903 described above. In one embodiment, the remaining portions of the photoresist layer 517 can include a two-dimensional array of photoresist material portion.

Figure 21D:
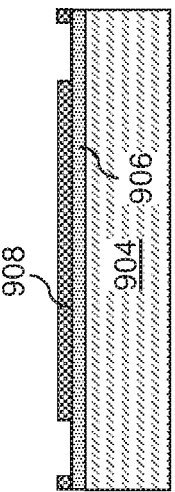

Referring to FIG. 21D, the processing steps of FIG. 2 can be performed to form a patterned hard mask layer 908. The photoresist layer 517 can function as the photoresist material portions 903 illustrated in FIGS. 1A and 1B. Hard mask material portions 908' can be collaterally formed above the portions of the photoresist layer 517.

Figure 21E:

Referring to FIG. 21E, the photoresist layer 517 and the hard mask material portions 908' thereupon can be lifted off. The patterned hard mask layer 908 can include a plurality of aperture regions, i.e., regions that include a respective aperture. In one embodiment, the plurality of aperture regions can be arranged as a two-dimensional periodic array of aperture regions.

Figure 21F:
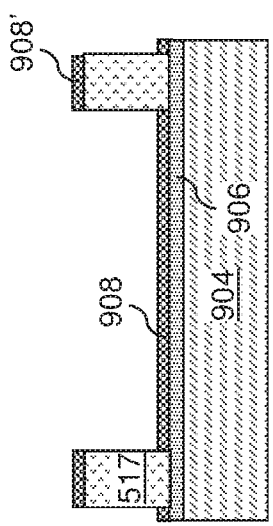

Referring to FIG. 21F, the processing steps of FIG. 3 can be performed to apply and pattern a nano-imprint lithography (NIL) resist layer 917 employing a nano-imprint lithography (NIL) stamp 120. In one embodiment, an array of vertical protrusions 121 can extend over the entire area of the NIL stamp 120. In one embodiment, the array of vertical protrusions 121 continuously extends over the alignment mark regions and over the aperture region during stamping with the nano-imprint lithography stamp.

Figure 21G:
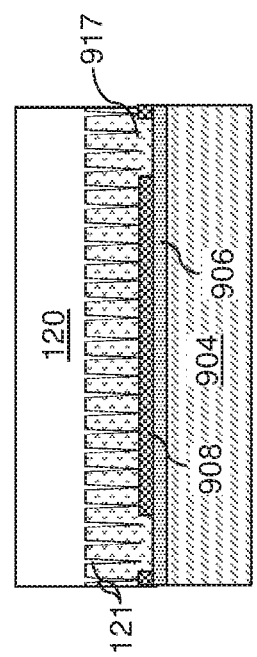

Referring to FIG. 21G, the processing steps of FIG. 5 and FIGS. 6A and 6B can be performed to form openings 931 in the blanket growth mask layer 906, thereby converting the blanket growth mask layer 906 into a patterned growth mask layer 906'. The patterned hard mask layer 908 prevents transfer of the pattern in the NIL resist layer 917 therethrough during transfer of the pattern in the NIL resist layer 917 through the portions of the blanket growth mask layer 906 that are not covered by the patterned hard mask layer 908. The patterned growth mask layer 906' includes openings 931 in the aperture regions (i.e., regions of apertures (e.g., openings 929) through the patterned hard mask layer 908), and does not include any opening in the alignment mark regions. As in the first and second embodiments, transfer of the pattern in the NIL resist layer 917 through the portions of the blanket growth mask layer 906 not covered by the patterned hard mask layer 908 can be performed employing an anisotropic etch process that etches the material of the blanket growth mask layer 906 selective to the material of the patterned hard mask layer 908.

Figure 21I:
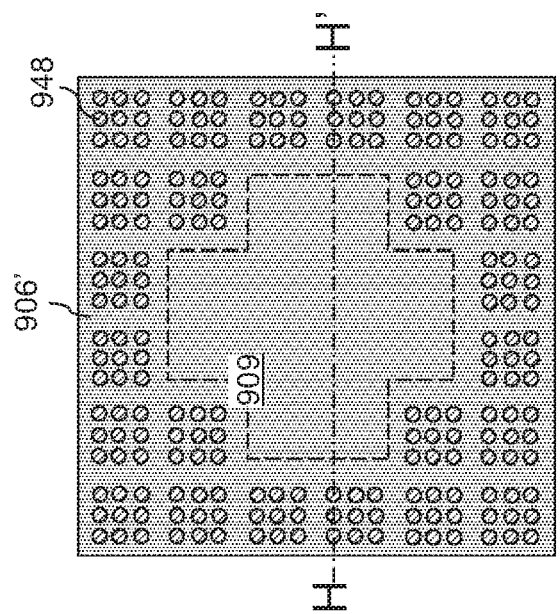
FIG. 21I is a top-down view of the fourth exemplary structure of FIG. 21H. The vertical plane H-H' in FIG. 21I is the plane of the vertical cross-sectional view of FIG. 21H.
Figure 21H:
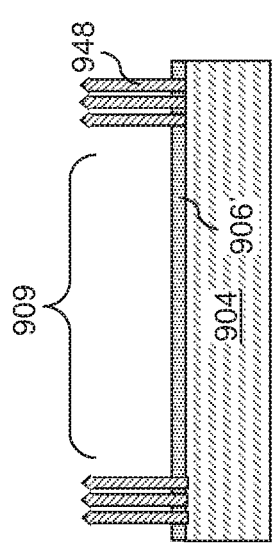

Referring to FIGS. 21H and 21I, the processing steps of FIG. 7 may be optionally formed to remove the patterned hard mask layer 908. The processing steps of FIG. 8 can be performed to grow semiconductor nanostructures through the openings in the patterned growth mask layer 906'. The semiconductor nanostructures can be nanowire cores 948 as in the first and second embodiments described above, or can be nanopyramids or other nanoscale semiconductor nanostructures described in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al.

In one embodiment, the aperture region can comprise a plurality of apertures that are arranged as a two-dimensional array, and can be located around each of the alignment mark regions. The pattern of the array of nanowire cores 948 can be the same as in the first and second embodiments. In subsequent processing steps to be described below, a photoresist layer can be applied and lithographically patterned employing the portions of the patterned growth mask layer 906 in the alignment mark regions (which do not include any openings therethrough) as references for alignment of a lithographic pattern. In this embodiment, the resulting alignment structures (e.g., alignment marks) 909 are located at the same vertical level as the growth mask layer. Therefore, the alignment structures 909 do not require a raised structure which extends above the growth mask layer and thus do not interfere with subsequent material growth or deposition.

Referring to FIGS. 22A and 22B, a second exemplary lithographic mask 501 for patterning a photolithographic material layer is illustrated according to a sixth embodiment of the present disclosure. The second exemplary lithographic mask 501 includes a transparent substrate 510 and an opaque patterned material layer 520 thereupon. The opaque patterned material layer 520 includes a material (such as a metal, e.g., molybdenum) that is optically opaque at the wavelength to be employed for illumination during a subsequent lithographic exposure process. For example, the opaque patterned material may be opaque at an ultraviolet wavelength to be employed for illumination in the subsequent lithographic exposure process.

The opaque patterned material layer 520 includes alignment mark patterns 531. In case a positive photoresist is subsequently employed, each of the alignment mark patterns 531 can be embodied as a continuous patterned portion of the material of the opaque patterned material layer 520 that is laterally surrounded by a continuously extending aperture through the opaque patterned material layer 520. In other words, the alignment mark patterns 531 can be formed as discrete portions of the opaque patterned material layer 510. The region of the continuously extending aperture is an aperture region (which is also a continuously extending device region), which is the complement of the areas of the alignment mark patterns 531. In case a negative photoresist is subsequently employed, the pattern of the opaque material layer 520 can be the complement of the pattern illustrated in FIGS. 22A and 22B.

Figure 23A:
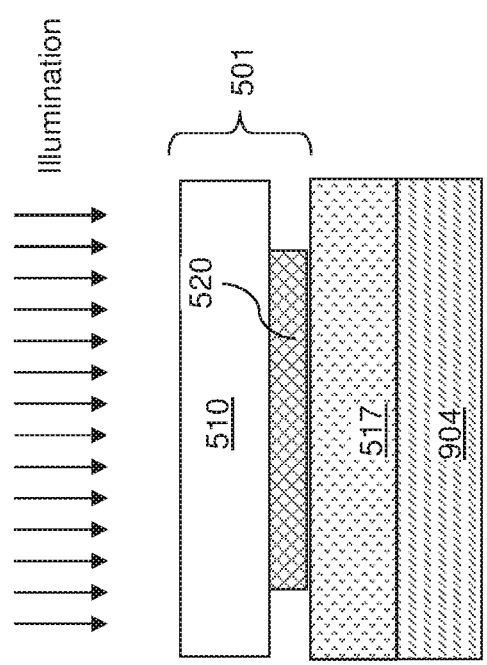

Referring to FIG. 23A, a sixth exemplary structure according to the sixth embodiment of the present disclosure is illustrated, which includes a stack, from bottom to top, of a semiconductor material layer 904 and a photoresist layer 517. The photoresist layer 517 can include the same material as the photoresist material portion 903 described above. The second exemplary lithographic mask 501 can be disposed over the photoresist layer 517, and the photoresist layer 517 can be lithographically illuminated to lithographically expose unmasked portions of the photoresist layer 517.

Figure 23B:
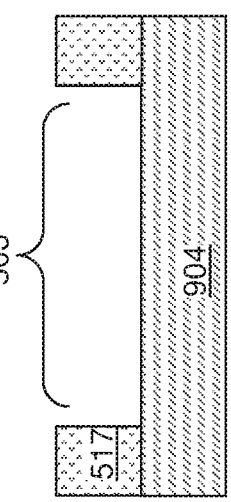
Figure 23C:
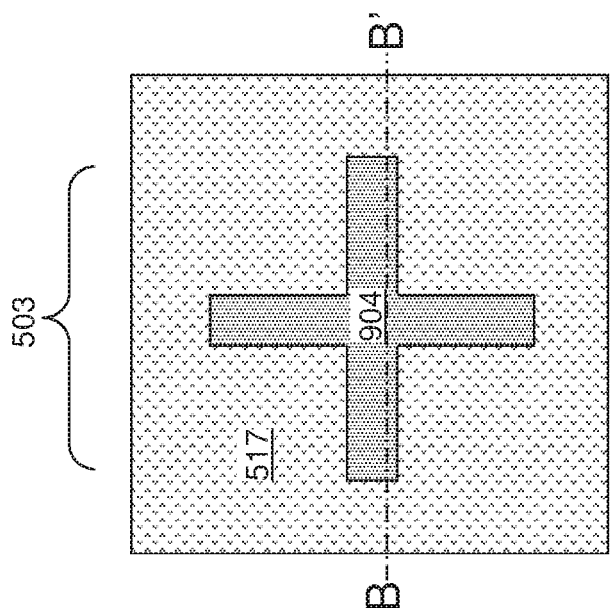
FIG. 23C is a top-down view of the fourth exemplary structure of FIG. 23B. The vertical plane B-B' in FIG. 21C is the plane of the vertical cross-sectional view of FIG. 21B.

Referring to FIGS. 23B and 23C, the photoresist layer 517 can be developed to form patterned portions of the photoresist layer 517. Alignment mark regions 503 can be defined by the absence of patterned portions of the photoresist layer 517 after development of the photoresist layer 517. In one embodiment, remaining patterned portions of the photoresist layer 517 can be a continuous photoresist material portion that laterally surrounds each of the alignment mark regions 503.

Referring to FIG. 23D, the processing steps of FIG. 2 can be performed to form a patterned hard mask layer 908 (e.g., a metal layer, such as a molybdenum layer) on the semiconductor material layer 904. The photoresist layer 517 can function as the photoresist material portions 903 illustrated in FIGS. 1A and 1B. Hard mask material portions 908' can be collaterally formed above the portions of the photoresist layer 517.

Referring to FIG. 23E, the photoresist layer 517 and the hard mask material portions 908' thereupon can be lifted off. The patterned hard mask layer 908 can include a continuously extending aperture region that laterally surrounds each discrete portion of the patterned hard mask layer 908, which is located within a respective alignment mark region. In one embodiment, the aperture region includes a continuous aperture in the patterned hard mask layer 908 that has an area of a complement of areas of the alignment mark regions. In one embodiment, the patterned hard mask layer 908 may be present only within the alignment mark regions. A continuous blanket growth mask layer 906 is then deposited over and around the patterned hard mask layer 908. The blanket growth mask layer 906 may be any suitable dielectric material, such as silicon nitride or aluminum oxide.

Referring to FIGS. 23F and 23G, a nano-imprint lithography (NIL) resist layer 917 is formed over the patterned hard mask layer 908 and the blanket growth mask layer 906. A nano-imprint lithography (NIL) stamp 120 is disposed over the blanket growth mask layer 906. In one embodiment, an array of vertical protrusions 121 can extend over the entire area of the NIL stamp 120. In one embodiment, the array of vertical protrusions 121 continuously extends over the alignment mark regions and over the aperture region during stamping with the nano-imprint lithography stamp.

Alternatively, the nano-imprint lithography stamp can include mesa patterns 123 having a lateral dimension that is greater than the maximum lateral dimension of each protrusion within the array of protrusions of the nano-imprint lithography stamp as illustrated in FIGS. 23F and 23G. In one embodiment, each of the alignment mark regions can include a mesa pattern 123 having a lateral dimension that is at least 6 times a maximum lateral dimension of each protrusion within the array of protrusions. In one embodiment, the mesa pattern has a cross pattern.

Figure 23H:
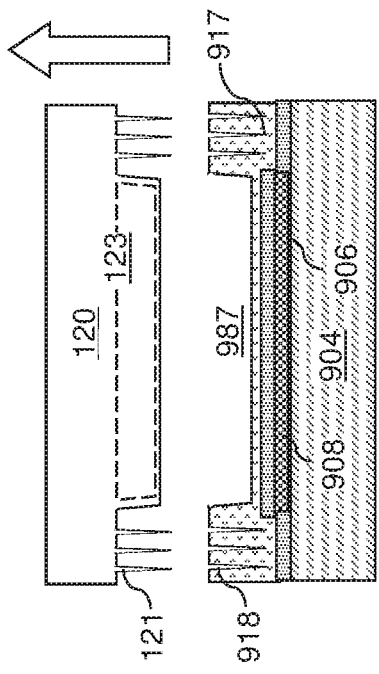

Referring to FIG. 23H, the processing steps of FIG. 3 can be performed to pattern the NIL resist layer 917 employing the NIL stamp 120.

Figure 23I:
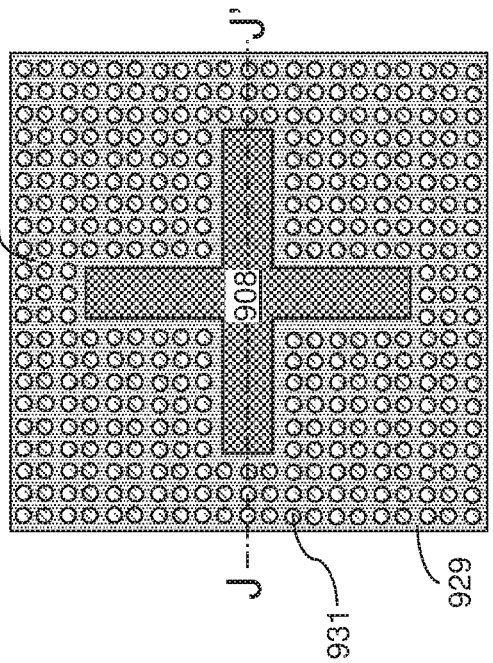

Referring to FIG. 23I, the processing steps of FIGS. 4A and 4B can be performed to separate the NIL stamp 120 from the NIL resist layer 917.

Figure 23J:
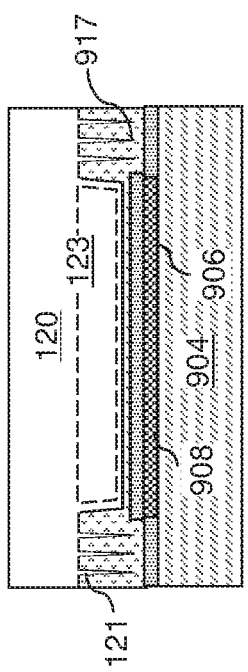
Figure 23K:
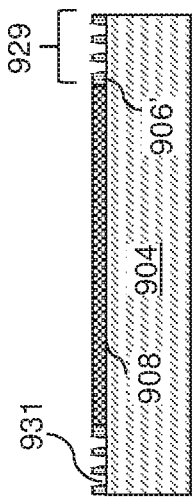
FIG. 23K is a top-down view of the fourth exemplary structure of FIG. 23J. The vertical plane J-J' in FIG. 23K is the plane of the vertical cross-sectional view of FIG. 21J.

Referring to FIGS. 23J and 23K, the processing steps of FIG. 5 and FIGS. 6A and 6B can be performed to form openings 931 in the blanket growth mask layer 906, thereby converting the blanket growth mask layer 906 into a patterned growth mask layer 906'. The blanket growth mask layer 906 may be removed entirely from above the patterned hard mask layer 908 to expose the patterned hard mask layer 908, or a thinned portion of the patterned growth mask layer may remain over the patterned hard mask layer 908 depending on the duration of the etch. The patterned hard mask layer 908 prevents transfer of the pattern in the NIL resist layer 917 therethrough during transfer of the pattern in the NIL resist layer 917 through the portions of the blanket growth mask layer 906. The patterned growth mask layer 906' includes openings 931 in the continuous aperture region 929 (i.e., the entire region in which the patterned hard mask layer 908 is not present), and does not include any opening in the alignment mark regions (in which the patterned hard mask layer 908 is present). As in the first and second embodiments, transfer of the pattern in the NIL resist layer 917 through the portions of the blanket growth mask layer 906 not covered by the patterned hard mask layer 908 can be performed employing an anisotropic etch process that etches the material of the blanket growth mask layer 906 selective to the material of the patterned hard mask layer 908.

Figure 23M:
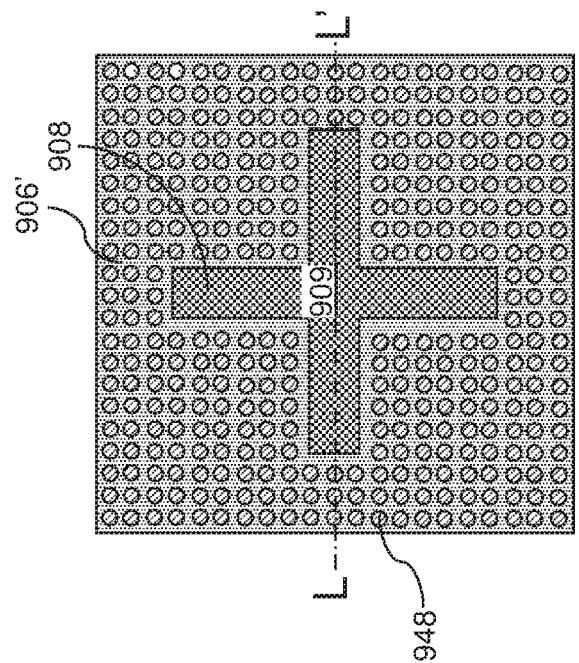
FIG. 23M is a top-down view of the fourth exemplary structure of FIG. 23L. The vertical plane L-L' in FIG. 23M is the plane of the vertical cross-sectional view of FIG. 21L.
Figure 23L:
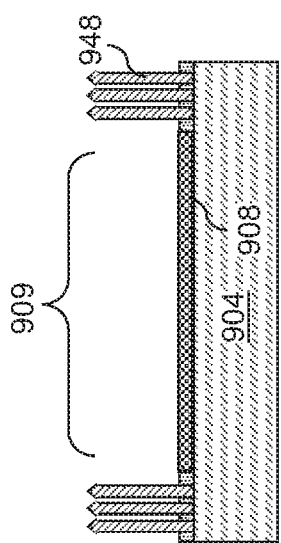

Referring to FIGS. 23L and 23M, the patterned hard mask layer 908 may be retained as part of or the entirety of the alignment structure 909. The processing steps of FIG. 8 can be performed to grow semiconductor nanostructures through the openings in the patterned growth mask layer 906'. The semiconductor nanostructures can be nanowire cores 948 as in the first and second embodiments described above, or can be nanopyramids or other nanoscale semiconductor nanostructures described in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al.

The pattern of the array of nanowire cores 948 can be the same as in the first and second embodiments. In subsequent processing steps to be described below, a photoresist layer can be applied and lithographically patterned employing the portions of the patterned growth mask layer 906 in the alignment mark regions (which do not include any openings therethrough) as references for alignment of a lithographic pattern.

Figure 24:
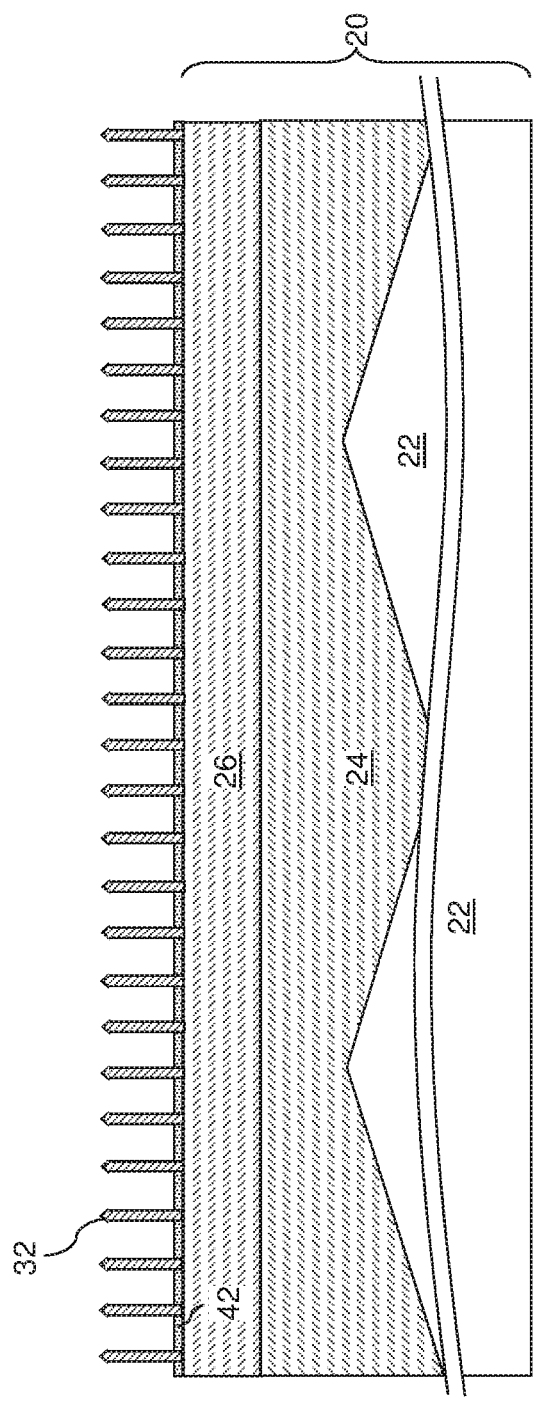
FIG. 24 is a vertical cross-sectional view of the exemplary structure after formation of nanowire cores according to an embodiment of the present disclosure.

Referring to FIG. 24, an exemplary structure is illustrated, which can be a portion of any of the first through sixth exemplary structures. The exemplary structure of FIG. 24 is an in-process structure, which can be employed to form monolithic multicolor pixels or single color subpixels on a substrate 20, which can be as an initial growth substrate. As used herein, an "in-process" structure refers to a structure that is subsequently modified to make a final structure.

The substrate 20 can include a stack, from bottom to top, of a support substrate 22, an optional buffer layer 24, and a doped compound semiconductor layer 26. The doped compound semiconductor layer 26 can be the same as the semiconductor material layer 904 described above. The optional buffer layer 24 and/or the support substrate 22 can be the same as the substrate 902 described above. In one embodiment, the support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the top surface of the single crystalline material layer is possible. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the top surface of the support substrate 22, the lateral dimensions of each bump or each dimple can be in a range from 1.5 micron to 6 microns although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material, for example a Group III-nitride compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the top surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the buffer layer 24 can include $Ga_{1-w-x}In_wAl_xN_{1-x-z}As_yP_z$ in which y and z between zero and less than one, that matches the lattice constant of the top surface of the support substrate 22. The materials that can be employed for an top portion of the buffer layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb).

The composition of the buffer layer 24 can gradually change between the bottom portion of the buffer layer 24 and the top portion of buffer layer 24 such that dislocations caused by a gradual lattice parameter change along the growth direction (vertical direction) does not propagate to the top surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the top surface of the buffer layer 24. Optionally, the top surface of the buffer layer 24 may be planarized to provide a planar top surface, for example, by chemical mechanical planarization. A suitable surface clean process can be performed after the planarization process to remove contaminants from the top surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the top surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed.

A patterned growth mask layer 42 is present on the top surface of the doped compound semiconductor layer 26. The patterned growth mask layer 42 can be the same as the patterned growth mask layer 906' described above. The maximum dimension of each opening (which may be a diameter, a major axis, or a diagonal dimension) may be in a range from 5 nm to 500 nm (such as from 10 nm to 250 nm), although lesser and greater dimensions may also be employed. The nearest neighbor distance within the periodic array of openings can be in a range from 100 nm to 10 microns, such as from 500 nm to 1 micron, although lesser and greater nearest neighbor distances can also be employed.

While only a region of the exemplary structure is illustrated herein, it is understood that the exemplary structure can laterally extend along two independent horizontal directions as a two-dimensional array. The exemplary pattern illustrated in FIG. 2A may be repeated across a region of the substrate 20, or across the entirety of the substrate 20. Thus, multiple instances of the illustrated structures in the drawings can be formed in the exemplary structure.

An array of nanowires cores 32 is grown through the openings in the patterned growth mask layer 42. The nanowire cores 32 can be the same as the nanowire cores 948 described above. Each nanowires core 32 includes a doped compound semiconductor material having a doping of the first conductivity type, i.e., the conductivity type of doping of the doped compound semiconductor layer 26. The material of the nanowires cores 32 may be the same as, or may be different from, the material of the doped compound semiconductor layer 26. In one embodiment, the first conductivity type can be n-type, and each nanowires core 32 includes an n-doped compound semiconductor material such as III-nitride compound semiconductor material, for example n-doped gallium nitride. Alternatively, any other suitable III-V or II-VI material may be used.

Each of the nanowire cores 32 can be formed with a set of substantially vertical sidewalls and a tip portion having angled facets, i.e., facets that are not horizontal and not vertical (i.e., not parallel or perpendicular to the top surface of the substrate 20). The nanowires cores 32 can be grown, for example, by selective epitaxial growth of an n-doped compound semiconductor material. The process parameters of the selective epitaxial growth process can be selected such that an n-doped compound semiconductor material grows upward with substantially vertical sidewalls having an m-plane outer surface and angled facets having a p-pane outer surface from each opening through the patterned growth mask layer 42. Methods for growing the nanowires cores 32 through the openings in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al. In one embodiment, the height of the nanowires cores 32 can be in a range from 200 nm to 5 microns, although lesser and greater heights can also be employed. In the above described embodiment, the nanowire core growth step occurs through an opening in a mask 42. However, any other suitable nanowire growth regime can be utilized, such as VLS growth using a catalyst particle or other selective growth methods. Thus, the selective nanowire growth is therefore used to merely exemplify rather than limit the invention.

Figure 25:
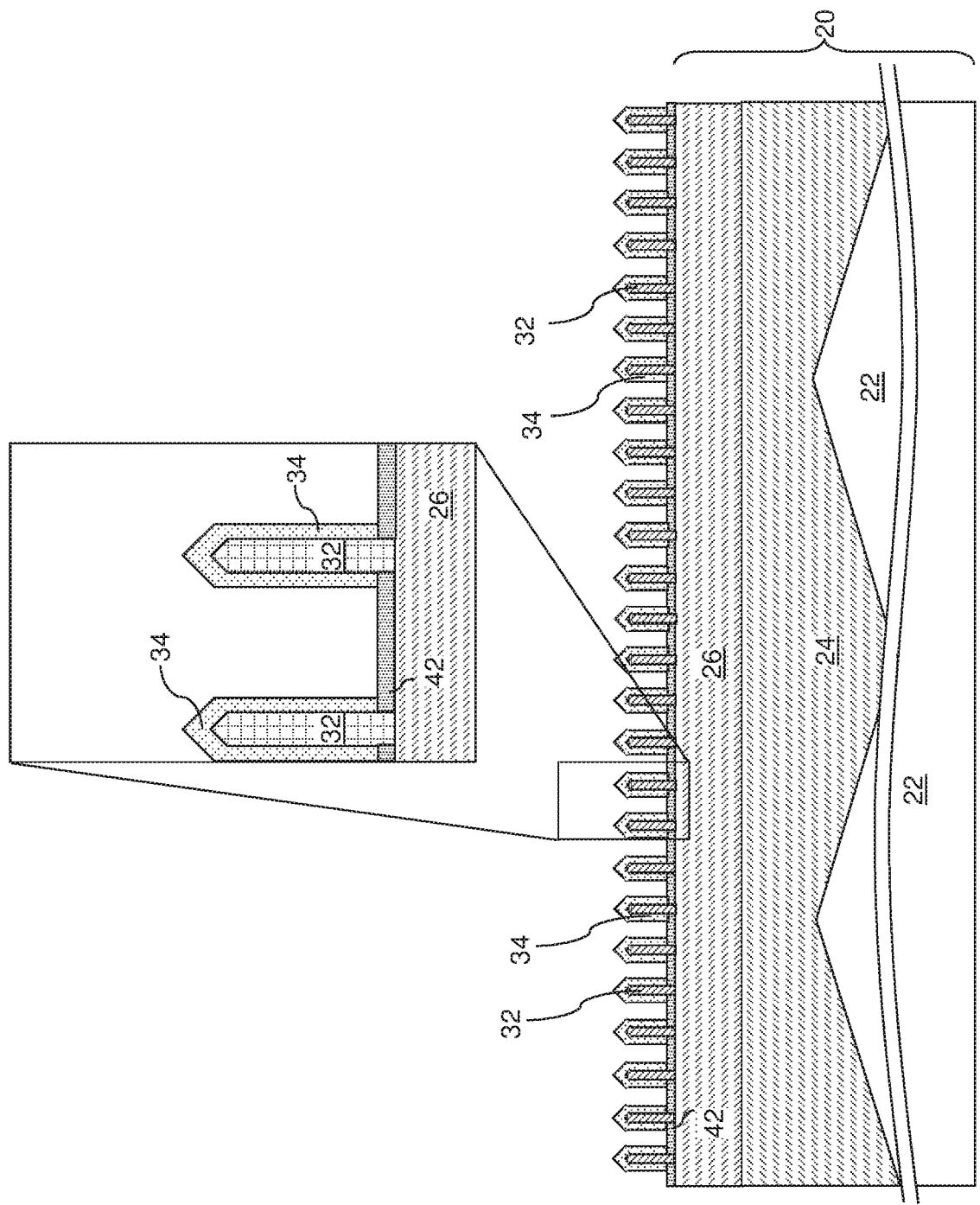
FIG. 25 is a vertical cross-sectional view of the exemplary structure after formation of active shells according to an embodiment of the present disclosure.

Referring to FIG. 25, an active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light.

A selective epitaxy process can be employed to grow the active shells 34. The process parameters of the selective epitaxy process can be selected such that the active shells 34 are grown as conformal structures having a same thickness throughout. In another embodiment, the active shells 34 can be grown as a pseudo-conformal structure in which the vertical portions have the same thickness throughout, and faceted portions over the tips of the nanowires cores 32 have thicknesses that differ from the thickness of the vertical portions. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In one embodiment, the outer surfaces of the active shells 34 can include vertical faceted surfaces (i.e., vertical sidewalls) that extend perpendicular to the top surface of the doped compound semiconductor layer 26, and tapered faceted surfaces (i.e., tapered sidewalls) located at a tip of each semiconductor nanowire (32, 34) within the array of semiconductor nanowires and adjoined to an upper edge of a respective one of the vertical faceted surfaces. In one embodiment, the vertical faceted surfaces of the active shells 34 can include crystallographic m-planes, and the tapered faceted surfaces of the active shells 34 can include crystallographic p-planes.

The thickness of the vertical portions of the active shells 34 can be selected such that the active shells 34 do not merge among one another. The thickness of the vertical portions of the active shells 34 (as measured horizontally along a radial direction) can be in a range from 100 nm to 1 micron, although lesser and greater thicknesses can also be employed. Each active shell 34 includes an active light emitting layer. The composition of the active shells 34 can be selected to emit light at a desired peak wavelength by changing the composition and strain of the active shells 34. The active shells 34 can have the same composition and emit light of the same peak wavelength. Alternatively, multiple regions can be provided, which have different shapes, sizes, and/or inter-opening spacing for the openings. In this case, the active shells 34 can with different compositions depending on the shapes, sizes, and/or inter-opening spacing for the openings within each of the multiple regions. The different compositions for the active shells 34 can be advantageously employed to fabricate multiple types of light emitting diodes, each emitting light at a respective peak emission wavelength.

Each set of a nanowires core 32 and an active shell 34 that contacts, surrounds, and overlies the nanowires core 32 constitutes a nanowire (32, 34). While nanowires are described as an embodiment of the nanostructure, other nanostructures, such as nanopyramids, can also be used. The nanowires (32, 34) can be formed as a two-dimensional array having periodicity along two independent directions. Each growth region for the nanowires (32, 34) includes at least one subpixel (10G, or) of the direct view display device. Each nanowire (32, 34) within the array extends vertically from the top surface of the doped compound semiconductor layer 26. Each nanowire (32, 34) within the array includes a nanowire core 32 having a doping of the first conductivity type and an active shell 34 including a preferably undoped or intrinsic active layer which emits light upon application of electrical bias therethrough.

Figure 26:
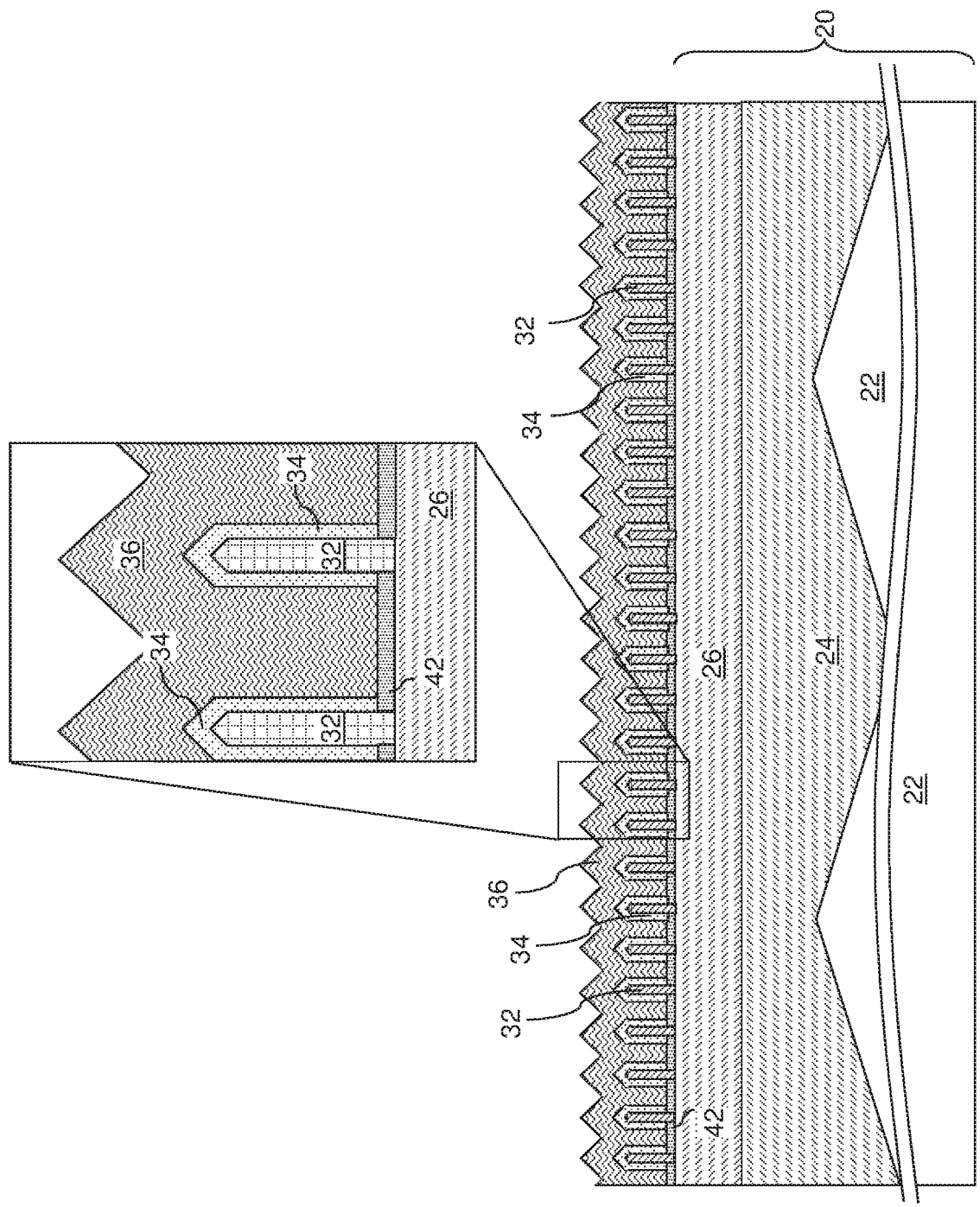
FIG. 26 is a vertical cross-sectional view of the exemplary structure after formation of a second conductivity type semiconductor material layer according to an embodiment of the present disclosure.

Referring to FIG. 26, a second conductivity type semiconductor material layer 36 is formed on the sidewalls and faceted outer surfaces of the nanowires (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The second conductivity type semiconductor material layer 36 can include a compound semiconductor material. The compound semiconductor material of the second conductivity type semiconductor material layer 36 can be any suitable semiconductor material, such as p-type III-nitride compound semiconductor material, e.g., gallium nitride and/or aluminum gallium nitride. In one embodiment, the nanowires cores 32 can include n-doped GaN, and the second conductivity type semiconductor material layer 36 can include p-doped InGaN or GaN.

The second conductivity type semiconductor material layer 36 can be formed by selective deposition of the doped semiconductor material on the outer surfaces of the active regions 34. For example, a selective epitaxy process can be employed.

During the selective deposition process (which can be a selective epitaxy process), discrete semiconductor material portions grow from the outer surfaces of each of the active regions until the discrete semiconductor material portions merge to form the second conductivity type semiconductor material layer 36 as a continuous semiconductor material layer. In other words, duration and deposition rate of the selective deposition process can be selected so that the volumes between neighboring pairs of nanowires (32, 34) are filled with merged vertical portions of the second conductivity type semiconductor material layer 36. For example, the control of when the second type conductivity type semiconductor material meets can be done by controlling the volume of the deposited material (e.g., deposition duration and deposition rate). The desired volume can be achieved by control of individual facet relative growth rates (process parameters such as temperature, pressure, input precursor gas ratios and/or composition of (Al,In,Ga)N material). Upon continued deposition of the doped semiconductor material on the active shells 34, the deposited semiconductor material portions coalesce to form the second conductivity type semiconductor material layer 36 as a continuous layer contacting each active shell 34 within the array of semiconductor nanowires (32, 34). Each contiguous cluster of nanowires (32, 34) and the second conductivity type semiconductor material layer 36 comprises at least one in-process subpixel (10G, or) of a direct view display device.

Prior to merging, each of the discrete portions of the deposited doped semiconductor material can grow with faceted surfaces, which can include vertical (e.g., m-plane) faceted surfaces that are parallel to the vertical faceted surfaces of the active region 34 on which a respective doped semiconductor material portion grows, and tapered (e.g., p-plane) faceted surfaces that are parallel to the tapered faceted surface of the active region 34 on which the respective doped semiconductor material portion grows.

The growth rate at various faceted surfaces may be different during the selective epitaxy process. For example, the growth rate from the m-planes prior to merging of the discrete portions of the deposited doped semiconductor material may be in a range of 3-15 times the growth rate from the p-planes prior to merging. Merging of the m-planes between neighboring pairs of deposited doped semiconductor material portions reduces the total area of remaining m-planes abruptly. Thus, the growth rate from the p-planes of the second conductivity type semiconductor material layer 36 (which is a continuous structure including the merged semiconductor material portions) may increase by a factor greater than 1, which can be in a range from 2 to 6 under typical growth conditions).

The second conductivity type semiconductor material layer 36 is deposited on vertical faceted surfaces of the active regions 34 that extend perpendicular to the top surface of the doped compound semiconductor layer 26, and on tapered faceted surfaces provided at a tip of each semiconductor nanowire (32, 34) within the cluster of semiconductor nanowires (32, 34) and adjoined to an upper edge of a respective one of the vertical faceted surfaces. In one embodiment, the second conductivity type semiconductor material layer 36 can include vertical seams at locations that are equidistant from outer sidewalls of a neighboring pair of active light emitting layers of the active shells 34. In some embodiments, the second conductivity type semiconductor material layer 36 can embed optional cavities between neighboring pairs of semiconductor nanowires (32, 34) among the array of semiconductor nanowires with a same cluster. Alternatively, the cavities may not be formed.

The selective deposition of the doped semiconductor material having a doping of the second conductivity type can continue until all vertical faceted surfaces of the second conductivity type semiconductor material layer 36 disappear, i.e., until p-plane faceted sidewalls of the second conductivity type semiconductor material layer 36 extend to the top surface of the growth mask layer 42 around a bottom periphery of the second conductivity type semiconductor material layer 36.

For example, the remaining vertical faceted surfaces of the second conductivity type semiconductor material layer 36 after formation of the vertical seams can include vertical faceted sidewalls that are adjoined among one another to form a continuous periphery that encircles a respective cluster of semiconductor nanowires (32, 34). In this case, the growth of the second conductivity type semiconductor material layer 36 perpendicular to the vertical faceted sidewalls proceeds at least at the growth rate of tapered faceted sidewalls of the second conductivity type semiconductor material layer 36 until the height of each vertical faceted sidewall shrinks to zero. In this case, the growth rate from the m-planes proceeds at least at the rate from the growth rate from p-planes, and typically at a higher growth rate than the growth rate from the p-planes, such as by at least 10%, such as by at least 50%, such as by a factor of 2 or more, until all the m-planes disappear with growth of the second conductivity type semiconductor material layer 36.

The second conductivity type semiconductor material layer 36 includes a horizontally extending portion that continuously extends horizontally and overlies the cluster of nanowires (32, 34) and vertical portions that are located between neighboring pairs of nanowires (32, 34). The horizontally extending portion of the second conductivity type semiconductor material layer 36 contacts faceted surfaces of the nanowires (32, 34) and has a resulting roughened or faceted surface. The horizontally extending portion of the second conductivity type semiconductor material layer 36 overlies the vertical portions of the second conductivity type semiconductor material layer 36. Each vertical portion of the second conductivity type semiconductor material layer 36 can contact a portion of the top surface of the patterned growth mask layer 42 and can be adjoined to the horizontally extending portion of the second conductivity type semiconductor material layer 36. The thickness of the horizontally extending portion of the second conductivity type semiconductor material layer 36 (as measured along the vertical direction) can be in a range from 50 nm to 2 microns, such as from 200 nm to 1 micron, although lesser and greater thicknesses can also be employed.

Each second conductivity type semiconductor material layer 36 over a cluster of semiconductor nanowires (32, 34) (which may be a two-dimensional periodic array of semiconductor nanowires (32, 34) within a corresponding area) contacts sidewalls of each semiconductor nanowire (32, 34) within the cluster. Faceted (e.g., tapered) sidewalls of the second conductivity type semiconductor material layer 36 adjoin a top surface of the growth mask layer 42 around a periphery of the second conductivity type semiconductor material layer 36. In one embodiment, the periphery of the second conductivity type semiconductor material layer 36 that adjoins the top surface of the growth mask layer 42 can have multiple linear segments, such as a set of six linear segments corresponding to six sides of a hexagon if the outer periphery of the cluster has a hexagonal shape in one embodiment. As used herein, a first element adjoins a second element if physical contact between the first and second elements is at least one-dimensional (i.e., includes a curve, a line, or a surface). Alternatively, the cluster can have a rectangular or circular shape. In one embodiment, the periphery is aligned to the underlying material crystal symmetry, such that the non-vertical p-plane facets are aligned at the periphery. This would produce a non-staggered outlined of the cluster, and may provide a tighter packing of the clusters (i.e., reduce the LED pitch). Each second conductivity type semiconductor material layer 36 can be a continuous material layer and contacting all outer surfaces of the active shells 34 of the array of semiconductor nanowires (32, 34) within a respective cluster of semiconductor nanowires (32, 34). In one embodiment, each of the faceted sidewalls of the second conductivity type semiconductor material layer 36 that adjoins the top surface of the growth mask layer 42 is at a same angle with respect the horizontal plane including the top surface of the growth mask layer 42. In one embodiment, the faceted sidewalls of the second conductivity type semiconductor material layer 36 include crystallographic p-planes, and the top surface of the growth mask layer 42 can be parallel to the crystallographic c-planes of the single crystalline structures in the exemplary structure. In one embodiment, each of the faceted sidewalls of the second conductivity type semiconductor material layer 36 extends within a respective two-dimensional plane from the top surface of the growth mask layer 42 to a location overlying a tip of a respective outermost semiconductor nanowire (32, 34) in each cluster.

Figure 27:
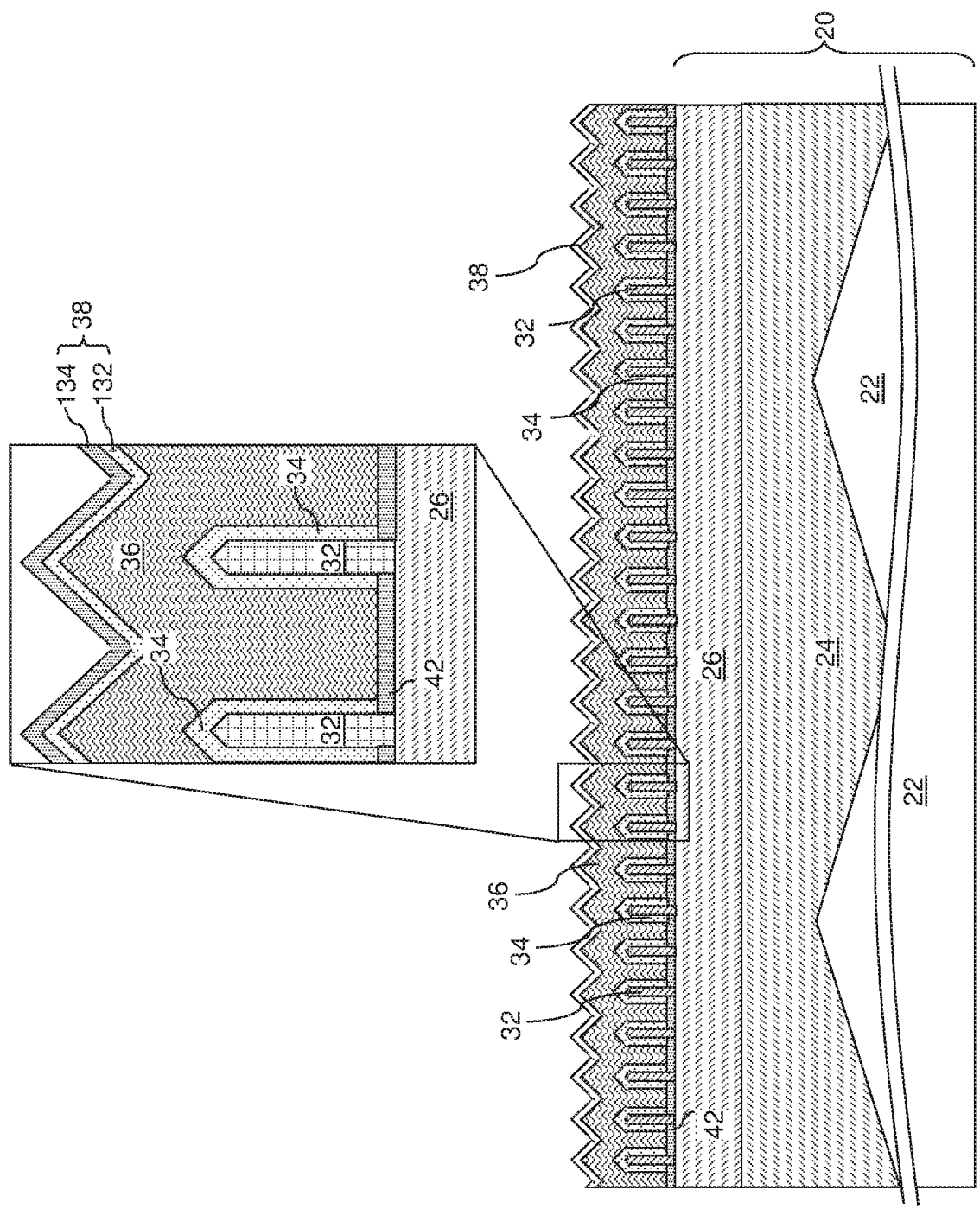
FIG. 27 is a vertical cross-sectional view of the exemplary structure after formation of a transparent conductive layer according to an embodiment of the present disclosure.

Referring to FIG. 27, a transparent conductive layer 38 including at least one transparent metal oxide material on the top surface of the second conductivity type semiconductor material layer 36. The transparent conductive layer 38 can include a stack of multiple transparent conductive layers, or can include a composite of a transition metal oxide and a noble metal. The thickness of the transparent conductive layer 38 can be selected to provide at least 70% transmission (and preferably more than 80% transmission) for the wavelength range of the underlying light emitting diodes.

In one embodiment, the transparent conductive layer 38 can include a stack of at least two transparent conductive layers (132, 134). For example, the transparent conductive layer 38 can include a first transparent conductive metal oxide layer 132 and a second transparent conductive metal layer 134. The stack of at least two transparent conductive layers (132, 134) can be formed, for example, by sequentially depositing a first metal layer including a first elemental metal in vacuum and a second metal layer including a second metal in vacuum without breaking vacuum between beginning of deposition for the first metal and the end of deposition for the second metal. Each of the first transparent conductive metal oxide layer 132 and the second transparent conductive metal layer 134 can be formed as a continuous conformal material layer that extends across the entire area of the second conductivity type semiconductor material layer 36 and having a uniform thickness throughout.

In one embodiment, the first metal can include a transition metal that forms a first transparent conductive metal oxide upon oxidation. For example, the first metal can be a transition metal, such as nickel, and the thickness of the first metal as deposited can be in a range from 1 nm to 10 nm, such as from 2 nm to 5 nm. The second metal can be a noble metal, such as gold, and the thickness of the second metal as deposited can be in a range from 1 nm to 10 nm, such as from 2 nm to 5 nm. The first metal and the second metal can be sequentially deposited in a same vacuum chamber, for example, employing two separate vacuum evaporation sources, such as electron beam evaporation sources. Subsequently, the exemplary structure can be annealed in an oxidizing ambient at an elevated temperature to convert the first metal layer into the first transparent conductive metal oxide layer 132. The oxidizing ambient can include oxygen, air and/or water vapor. In one embodiment, only water vapor can be used as the sole oxidizing ambient. The elevated temperature of the oxidation process can be in a range from 500 degrees Celsius to 850 degrees Celsius, preferably from 550 degrees Celsius to 650 degrees, Celsius although lower and higher temperatures can also be employed. The duration of the oxidation step at the elevated temperature may be in a range from 5 minutes to 200 minutes, such as from 10 minutes to 60 minutes, although shorter and longer oxidation time can also be employed.

In one embodiment, the transparent conductive layer 38 can include a stack of at least two transparent conductive layers comprising a first metal oxide layer 132, such as a nickel oxide layer, and an overlying second noble metal layer 134, such as a gold layer.

In another embodiment, the temperature and duration of the oxidation process can be selected to induce complete interdiffusion of materials between the first metal layer and the second metal layer during the oxidation process. In this case, the transparent conductive layer 38 can include a homogenized metal oxide containing composite layer including a transition metal oxide, such as nickel oxide, and a noble metal, such as gold (i.e., NiO:Au composite having NiO regions and Au regions).

In another embodiment, the temperature and duration of the oxidation process can be selected to induce partial interdiffusion of materials between the first metal layer and the second metal layer during the oxidation process. In this case, the transparent conductive layer 38 can include a graded metal oxide and metal composite layer in which the metal composition has a vertical gradient. Specifically, portions of the transparent conductive layer 38 that is more proximal to the top surface than to the bottom surface may have a higher concentration of the second metal (such as gold) than portions of the transparent conductive layer 38 that is more proximal to the bottom surface than to the top surface. In other words, the concentration of nickel oxide can increase from the bottom surface to or toward the top surface.

Figure 28:
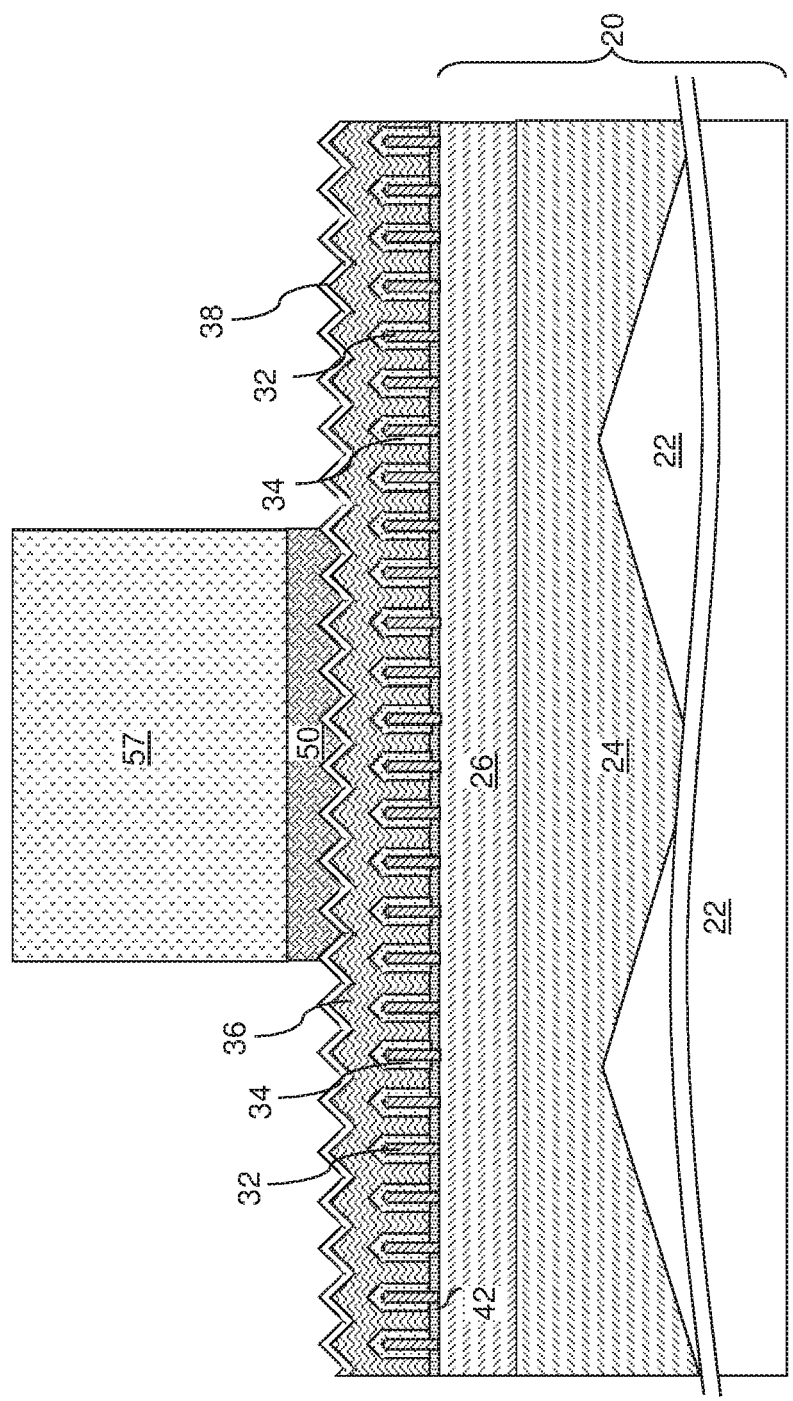
FIG. 28 is a vertical cross-sectional view of the exemplary structure after formation of a top contact electrode according to an embodiment of the present disclosure.

Referring to FIG. 28, a metallic material is deposited on the top surface of the transparent conductive layer 38. The metallic material can include a reflective metal such as aluminum, silver, copper, and/or gold. The metallic material can be deposited, for example, by sputtering. The average thickness of the deposited metallic material can be in a range from 50 nm to 500 nm, although lesser and greater thicknesses can also be employed. A photoresist layer 57 can be applied over the metallic material, and can be lithographically patterned to cover a center portion of each sub-pixel to be subsequently formed.

According to an aspect of the present disclosure, the photoresist layer 57 can be patterned employing the semiconductor alignment structures (938, 928, 908) described above as references for alignment of a lithographic pattern, or can be patterned employing portions of the patterned growth mask layer (906 or 42) in the alignment mark regions as references for alignment of the lithographic pattern.

An etch process can be performed to remove unmasked portions of the metallic material employing the photoresist layer 57 as an etch mask. The etch process can be an isotropic etch process or an anisotropic etch process, and may, or may not, be selective to the materials of the transparent conductive layer 38. Each remaining portion of the metallic material that is patterned by the etch process constitutes a top contact electrode 50. The photoresist layer 57 is subsequently removed, for example, by ashing.

Optionally, at least one metallic (i.e., electrically conductive) barrier layer (not shown) can be formed as a component of the top contact electrode 50. In this case, the at least one metallic barrier layer can be located at a top surface of the top contact electrode 50, and can be employed to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed.

Figure 29:
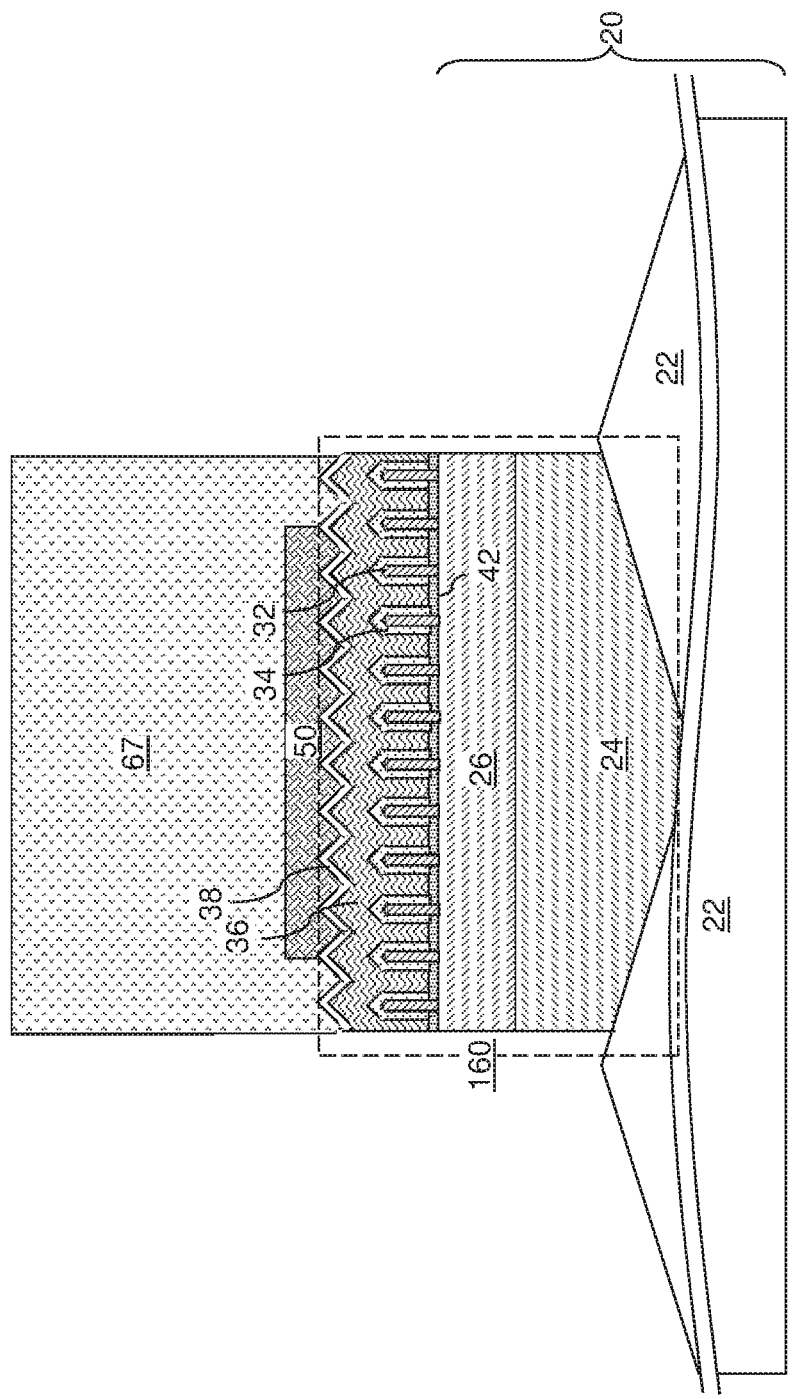
FIG. 29 is a vertical cross-sectional view of the exemplary structure after formation of a mesa structure according to an embodiment of the present disclosure.

Referring to FIG. 29, a photoresist layer 67 can be applied over each top contact electrode 50 and the transparent conductive layer 38, and can be lithographically patterned to cover an entire area of each sub-pixel to be subsequently formed. According to an aspect of the present disclosure, the photoresist layer 67 can be patterned employing the semiconductor alignment structures (938, 928, 908) described above as references for alignment of a lithographic pattern, or can be patterned employing portions of the patterned growth mask layer (906 or 42) in the alignment mark regions as references for alignment of the lithographic pattern.

An anisotropic etch process can be performed to sequentially etch unmasked portions of the transparent conductive layer 38, the second conductivity type semiconductor material layer 36, the semiconductor nanowires (32, 34), the patterned growth mask layer 42, the doped compound semiconductor layer 26, and the buffer layer 24 employing the photoresist layer 67 as an etch mask. The support substrate 22 can be employed as an etch stop structure. Each contiguous set of remaining portions of the transparent conductive layer 38, the second conductivity type semiconductor material layer 36, the semiconductor nanowires (32, 34), the patterned growth mask layer 42, the doped compound semiconductor layer 26, and the buffer layer 24 collectively constitute a mesa structure 160. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each mesa structure 160. Sidewalls of the nanowires cores (32, 34), if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same mesa structure 160. The photoresist layer 67 is subsequently removed, for example, by ashing.

Figure 30:
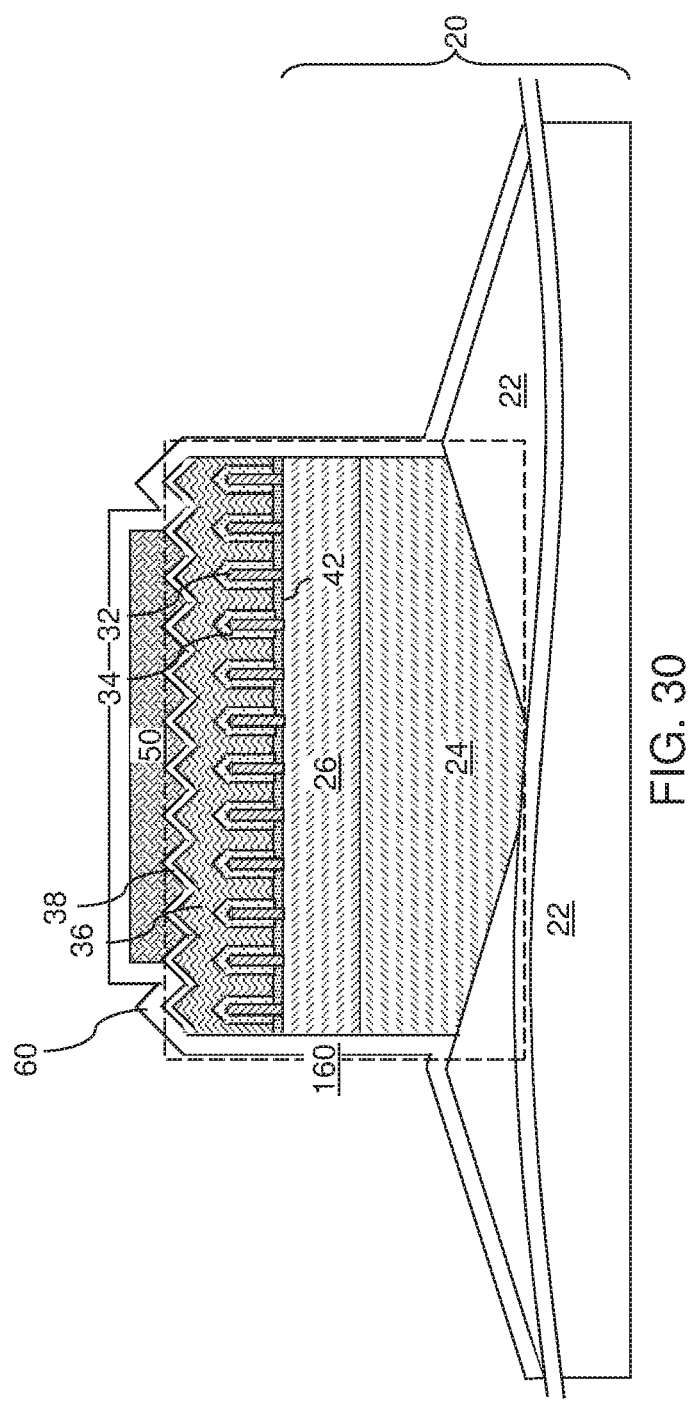
FIG. 30 is a vertical cross-sectional view of the exemplary structure after formation of a dielectric material layer according to an embodiment of the present disclosure.

Referring to FIG. 30, a dielectric material layer 60 may be deposited over the transparent conductive oxide layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. The dielectric material layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric material layer 60 can be formed over each mesa structure 160 (i.e., over the second conductivity type semiconductor material layer 36 and around each remaining group of nanowires (32, 34)), and encapsulates each mesa structure 160 in combination with the support substrate 22. In one embodiment, at least one remaining group of nanowires (32, 34) in the mesa structure 160 can constitute an array of nanowires (32, 34). In one embodiment, the dielectric material layer 60 can be formed as a conformal material layer, i.e., a layer having a uniform thickness throughout. The thickness of the dielectric material layer 60 can be in a range from 100 nm to 4 microns, such as from 200 nm to 2 microns, although lesser and greater thicknesses can also be employed.

Figure 31:
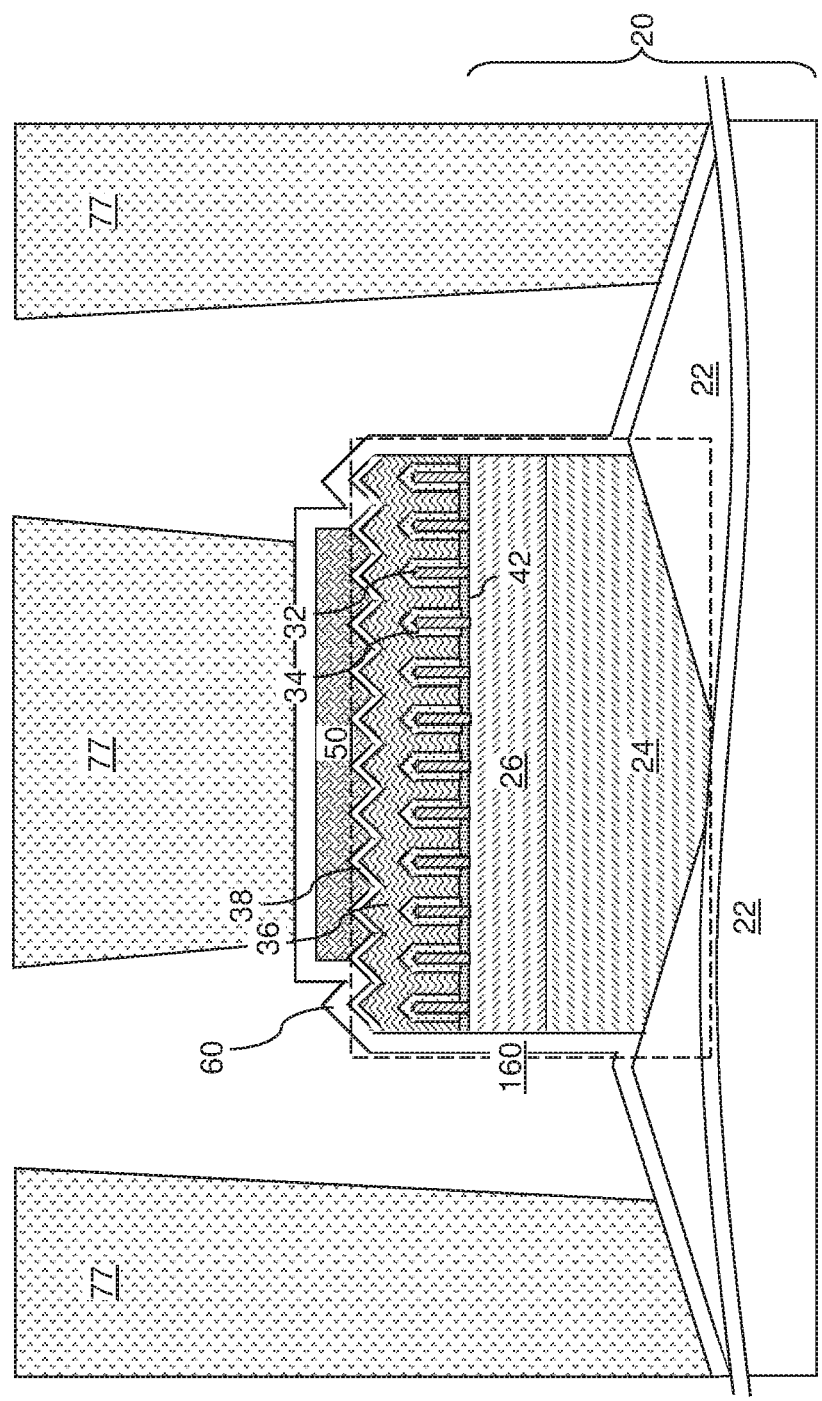
FIG. 31 is a vertical cross-sectional view of the exemplary structure after formation of a patterned photoresist layer according to an embodiment of the present disclosure.

Referring to FIG. 31, a photoresist layer 77 can be applied over the exemplary structure, and can be lithographically patterned to cover a center portion of each mesa structure 160, and not to cover an entire periphery of each mesa structure 160. According to an aspect of the present disclosure, the photoresist layer 77 can be patterned employing the semiconductor alignment structures (938, 928, 908) described above as references for alignment of a lithographic pattern, or can be patterned employing portions of the patterned growth mask layer (906 or 42) in the alignment mark regions as references for alignment of the lithographic pattern.

Portions of the surfaces of the support substrate 22 located between a neighboring pair of mesa structures 160 can be covered with the patterned photoresist layer 77. In one embodiment, the uncovered areas of the exemplary structure can include annular regions located at a periphery of each mesa structure 160. The annular regions can be laterally spaced from one another by remaining portions of the photoresist layer 77 that cover underlying portions of the support substrate 22. In one embodiment, the sidewalls of the patterned photoresist layer 77 can have a retro-taper to minimize deposition of a metallic material in a subsequent metallic material deposition process.

Figure 32:
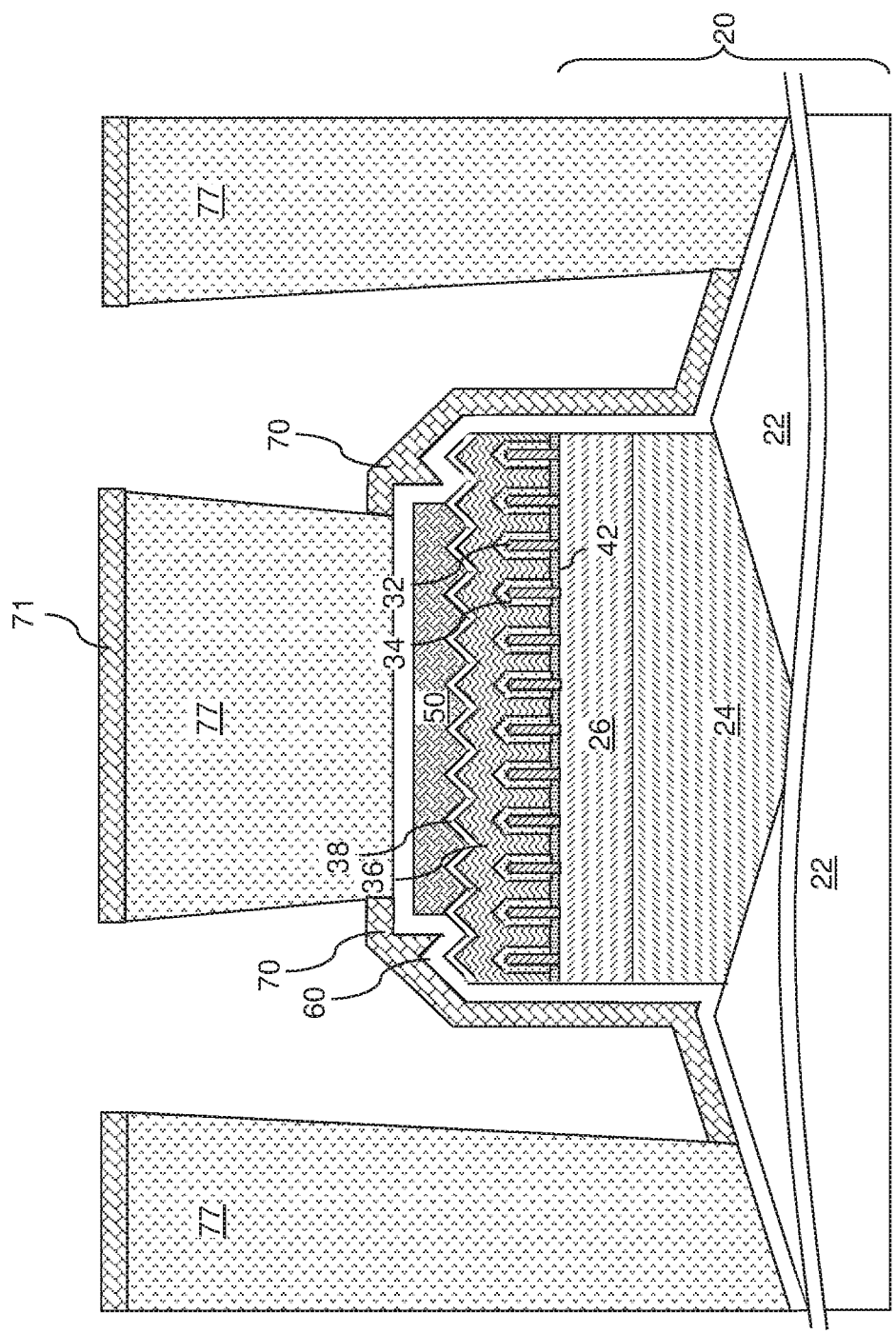
FIG. 32 is a vertical cross-sectional view of the exemplary structure after formation of a reflector structure according to an embodiment of the present disclosure.

Referring to FIG. 32, a reflector material can be deposited over the dielectric material layer 60 in regions that are not covered with the photoresist layer 77. The reflector material can be deposited by a direction deposition method such as vacuum evaporation or physical vapor deposition. Each portion of the reflector material that is deposited directly on the dielectric material layer 60 constitutes a reflector layer 70, which can be topologically homeomorphic to a ring. In one embodiment, each reflector layer 70 includes a reflective material such as a metal. In one embodiment, each reflector layer 70 includes at least one material selected from silver, aluminum, copper, and gold. In one embodiment, the reflector material can be a thin film distributed Bragg reflector (DBR) with small index changes to provide better reflectivity. The reflector material can include at least one conductive material and/or at least one electrically insulating material.

Reflector material portions 71 are formed on the top surfaces of the patterned portions of the photoresist layer 77. The thickness of horizontal portions of the reflector layer 70 can be in a range from 5 nm to 500 nm, such as from 10 nm to 250 nm, although lesser and greater thicknesses can also be employed.

Figure 33:
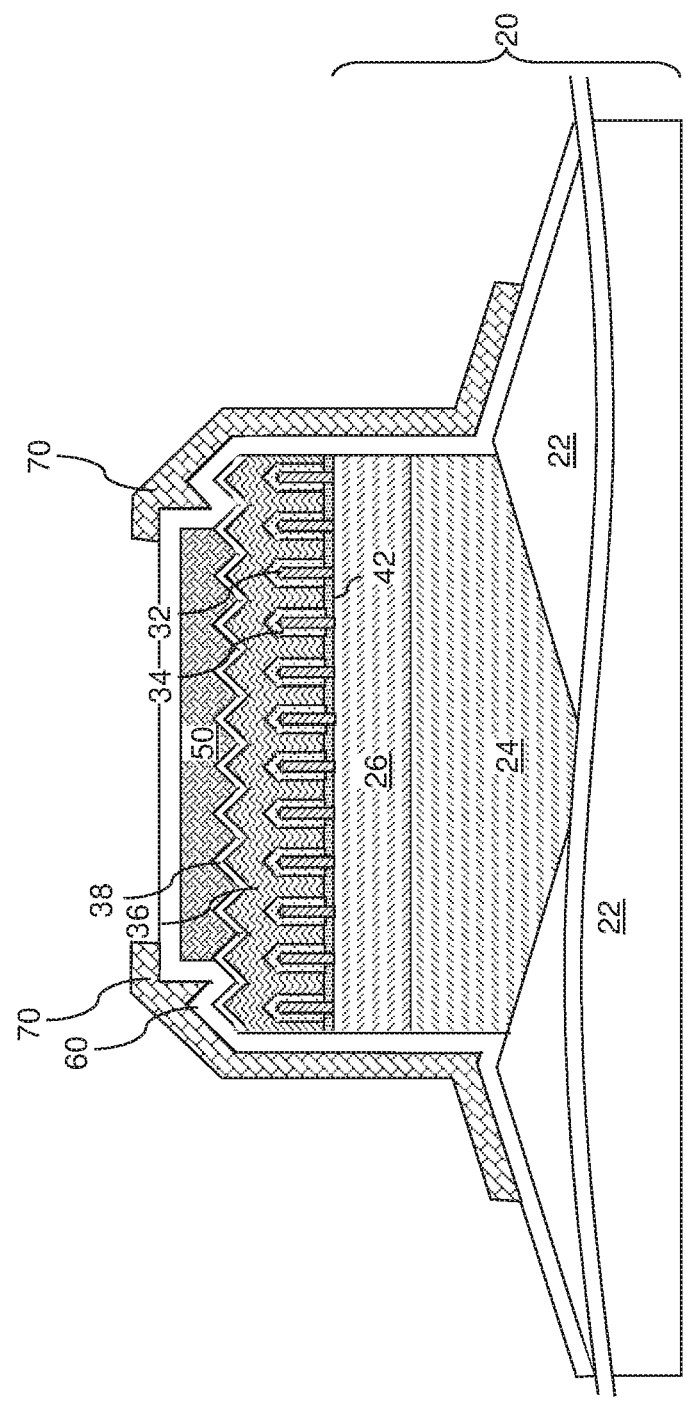
FIG. 33 is a vertical cross-sectional view of the exemplary structure after removal of the patterned photoresist layer according to an embodiment of the present disclosure.

Referring to FIG. 33, the remaining portions of the photoresist layer 77 and the reflector material portions 71 thereupon can be lifted off the exemplary structure, for example, by dissolving the photoresist layer 77 in a solvent.

Figure 34:
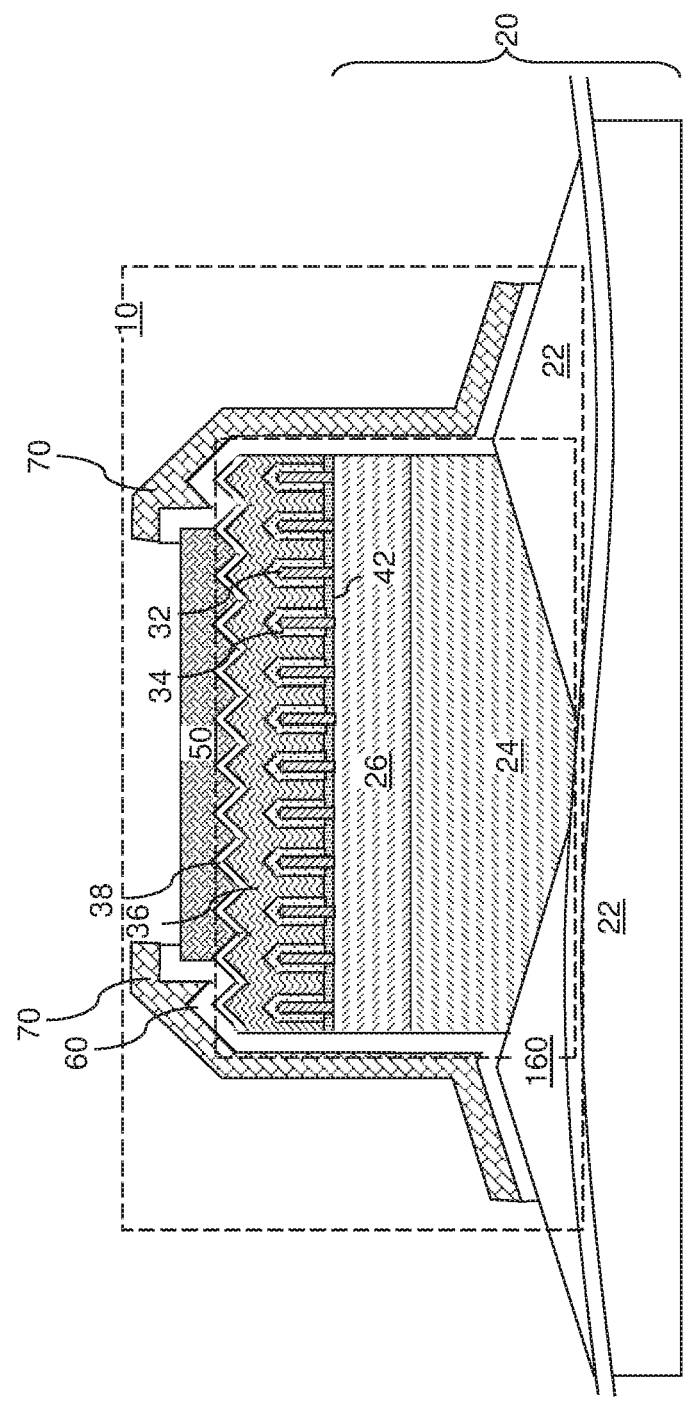
FIG. 34 is a vertical cross-sectional view of the exemplary structure after etching unmasked portions of the dielectric material layer according to an embodiment of the present disclosure.

Referring to FIG. 34, an etch process can be performed to etch unmasked portions of the dielectric material layer 60. The etch process may be an anisotropic etch process or an isotropic etch process. Portions of the dielectric material layer 60 that are not masked by the reflector layers 70 are removed by the etch process. The top surface of each top contact electrode 50 and the top surface of the support substrate 22 are physically exposed in each area that is not covered with the reflector layers 70. A light emitting diode (LED) 10 is provided, which includes a mesa structure 160, a dielectric material layer 60, and a reflector layer 70 having an annular configuration. The top surface of the top contact electrode 50 is physically exposed within a hole in the reflector layer 70, and within a hole in the dielectric material layer 60. Each LED 10 can be subsequently employed as a sub-pixel in a display device.

Figure 35:
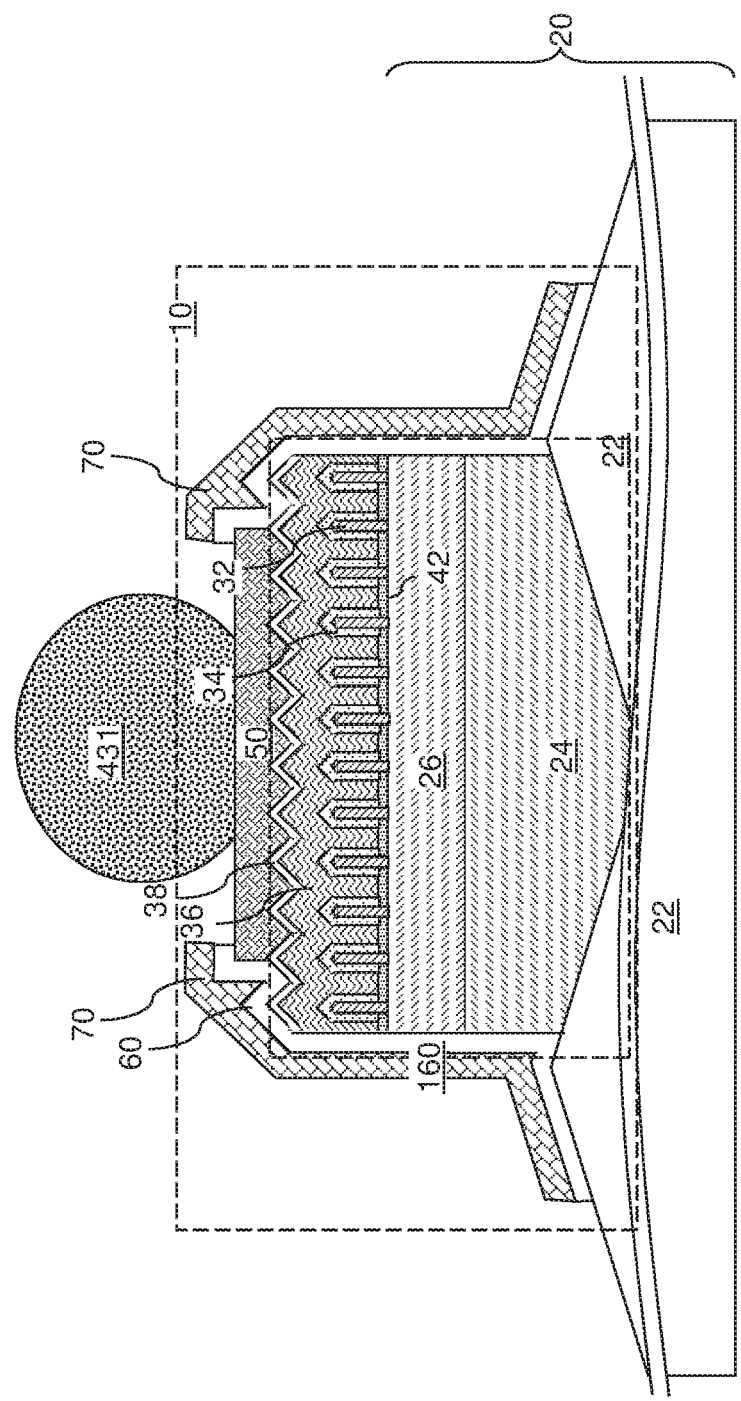
FIG. 35 is a vertical cross-sectional view of the exemplary structure after attaching a conductive bonding structure according to an embodiment of the present disclosure.

Referring to FIG. 35, a conductive bonding structure 431 is formed over each mesa structure 160. In one embodiment, the conductive bonding structures 431 can be formed directly on the at least one metallic barrier layer, which can be a topmost layer of the top contact electrode 50. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material.

Figure 36:
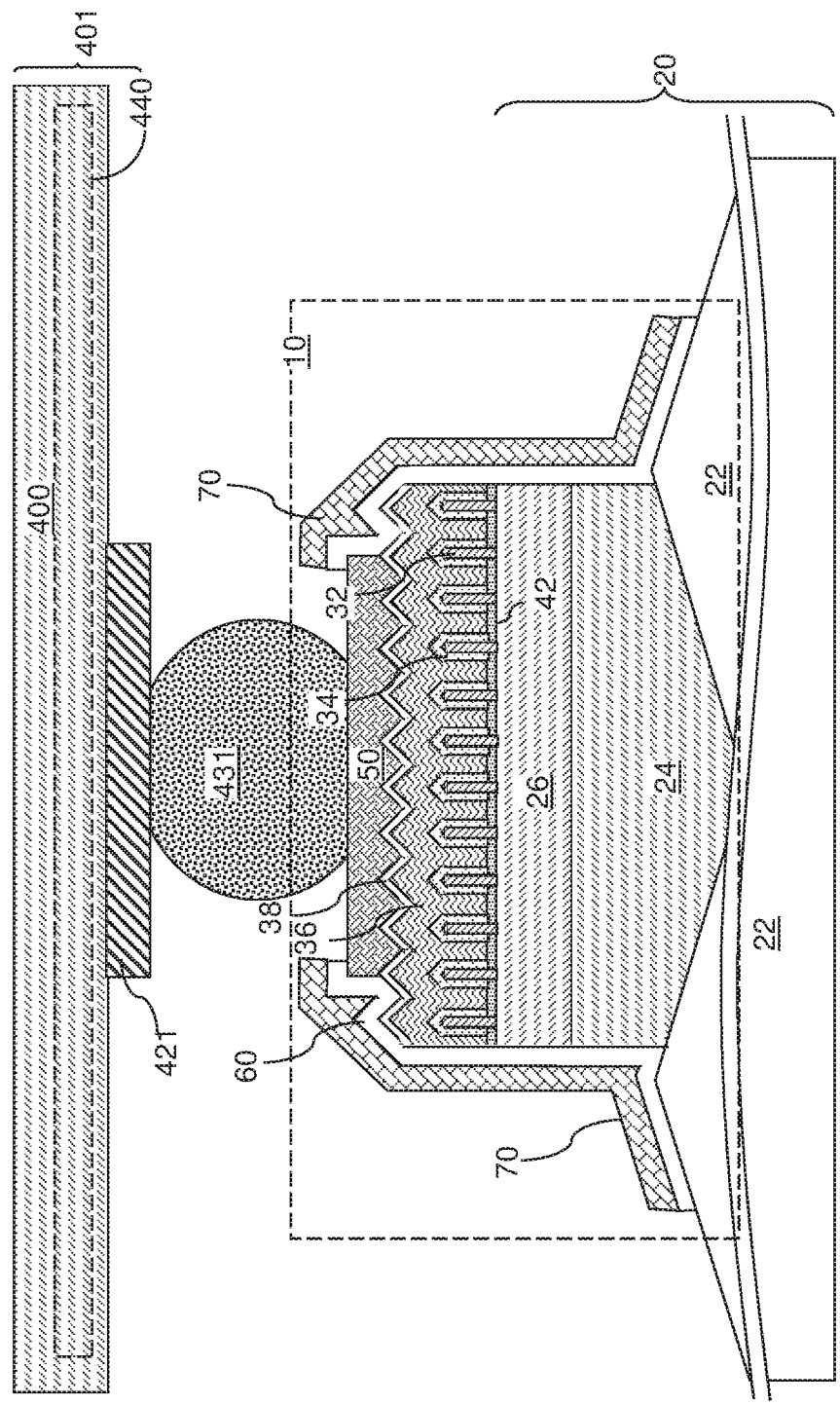
FIG. 36 is a vertical cross-sectional view of the exemplary structure after attaching a backplane according to an embodiment of the present disclosure.

Referring to FIG. 36, a backplane 401 is provided, which includes a backplane substrate 400 and bonding structures 421 located thereupon. A backplane can be an active or passive matrix backplane substrate for driving light emitting devices. As used herein, a "backplane substrate" refers to any substrate configured to affix multiple devices thereupon. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid. In some embodiments, active device circuits (such as field effect transistors) may not be present in the backplane substrate 400. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprise one or more transistors.

The backplane substrate 400 is disposed facing the substrate 20 (e.g., above, below or side-to-side) and aligned such that the conductive bonding structures 431 face, and contact, a respective one of the bonding structures 421. At least one of the LEDs 10 (i.e., at least one subpixel, or) can be attached to the backplane 401 by inducing bonding between a respective pair of a conductive bonding structure 432 and a bonding structure 421 (which may be a bonding pad) on the backplane 401. Local heating (for example, by laser irradiation) of the respective pair of the conductive bonding structure 432 and the bonding structure 421 can be employed to induce reflow and bonding of the solder material. All, or only a subset, of the LEDs 10 on the substrate 20 can be bonded to the backplane 401, as will be described in more detail below with respect to FIGS. 37A to 37P.

Figure 37A:
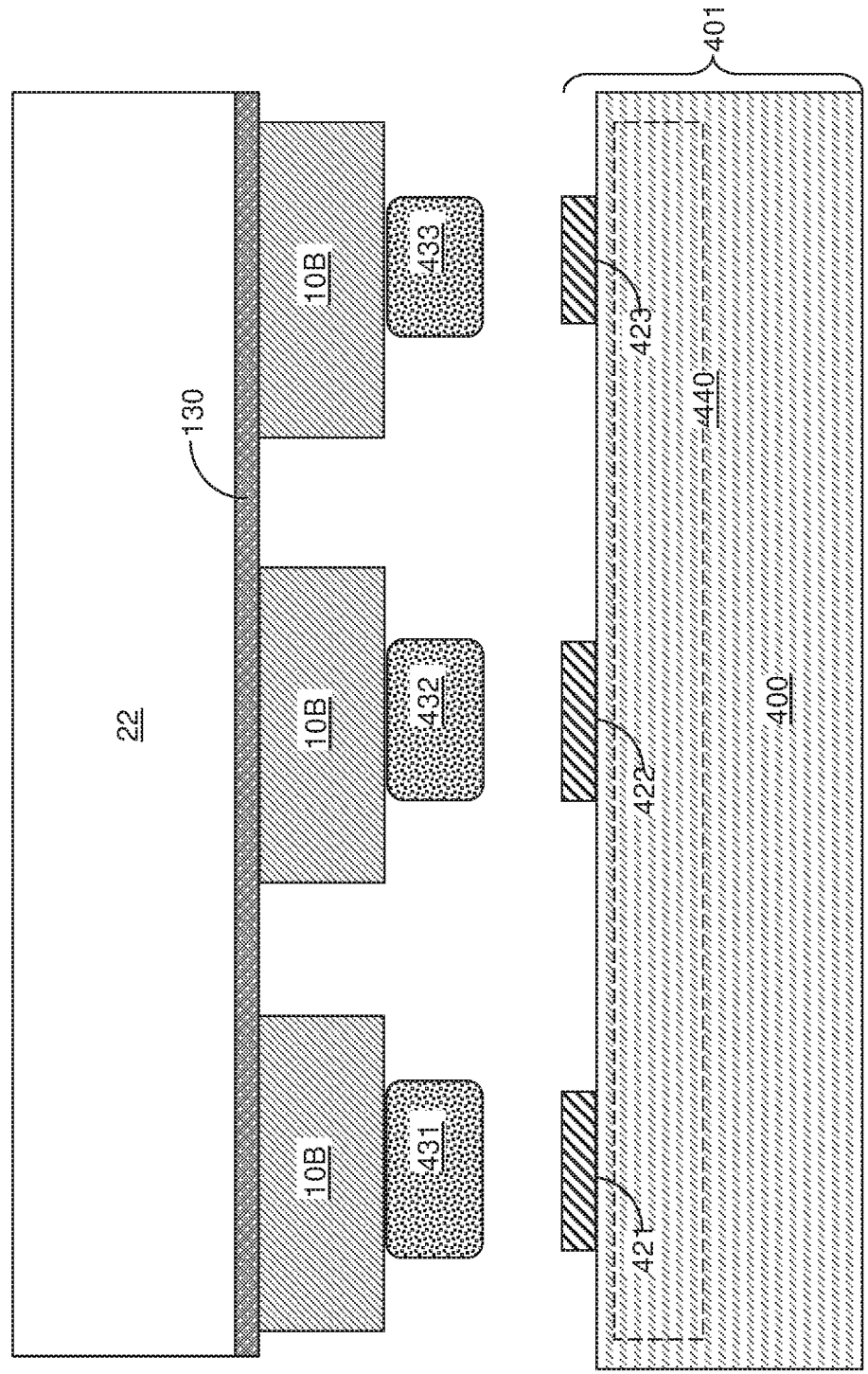
FIGS. 37A to 37P are schematic vertical cross-sectional views of steps in a method of incorporating LEDs into a display panel according to an embodiment of the present disclosure.

In one embodiment, each LED 10 die is subpixel that emits light of a given color, which may be, for example, blue, green, or red. FIGS. 37A-37P illustrate a method of incorporating the LEDs 10, such as a blue, green and/or red light emitting subpixels into a single pixel of direct view display from different growth substrates 20. The LEDs 10 can be the nanowire LEDs described above, different nanowire LEDs and/or bulk (i.e., planar) LEDs. Each of the pixels comprises a red-light emitting diode configured to emit light at a peak wavelength in a range from 620 nm to 750 nm, a green-light emitting diode configured to emit light at a peak wavelength in a range from 495 nm to 570 nm, and a blue-light emitting diode configured to emit light at a peak wavelength in a range from 440 to 495 nm.

Referring to FIG. 37A, an in-process structure is illustrated, which can be employed to form an exemplary light emitting device assembly (e.g., direct view display) according to an embodiment of the present disclosure.

The exemplary light emitting device assembly can include a backplane 401 including a backplane substrate 400 containing bonding pads (421, 422, 423) for the respective first, second and third LEDs.

In one embodiment, the backplane substrate 400 may be a passive backplane substrate, in which metal interconnect structures 440 comprising metallization lines are present, for example, in a criss-cross grid and active device circuits are not present. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprise one or more transistors. The backplane substrate 400 may have a substantially planar (i.e., not stepped) upper surface or a stepped upper surface.

Conductive bonding structures (431, 432, 433) for each LED 10 which can correspond to the respective solder bump 988. The bond pads (421, 422, 423) can have the same composition as each other. The conductive bonding structures (431, 432, 433) can have the same composition as each other. The bond pads (421, 422, 423) can have the same height or different heights. The conductive bonding structures (431, 432, 433) can have the same height or different heights.

In one embodiment, the conductive bonding structures (431, 432, 433) can be formed on the LEDs 10 to be transferred to the backplane 401. For example, first light emitting diodes can be the first devices to be transferred to the backplane substrate 400. The first light emitting diodes can be located on first support substrate 22, which can be a first transfer substrate or a first-type growth substrate (i.e., the substrate 902). The conductive bonding structures 431 are formed on a first subset of the first light emitting diodes. The second conductive bonding structures 432 are formed on a second subset of the first light emitting diodes and the third conductive bonding structures 433 are formed on a third subset of the first light emitting diodes.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 37B:
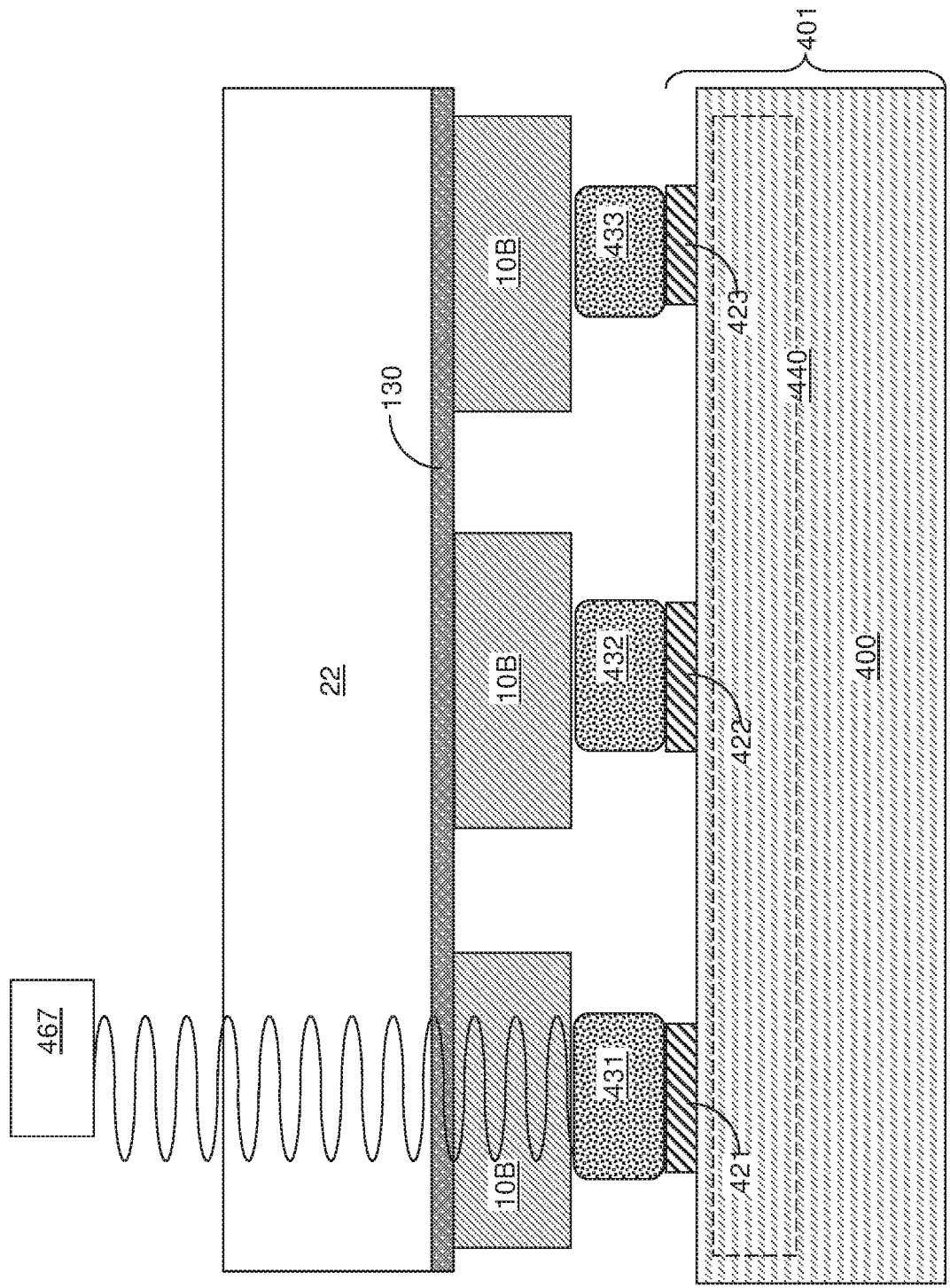

Referring to FIG. 37B, the backplane 401 and the assembly including the first light emitting diodes are positioned such that each conductive bonding structure 431 is attached to one first light emitting device, and contacts the respective bonding pad 421. Each second conductive bonding structure 432 can be attached to the another first light emitting device and contacts the second bonding pad 422. Each third conductive bonding structure 433 is attached to yet another first light emitting device and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first light emitting devices). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first light emitting device and to an underlying first bonding pad 421. Preferably, the laser beam is provided through the support substrate 22. The laser beam may be transmitted through the support substrate 22 and through the devices to the conductive reflector layer 966 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Figure 37C:
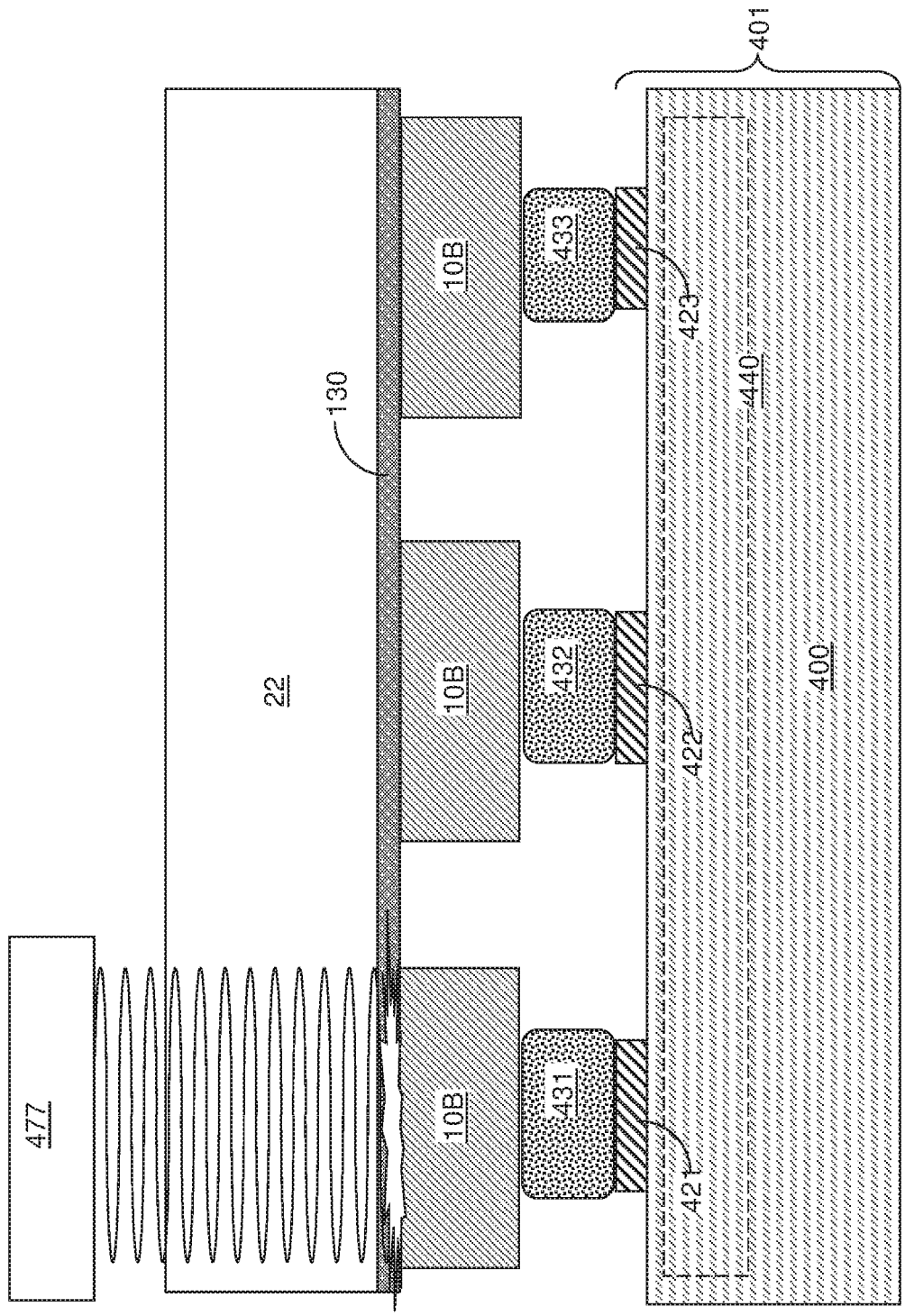

Referring to FIG. 37C, a laser irradiation process is performed to separate each bonded first light emitting device from the first support substrate. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes). The ablation material layer 130 may comprise the semiconductor buffer layer 904 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first light emitting device.

Figure 37D:
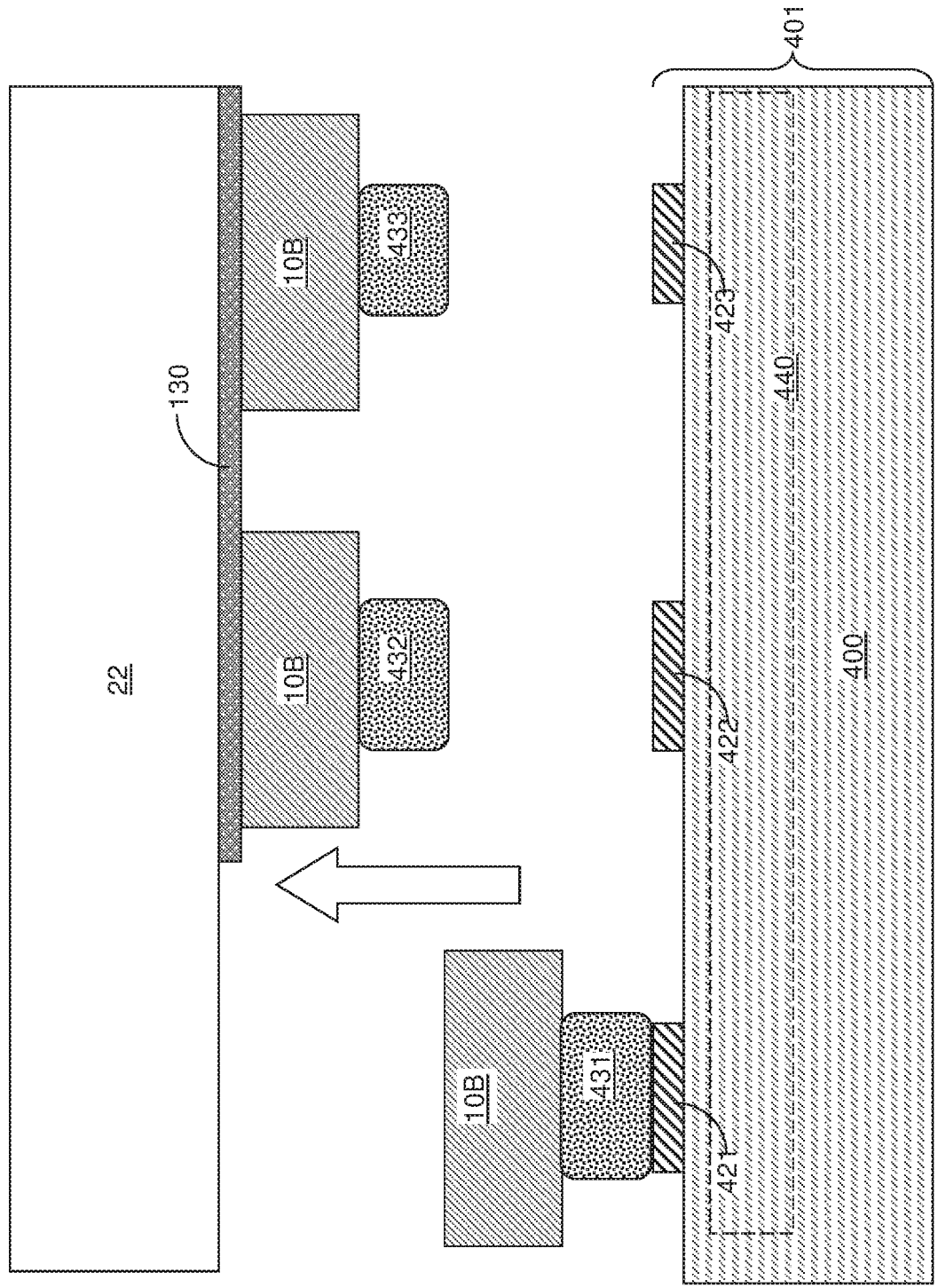

Referring to FIG. 37D, the assembly of the first support substrate 22 and attached first light emitting diodes (i.e., the complement of the first subset of the first light emitting diodes) is separated from the backplane 401 and the first subset of the first light emitting diodes.

Referring to FIG. 37E, a dummy substrate 700 can employed to push the first light emitting diodes on the first conductive bonding structures 431 toward the backplane 401 while optionally thermally reflowing the first conductive bonding structures 431. The compressible first conductive bonding structures can be compressed by 5 to 20% of their thickness during this step.

Figure 37F:
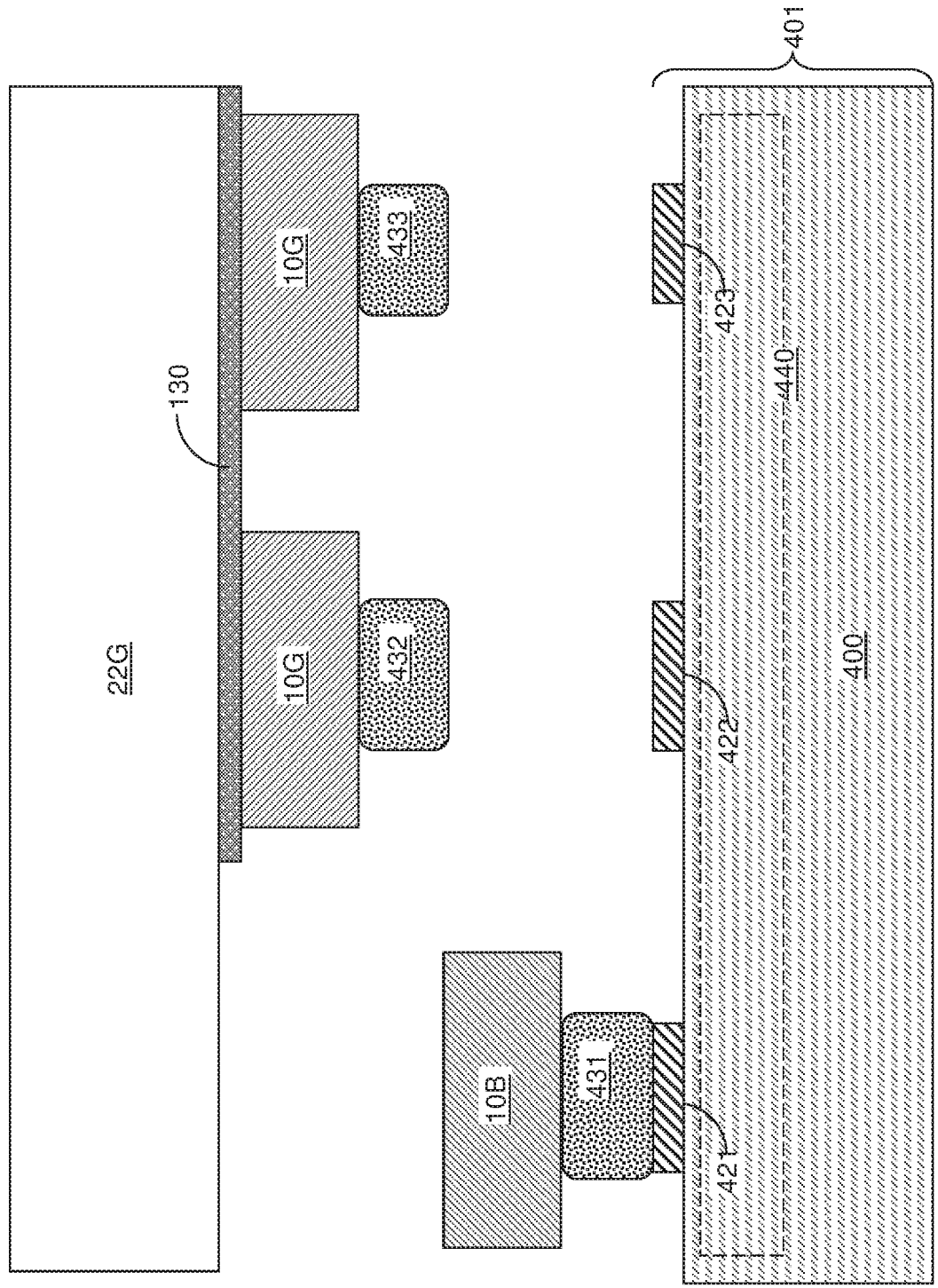

Referring to FIG. 37F, a second support substrate (such as a second growth or transfer substrate) 22G from which a first subset of second light emitting devices are removed is positioned over the in-process exemplary light emitting device assembly, and is aligned such that a second subset of the second light emitting diodes overlies the second bonding pads 422.

Figure 37G:
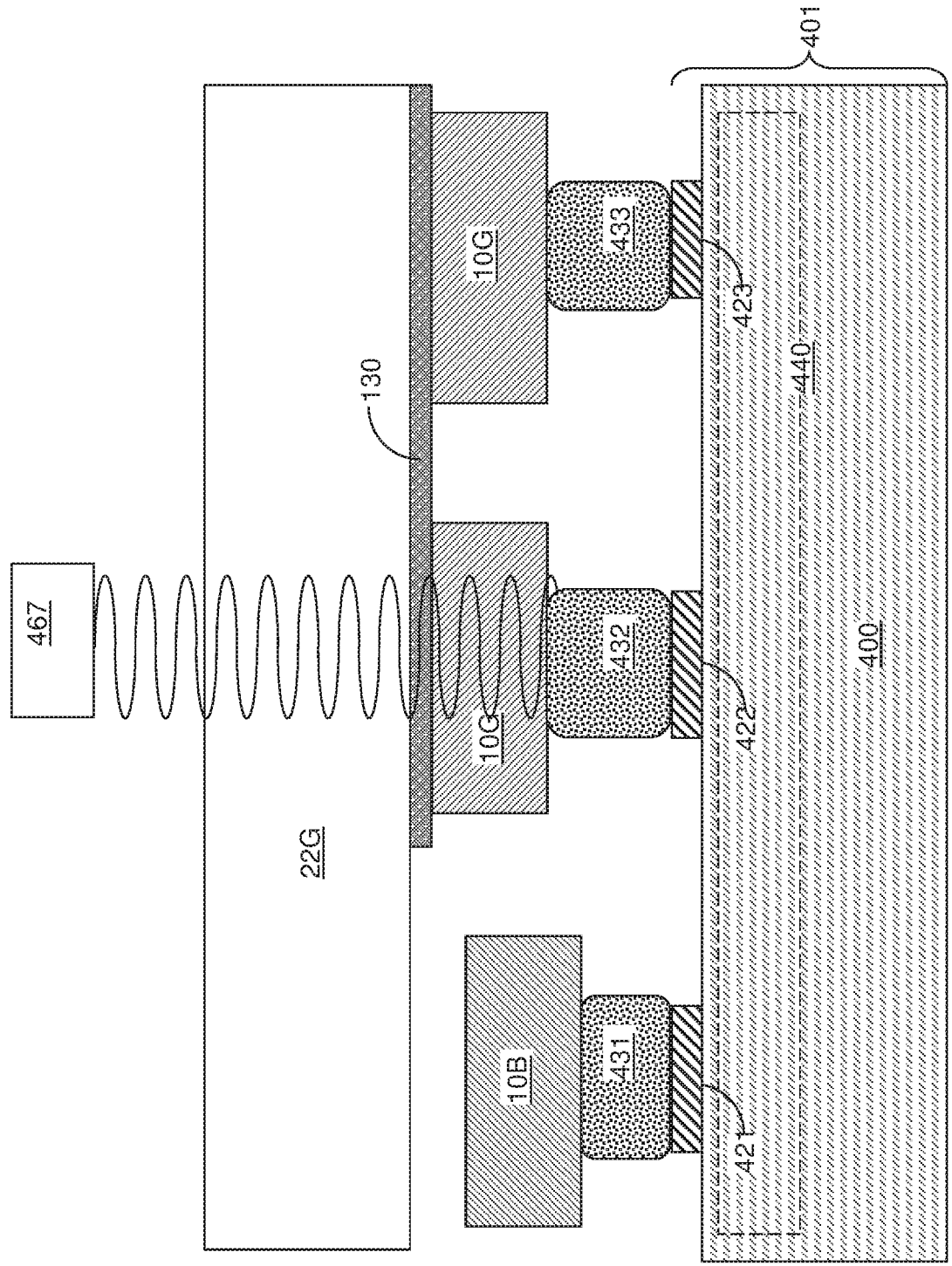

Referring to FIG. 37G, the backplane 401 and the assembly including the second light emitting diodes are positioned such that each second conductive bonding structure 432 is attached to the second light emitting device and contacts the second bonding pad 422.

In one embodiment, each second conductive bonding structure 432 can be attached to one of an overlying second light emitting device, and the second bonding pad 422, and each third conductive bonding structure 433 can be attached to one of an overlying second light emitting device and contacts the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second light emitting devices). The same heating laser can be employed as in the processing steps of FIG. 37B. The second conductive bonding structures 432 can be sequentially irradiated by a laser beam from the heating laser 467 to reflow each second conductive bonding structure 432, and to bond each second conductive bonding structure 432 to an overlying second light emitting device and to an underlying second bonding pad 422.

Figure 37H:
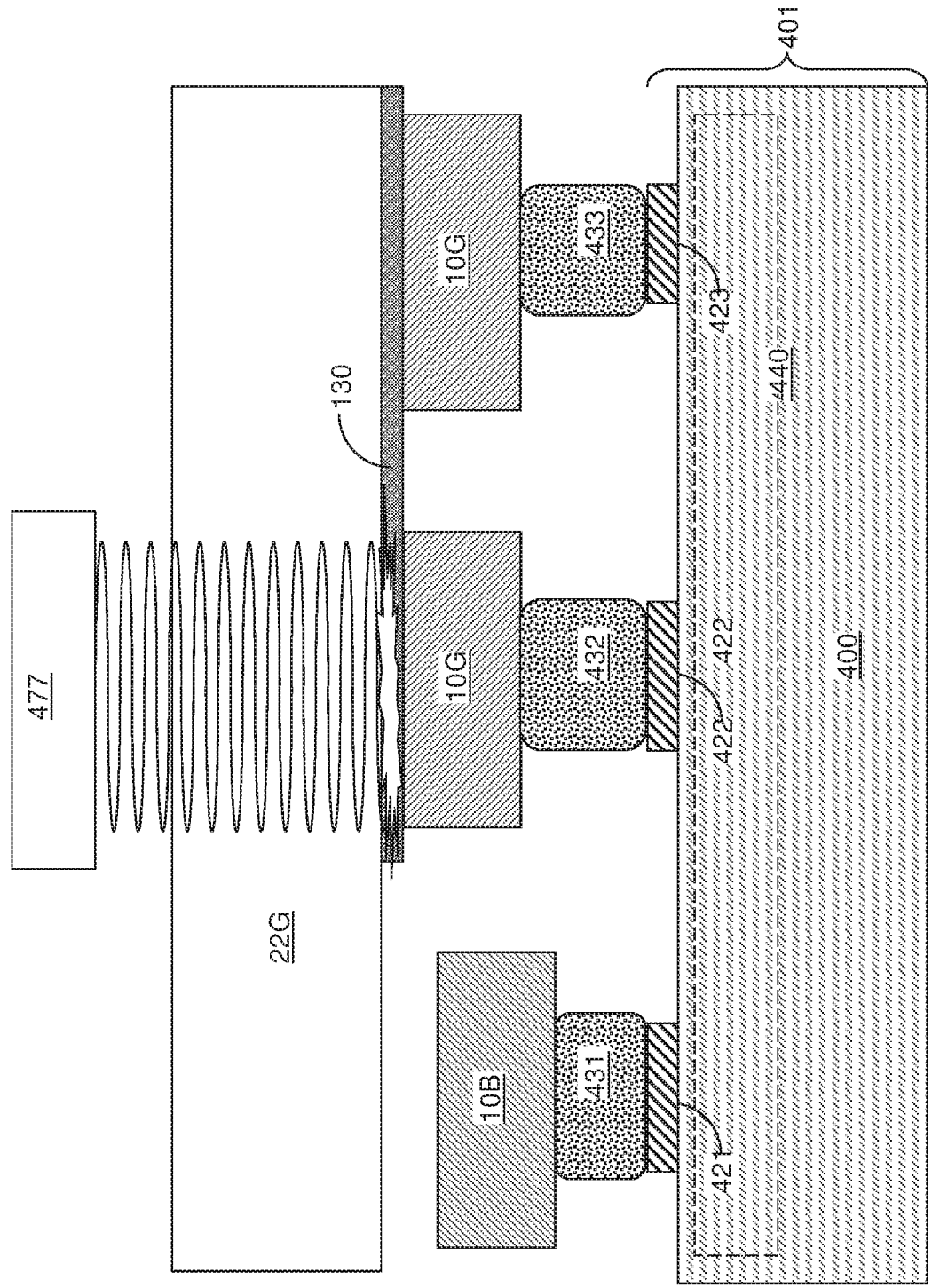

Referring to FIG. 37H, a laser irradiation process is performed to separate each bonded second light emitting device from the second support substrate in the same manner as the processing steps of FIG. 37C. The wavelength of the laser 477 can be different from the wavelength of the heating laser 467, and provides more heating to the material of the ablation material layer 130 than to the materials of the support substrate 22G and the transferred devices (e.g., the second light emitting diodes). Each portion of the ablation material layer 130 overlying the second conductive bonding structures 432 can be sequentially irradiated by a laser beam from the laser 477 to dissociate each underlying second light emitting device.

Figure 37I:
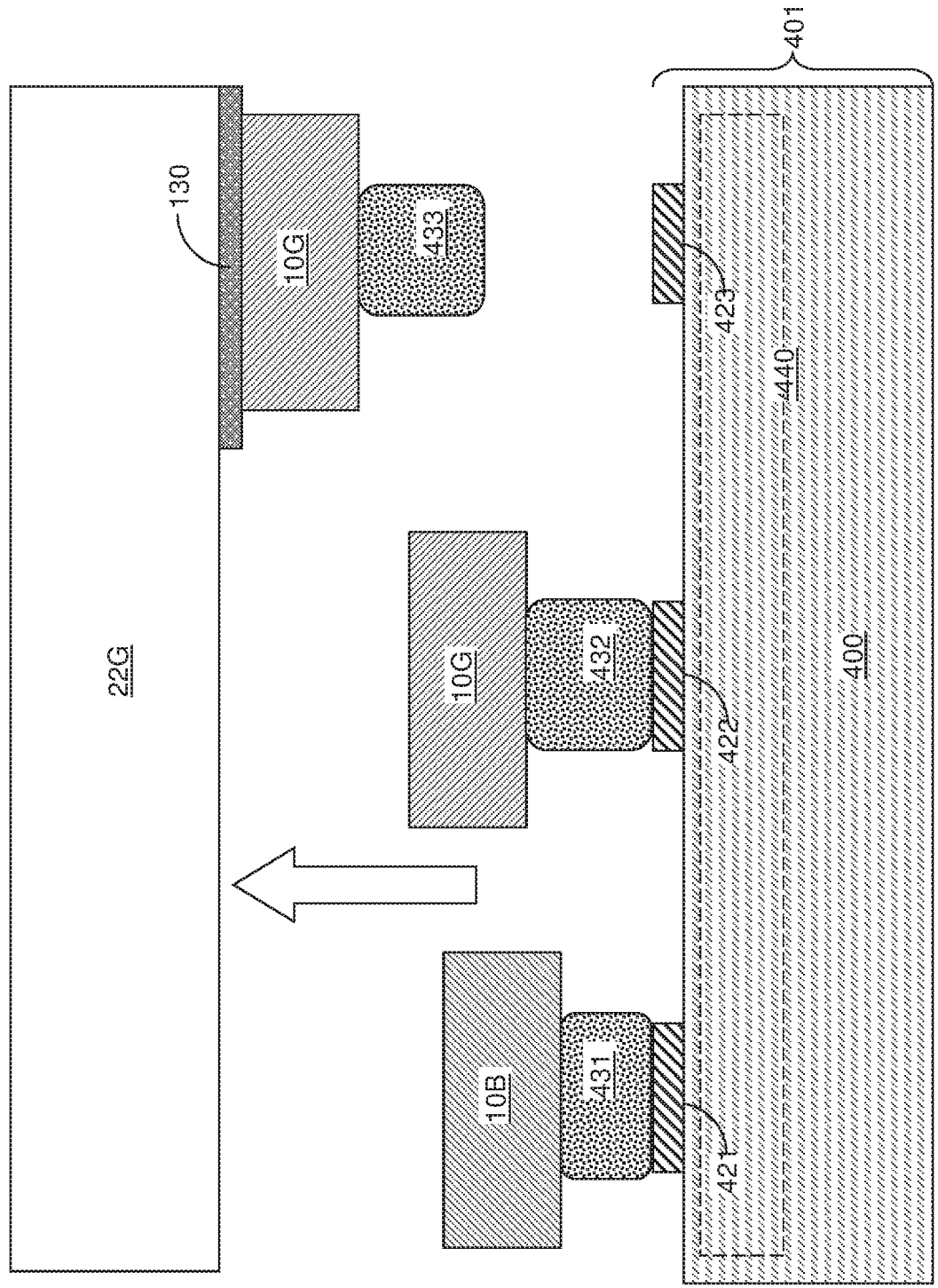

Referring to FIG. 37I, the assembly of the second support substrate 22G and attached second light emitting diodes (a third subset of the second light emitting diodes that remain on the second support substrate) is separated from the backplane 401 and the second subset of the second light emitting diodes that are now attached to the backplane 401.

Figure 37J:
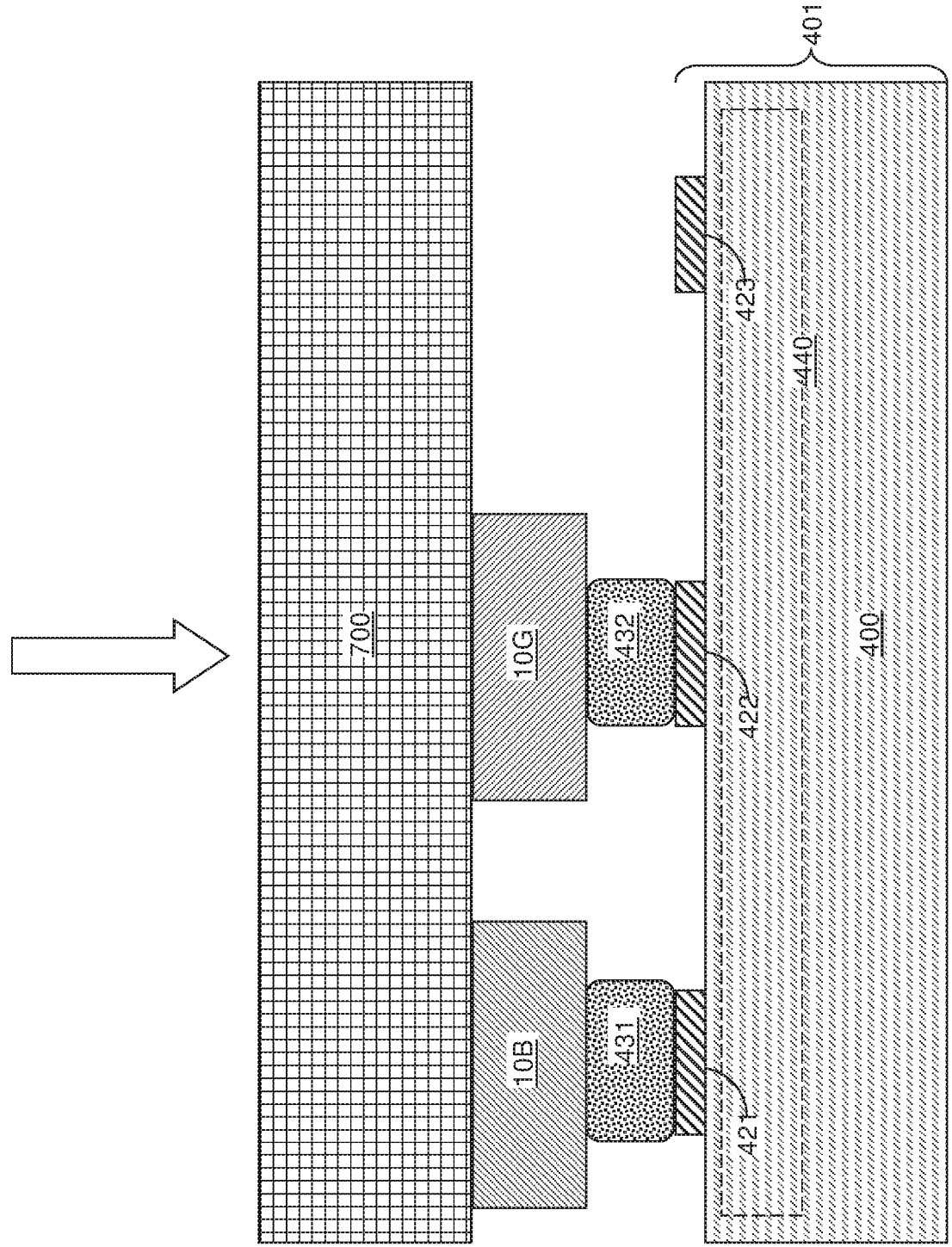

Referring to FIG. 37J, a dummy substrate 700 can employed to push the second light emitting diodes on the second conductive bonding structures 432 toward the backplane 401 in the same manner as described above.

Figure 37K:
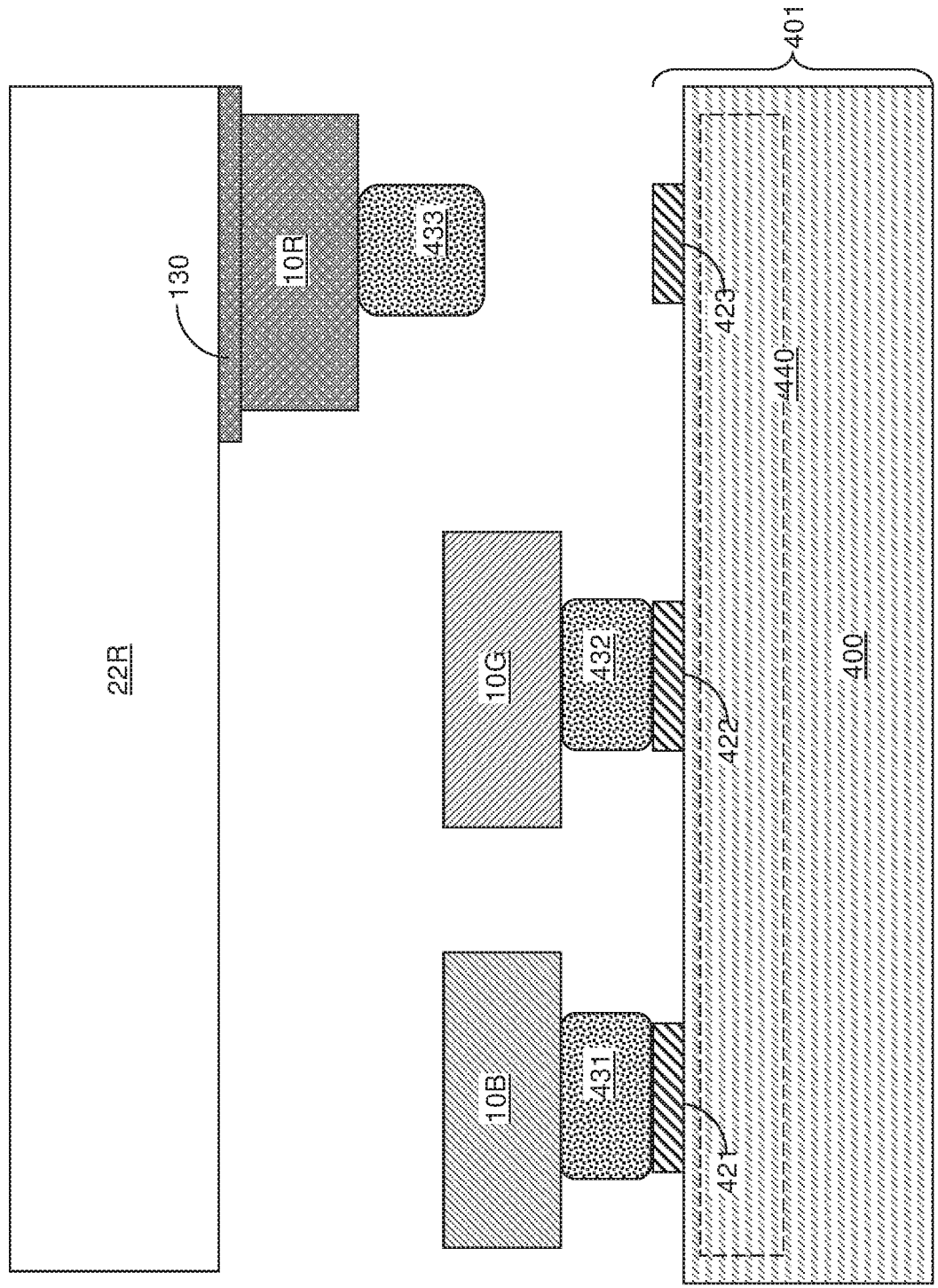

Referring to FIG. 37K, a third support substrate (such as a third growth or transfer substrate 22R), from which a first subset and a second subset of third light emitting devices have been removed in prior processing steps, is positioned over the in-process fourth exemplary light emitting device assembly, and is aligned such that a third subset of the third light emitting diodes overlies the third bonding pads 423.

Figure 37L:
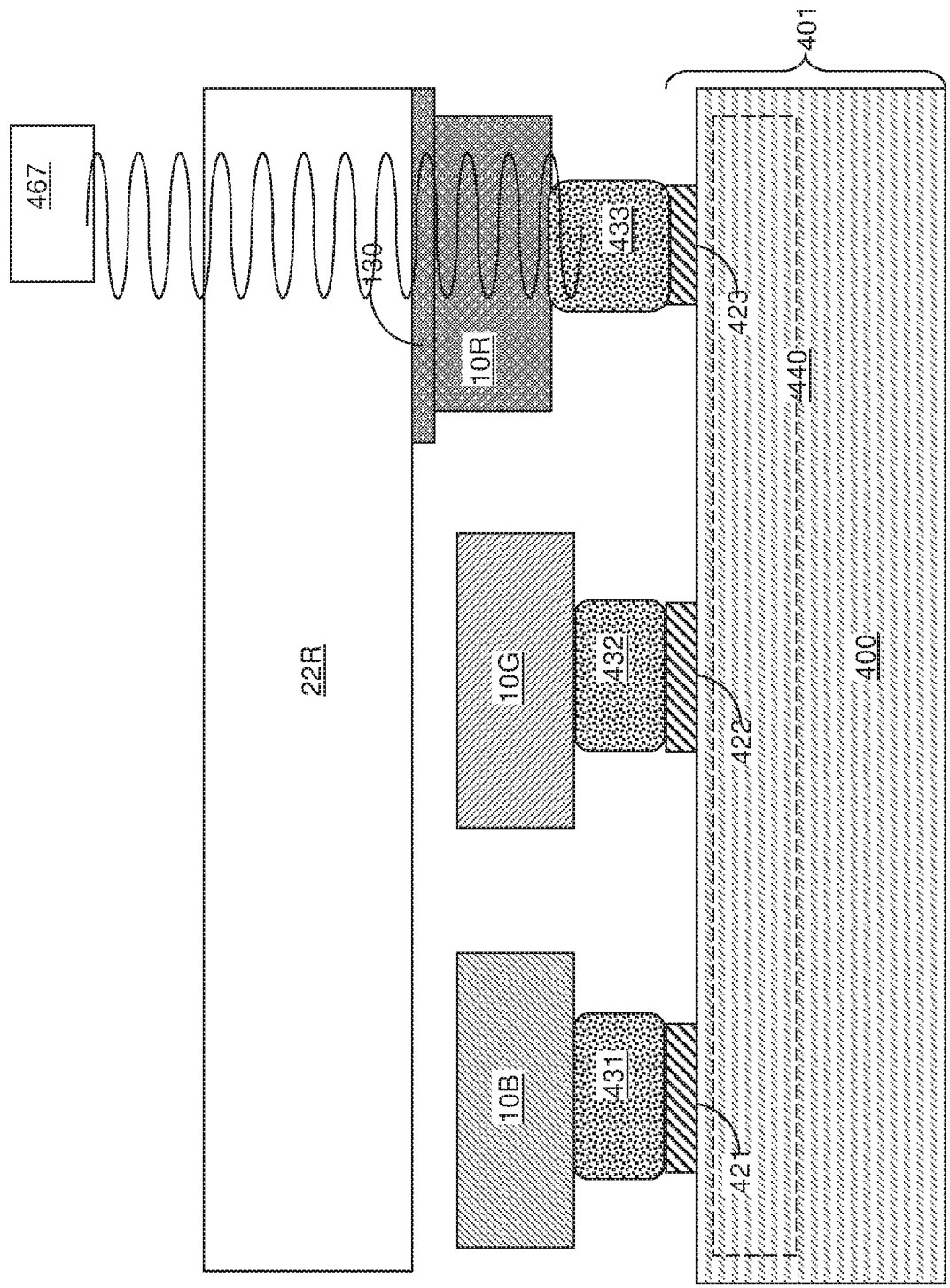

Referring to FIG. 37L, the backplane 401 and the assembly including the third light emitting diodes are positioned such that each third conductive bonding structure 433 is attached a third light emitting device and contacts the third bonding pad 423. If any addition conductive bonding structures (not shown) are present, additional conductive bonding structures (not shown) overlying such additional bonding pads can contact underlying additional bonding pads and overlying third light emitting devices, and can be attached to the underlying additional bonding pads or to the overlying third light emitting devices.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third light emitting devices). The same heating laser can be employed as in the processing steps of FIG. 37B or FIG. 37G. The third conductive bonding structures 433 can be sequentially irradiated by a laser beam from the heating laser 467 to reflow each third conductive bonding structure 433, and to bond each third conductive bonding structure 433 to an overlying third light emitting device and to an underlying third bonding pad 423.

Figure 37M:
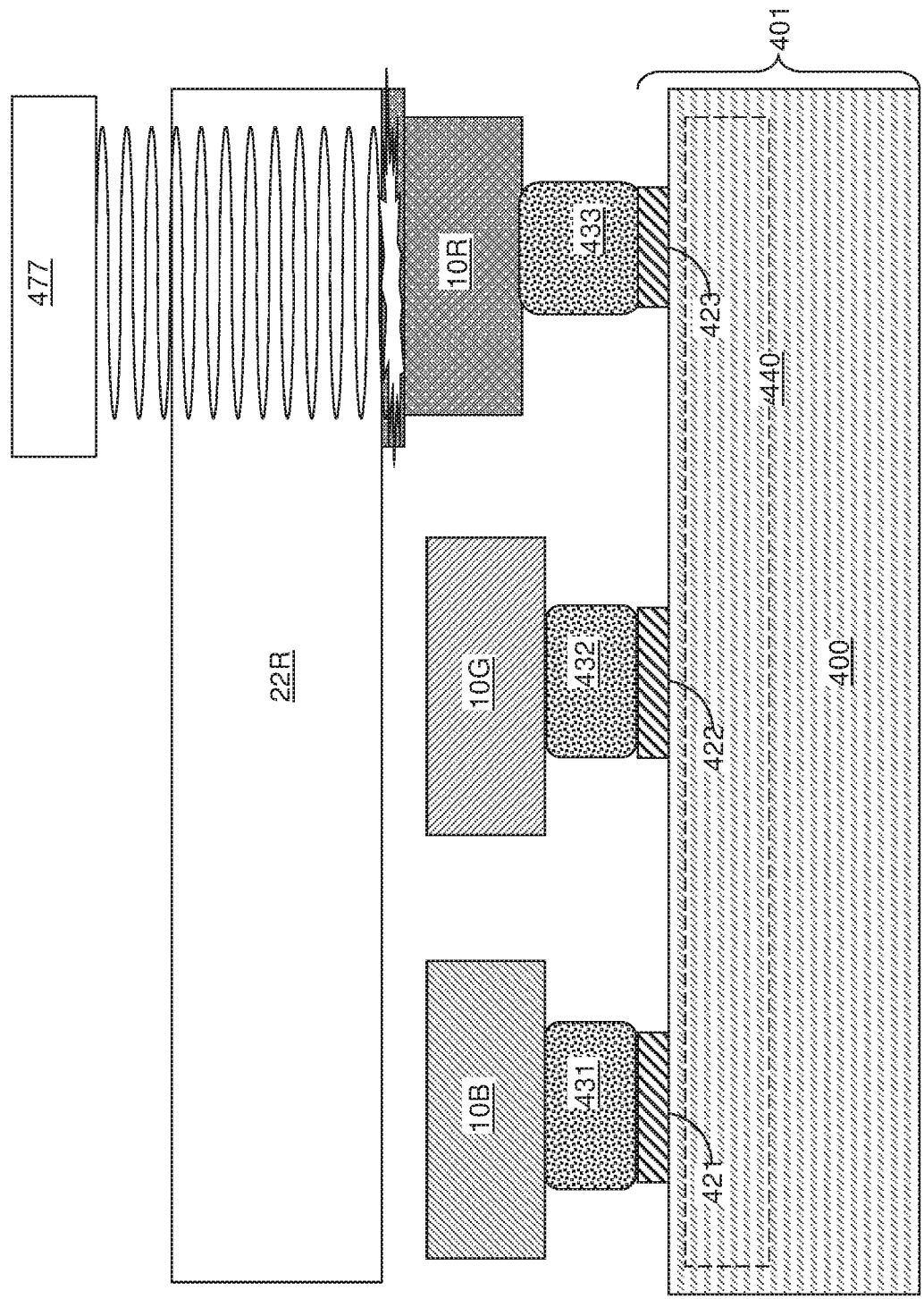

Referring to FIG. 37M, a laser irradiation process is performed to separate each bonded third light emitting device from the third support substrate in the same manner as in the processing step of FIG. 37C.

Figure 37N:
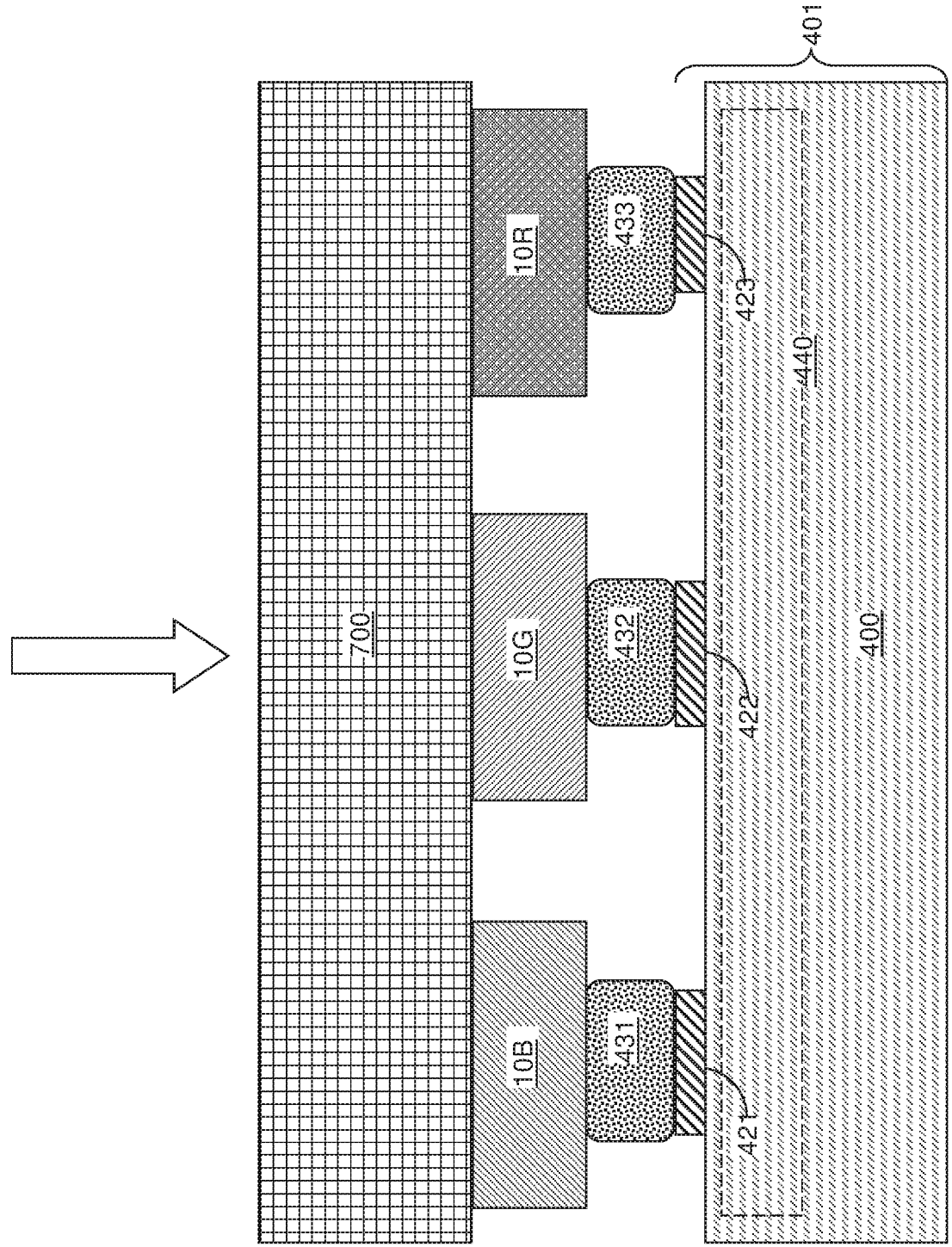

Referring to FIG. 37N, a dummy substrate 700 may be employed to push the third light emitting diodes on the third conductive bonding structures 433 toward the backplane 401. The assembly of the third support substrate 22R and any remaining third light emitting diodes, if any, is separated from the backplane 401 and the third subset of the third light emitting diodes that are now attached to the backplane 401 in the same manner as above. The first, second and third LEDs attached to the backplane 401 can have co-planar top and bottom surfaces (e.g., top surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Referring to FIG. 37O, a dielectric matrix 50 can be applied in the spaces between the light emitting devices that are bonded to the backplane 401. While FIG. 37O illustrates only three devices, it is understood that an array of pixels is formed on the backplane 401, and each pixel includes a set of light emitting device such as a blue-light emitting diode as a first light emitting device, a green-light emitting diode as a second light emitting device, and a red-light emitting diode as a third light emitting device. The dielectric matrix 50 can laterally surround each of the red-light emitting diodes, the green-light emitting diodes, and the blue light emitting diodes within the array of pixels. The dielectric matrix 50 can include a self-planarizing dielectric material such as spin-on glass (SOG) or polymer, or can be planarized by a recess etch or chemical mechanical planarization. The top surface of the dielectric matrix 50 as planarized can be within the horizontal plane including the top surfaces of the devices, or can be vertically recessed below the horizontal plane including the top surfaces of the devices.

Referring to FIG. 37P, a front side transparent conductive oxide layer 450 can be formed over the dielectric matrix 50 and directly on the electrical nodes that are located on top of each device. For example, the front side transparent conductive oxide layer 450 can be deposited on the semiconductor buffer layer 904 of the first conductivity type.

In this case, the front side transparent conductive oxide layer 450 can be a common ground electrode for each of the red-light emitting diodes, the green-light emitting diodes, and the blue-light emitting diodes.

An optional transparent passivation dielectric layer 452 can be formed over the front side transparent conductive oxide layer 450. The transparent passivation dielectric layer 452 can include silicon nitride or silicon oxide. Thus, the LEDs, and are so-called bottom emitting, vertical LEDs which emit light through layer 904, the front side transparent conductive oxide layer 450 and transparent passivation dielectric layer 452. The LEDs are vertical devices because they have electrical contacts (i.e., layer 450 and bonding structures or pads (431, 432, 433)) on opposite sides thereof.

The red-light emitting diodes, the blue-light emitting diodes and/or the green-light emitting diodes of the type described above are located in direct view display device 460 of FIG. 37P. Such a direct view display device comprises an array of pixels located on a backplane 401. Each of the pixels comprises a red-light emitting diode configured to emit light at a peak wavelength in a range from 620 nm to 750 nm, a green-light emitting diode configured to emit light at a peak wavelength in a range from 495 nm to 570 nm, and a blue-light emitting diode configured to emit light at a peak wavelength in a range from 450 to 495 nm. Each of the red-light emitting diodes, the green-light emitting diodes, and the blue light emitting diodes can be a planar LED or a nanowire LEDA The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A method of making a device, comprising:
   forming a growth mask layer over a semiconductor material layer;
   forming a patterned hard mask layer over the growth mask layer, the patterned hard mask layer including a plurality of openings that are laterally spaced apart,
   forming a nano-imprint lithography (NIL) resist layer over the growth mask layer and over the patterned hard mask layer;
   imprinting a pattern of recesses on an upper surface of the NIL resist layer by stamping with a nano-imprint lithography stamp;
   transferring a pattern into the NIL resist layer through at least portions of the growth mask layer, wherein the growth mask layer becomes a patterned growth mask layer with openings therein; and
   growing semiconductor material portions through the openings in the patterned growth mask layer;
   wherein:
   the nano-imprint lithography stamp includes an array of protrusions that extend over the plurality of openings in the patterned hard mask layer; and
   the pattern is transferred into the NIL resist layer underneath the plurality of openings in the patterned hard mask layer by anisotropically etching the NIL resist layer selective to the patterned hard mask layer.

2. The method of claim 1, wherein:
   the patterned hard mask layer prevents transfer of the pattern in the NIL resist layer therethrough during transfer of the pattern in the NIL resist layer through the portions of the growth mask layer;
   transfer of the pattern in the NIL resist layer through the portions of the growth mask layer is performed employing an anisotropic etch process that etches a material of the growth mask layer selective to a material of the patterned hard mask layer;
   each of the plurality of opening through the patterned growth mask layer has a maximum lateral dimension in a range from 50 nm to 500 nm; and
   each of the plurality of opening through the patterned hard mask layer has a maximum lateral dimension in a range from 2 microns to 200 microns.

3. The method of claim 1, wherein:
   the array of protrusions of the nano-imprint lithography stamp is arranged as a two-dimensional periodic array that extends over an area including multiple openings in the patterned hard mask layer;
   each cluster of openings in the patterned growth mask layer comprises a two-dimensional periodic array of hexagonal or circular openings; and
   the plurality of openings in the patterned hard mask layer are arranged as a two-dimensional hexagonal or rectangular array.

4. The method of claim 1, further comprising:
applying a photoresist layer over the growth mask layers;
lithographically patterning the photoresist layer to form photoresist material portions that are laterally spaced among one another;
anisotropically depositing a hard mask material over the photoresist material portions and physically exposed portions of the growth mask layer;
removing the photoresist material portions and portions of deposited hard mask material overlying the photoresist material portions, wherein remaining deposited portions of the hard mask material constitute the patterned hard mask layer; and
removing the patterned hard mask layer selective to the patterned growth mask layer after formation of the patterned growth mask layer and prior to formation of the semiconductor material portions,
wherein:
the hard mask material comprises at least one of nickel, platinum, silver, gold, copper, silicon oxide, and a dielectric metal oxide; and
the growth mask layer comprises a silicon nitride or aluminum oxide layer having a thickness in a range from 3 nm to 100 nm.

5. The method of claim 1, wherein:
the NIL resist layer comprises a thermosetting polymer or a UV curable polymer, and the method further comprises curing the NIL resist layer after stamping with the nano-imprint lithography stamp; and
each recess within the pattern of recesses that are formed on the upper surface of the NIL resist layer has an aspect ratio of at least 3.

6. The method of claim 1, wherein:
the semiconductor material layer comprises a single crystalline III-nitride compound semiconductor material of a first conductivity type;
the semiconductor material portions comprise III-nitride semiconductor nanowires of the first conductivity type which are grown by a selective epitaxy process in which a semiconductor material grows from exposed surfaces of the semiconductor material layer and does not grow from surfaces of the patterned growth mask layer;
the III-nitride semiconductor nanowires are formed as clusters of semiconductor nanowires extending through a respective cluster of openings in the patterned growth mask layer and separated from adjacent clusters of semiconductor nanowires by isolation regions which lack semiconductor nanowires; and
the method further comprises:
forming an active shell on each of the III-nitride semiconductor nanowires and forming a III-nitride semiconductor layer of a second conductivity type on the active shells to form light emitting diodes such that a respective light emitting diode is contains a respective cluster of semiconductor nanowires; and
selectively transferring the light emitting diodes to a backplane to form a direct view display device in which each light emitting diode comprises one sub-pixel of a pixel of the direct view display device.

7. A method of making a device, comprising:
forming a growth mask layer over a semiconductor material layer;
forming a nano-imprint lithography (NIL) resist layer over the growth mask layer;
imprinting a pattern of recesses on an upper surface of the NIL resist layer by stamping with a nano-imprint lithography stamp;
transferring a pattern into the NIL resist layer through at least portions of the growth mask layer, wherein the growth mask layer becomes a patterned growth mask layer with openings therein; and
growing semiconductor material portions through the openings in the patterned growth mask layer,
wherein:
the nano-imprint lithography stamp includes multiple clusters of protrusions;
each cluster of protrusions is laterally spaced apart from other clusters of protrusions;
the openings of the patterned growth mask layer are formed as clusters of openings; and
each cluster of openings is laterally spaced apart from other clusters of openings.

8. The method of claim 7, wherein:
transfer of the pattern in the NIL resist layer through the growth mask layer is performed employing an anisotropic etch;
each opening through the patterned growth mask layer has a maximum lateral dimension in a range from 50 nm to 500 nm;
each cluster of protrusions among the multiple clusters of protrusions of the nano-imprint lithography stamp is arranged as a two-dimensional periodic array having a maximum lateral extent in a range from 2 microns to 200 microns;
each cluster of openings in the patterned growth mask layer comprises a two-dimensional periodic array of hexagonal or circular openings;
the NIL resist layer comprises a thermosetting polymer or a UV curable polymer, and the method further comprises curing the NIL resist layer after stamping with the nano-imprint lithography stamp; and
each recess within the pattern of recesses that are formed on the upper surface of the NIL resist layer has an aspect ratio of at least 3.

9. The method of claim 7, wherein:
the semiconductor material layer comprises a single crystalline III-nitride compound semiconductor material of a first conductivity type;
the semiconductor material portions comprise III-nitride semiconductor nanowires of the first conductivity type which are grown by a selective epitaxy process in which a semiconductor material grows from exposed surfaces of the semiconductor material layer and does not grow from surfaces of the patterned growth mask layer;
the III-nitride semiconductor nanowires are formed as clusters of semiconductor nanowires extending through a respective cluster of openings in the patterned growth mask layer and separated from adjacent clusters of semiconductor nanowires by isolation regions which lack semiconductor nanowires; and
the method further comprises:
forming an active shell on each of the III-nitride semiconductor nanowires and forming a III-nitride semiconductor layer of a second conductivity type on the active shells to form light emitting diodes such that a respective light emitting diode is contains a respective cluster of semiconductor nanowires; and
selectively transferring the light emitting diodes to a backplane to form a direct view display device in which each light emitting diode comprises one sub-pixel of a pixel of the direct view display device.

10. A method of making a device, comprising:
forming a patterned hard mask layer over a semiconductor material layer;
forming a growth mask layer over the semiconductor material layer and over the patterned hard mask layer;
forming a nano-imprint lithography (NIL) resist layer over the growth mask layer and over the patterned hard mask layer;
imprinting a pattern of recesses on an upper surface of the NIL resist layer by stamping with a nano-imprint lithography stamp;
transferring a pattern into the NIL resist layer through at least portions of the growth mask layer, wherein the growth mask layer becomes a patterned growth mask layer with openings therein; and
growing semiconductor material portions through the openings in the patterned growth mask layer;
wherein:
the patterned hard mask layer includes an aperture region that laterally surrounds alignment mark regions;
a top surface of the growth mask layer is physically exposed in each of the aperture region;
the nano-imprint stamp includes an array of protrusions;
the portions of the growth mask layer are located in the aperture region;
transfer of the pattern in the ML resist layer through at least the portions of the growth mask layer is performed by anisotropically etching the growth mask layer employing a combination of the NIL resist layer and the patterned hard mask layer as an etch mask;
the openings in the patterned growth mask layer are formed in the aperture region; and
the method further comprises:
forming alignment structures in alignment mark regions, and
applying and lithographically patterning a photoresist layer employing the alignment structures as alignment marks for alignment of a lithographic pattern.

11. The method of claim 10, wherein:
the patterned hard mask layer prevents transfer of the pattern in the NIL resist layer therethrough during transfer of the pattern in the NIL resist layer through the portions of the growth mask layer;
transfer of the pattern in the NIL resist layer through the portions of the growth mask layer is performed employing an anisotropic etch process that etches a material of the growth mask layer selective to a material of the patterned hard mask layer;
the aperture region comprises a plurality of apertures that are arranged as a two-dimensional array around each of the alignment mark regions;
the array of protrusions continuously extends over the alignment mark regions and over the aperture region during stamping with the nano-imprint lithography stamp;
the patterned hard mask layer is formed over the growth mask layer, such as that a respective portion of the patterned hard mask layer covers the growth mask layer in the alignment mark regions;
the growth mask layer becomes a patterned growth mask layer without an opening in the alignment mark regions; and
portions of the patterned growth mask layer in the alignment mark regions comprise the alignment structures.

12. The method of claim 10, wherein:
the patterned hard mask layer is formed under the growth mask layer, such that a respective portion of the patterned hard mask layer comprises at least a portion of the alignment structures;
the aperture region comprises a plurality of apertures that are arranged as a two-dimensional array around each of the alignment mark regions; and
the array of protrusions is not present over the alignment structures during stamping with the nano-imprint lithography stamp.

13. The method of claim 10, further comprising:
applying a photoresist layer over the growth mask layers;
lithographically patterning the photoresist layer to form photoresist material portions that are laterally spaced among one another;
anisotropically depositing a hard mask material over the photoresist material portions and physically exposed portions of the growth mask layer;
removing the photoresist material portions and portions of deposited hard mask material overlying the photoresist material portions, wherein remaining deposited portions of the hard mask material constitute the patterned hard mask layer; and
removing the patterned hard mask layer selective to the patterned growth mask layer after formation of the patterned growth mask layer and prior to formation of the semiconductor material portions,
wherein:
the hard mask material comprises at least one of nickel, platinum, silver, gold, copper, silicon oxide, and a dielectric metal oxide; and
the growth mask layer comprises a silicon nitride or aluminum oxide layer having a thickness in a range from 3 nm to 100 nm.

14. The method of claim 10, wherein:
the array of protrusions is a periodic two-dimensional array;
the semiconductor material layer comprises a single crystalline III-nitride compound semiconductor material of a first conductivity type;
the semiconductor material portions comprise III-nitride semiconductor nanowires of the first conductivity type which are grown by a selective epitaxy process in which a semiconductor material grows from exposed surfaces of the semiconductor material layer and does not grow from surfaces of the patterned growth mask layer; and
the III-nitride semiconductor nanowires are formed as clusters of semiconductor nanowires extending through a respective cluster of openings in the patterned growth mask layer and separated from adjacent clusters of semiconductor nanowires by isolation regions which lack semiconductor nanowires.

15. A method of making a device, comprising:
forming a growth mask layer over a semiconductor material layer;
forming a nano-imprint lithography (NIL) resist layer over the growth mask layer;
imprinting a pattern of recesses on an upper surface of the NIL resist layer by stamping with a nano-imprint lithography stamp;
transferring a pattern into the NIL resist layer through at least portions of the growth mask layer, wherein the growth mask layer becomes a patterned growth mask layer with openings therein; and
growing semiconductor material portions through the openings in the patterned growth mask layer, wherein:
the nano-imprint lithography stamp includes a device region and alignment mark regions that are surrounded by the device region, wherein the device region includes a pattern of an array of protrusions, and wherein each of the alignment mark regions includes a pattern that is different from the pattern of the array of protrusions;
the openings in the patterned growth mask layer replicate the pattern of the array of protrusions and include apertures that replicate a pattern in each of the alignment mark regions; and
growing semiconductor alignment structures through the apertures in the patterned growth mask layer; and
applying and lithographically patterning a photoresist layer employing the semiconductor alignment structures as references for alignment of a lithographic pattern.

16. The method of claim 15, further comprising at least one feature selected from:
a first feature that each of the alignment mark regions includes a semiconductor mesa pattern having a lateral dimension that is at least 6 times a maximum lateral dimension of each protrusion within the array of protrusions, and the mesa pattern has a cross pattern;
a second feature that each of the alignment mark regions includes a protrusion array pattern including another array of protrusions that differ from the array of protrusions in the device region by at least one of a nearest neighbor pitch, a maximum lateral dimension of each protrusion, and a shape of each protrusion;
a third feature that the semiconductor alignment structures include a same material as the semiconductor nanostructures;
a fourth feature that transfer of the pattern in the NIL resist layer through the growth mask layer is performed employing an anisotropic etch, and each opening through the patterned growth mask layer has a maximum lateral dimension in a range from 50 nm to 500 nm;
a fifth feature that the openings in the patterned growth mask layer comprise a two-dimensional periodic array of hexagonal or circular openings, the NIL resist layer comprises a thermosetting polymer or a UV curable polymer, and the method further comprises curing the NIL resist layer after stamping with the nano-imprint lithography stamp, and each recess within the pattern of recesses that are formed on the upper surface of the NIL resist layer has an aspect ratio of at least 3; and
a sixth feature that the semiconductor material layer comprises a single crystalline III-nitride compound semiconductor material of a first conductivity type, the semiconductor material portions comprise III-nitride semiconductor nanowires of the first conductivity type which are grown by a selective epitaxy process in which a semiconductor material grows from exposed surfaces of the semiconductor material layer and does not grow from surfaces of the patterned growth mask layer, and the III-nitride semiconductor nanowires are formed as clusters of semiconductor nanowires extending through a respective cluster of openings in the patterned growth mask layer and separated from adjacent clusters of semiconductor nanowires by isolation regions which lack semiconductor nanowires.

17. A method of making a device, comprising:
forming a growth mask layer over a semiconductor material layer;
patterning the growth mask layer to form alignment mark apertures in alignment mark regions in the growth mask layer and forming openings in a device region in the growth mask layer;
selectively growing semiconductor nanostructures through the openings in the patterned growth mask layer and selectively growing semiconductor alignment structures through the apertures in the patterned growth mask layer at the same time such that the semiconductor alignment structures include a same material as the semiconductor nanostructures; and
applying and lithographically patterning a photoresist layer employing the semiconductor alignment structures as references for alignment of a lithographic pattern.

18. The method of claim 17, wherein the method comprises at least one feature selected from:
a first feature that each of the semiconductor alignment structures comprises a semiconductor mesa pattern having a lateral dimension that is at least 6 times a maximum lateral dimension of each semiconductor nanostructure, and the semiconductor mesa pattern has a cross pattern;
a second feature that the semiconductor alignment structures comprise an array of semiconductor nanowires that differ from the array of the semiconductor nanostructures by at least one of a nearest neighbor pitch, a maximum lateral dimension of each protrusion, and a shape of each protrusion;
a third feature that the semiconductor alignment structures comprise gallium nitride structures which are grown during the same semiconductor epitaxial growth step as the semiconductor nanostructures; and
a fourth feature that the openings and apertures in the patterned growth mask layer are formed by at least one of photolithography or nanoimprint lithography followed by etching.

19. A semiconductor device, comprising:
a patterned growth mask layer located over a semiconductor material layer, the patterned growth mask layer comprising alignment mark apertures in alignment mark regions and openings in a device region; and
semiconductor nanostructures extending through the openings in the patterned growth mask layer and semiconductor alignment structures extending through the apertures in the patterned growth mask layer, wherein the semiconductor alignment structures include a same semiconductor material as the semiconductor nanostructures.

20. The semiconductor device of claim 19, wherein the semiconductor device comprises at least one feature selected from:
a first feature that each of the semiconductor alignment structures comprises a semiconductor mesa pattern having a lateral dimension that is at least 6 times a maximum lateral dimension of each semiconductor nanostructure, wherein the semiconductor mesa pattern has a cross pattern;
a second feature that the semiconductor alignment structures comprise an array of semiconductor nanowires that differ from the array of the semiconductor nanostructures by at least one of a nearest neighbor pitch, a maximum lateral dimension of each protrusion, and a shape of each protrusion; and
a third feature that the semiconductor alignment structures comprise gallium nitride alignment structures and the semiconductor nanostructure comprise gallium nitride nanowires that are a part of a light emitting device.

* * * * *